(12) United States Patent
Tochishita et al.

(10) Patent No.: US 11,467,231 B2
(45) Date of Patent: Oct. 11, 2022

(54) MAGNETIC SENSOR

(71) Applicant: Murata Manufacturing Co., Ltd., Nagaokakyo (JP)

(72) Inventors: Hikari Tochishita, Nagaokakyo (JP); Masashi Tsubokawa, Nagaokakyo (JP); Hiroki Tsutsumi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 227 days.

(21) Appl. No.: 16/891,245

(22) Filed: Jun. 3, 2020

(65) Prior Publication Data
US 2020/0300939 A1  Sep. 24, 2020

Related U.S. Application Data

(63) Continuation of application No. PCT/JP2018/043608, filed on Nov. 27, 2018.

(30) Foreign Application Priority Data

Dec. 4, 2017 (JP) ............................. JP2017-232852

(51) Int. Cl.
G01R 33/09 (2006.01)
H01L 43/08 (2006.01)
(52) U.S. Cl.
CPC ............. G01R 33/09 (2013.01); H01L 43/08 (2013.01)
(58) Field of Classification Search
CPC ................ G01R 33/09; G01R 33/0082; G01R 33/0076; G01R 33/0011; H01L 43/08
See application file for complete search history.

(56) References Cited

U.S. PATENT DOCUMENTS

2009/0166773 A1* 7/2009 Ohno .................. H01L 43/08
257/E29.323
2009/0309590 A1 12/2009 Kataoka et al.
(Continued)

FOREIGN PATENT DOCUMENTS

JP 2003-130895 A 5/2003
JP 2007-263951 A 10/2007
(Continued)

OTHER PUBLICATIONS

Official Communication issued in International Patent Application No. PCT/JP2018/043608, dated Feb. 12, 2019.

*Primary Examiner* — Raj R Gupta
(74) *Attorney, Agent, or Firm* — Keating & Bennett, LLP

(57) ABSTRACT

A first magnetic member is provided in a region farther inward than an outer peripheral edge of a first magnetoresistance element. A second magnetoresistance element is provided in a region farther inward than an inner peripheral edge of the first magnetoresistance element and is covered by the first magnetic member or is provided in a region farther outward than the outer peripheral edge of the first magnetoresistance element and is covered by a second magnetic member. A first conductor includes a first base section and a first narrow section. The area of the exterior surface of the first narrow section as viewed from a direction perpendicular to an insulating layer is smaller than that of the first base section. In the first conductor, the first base section and the first narrow section are arranged side by side in the direction perpendicular to the insulating layer.

24 Claims, 30 Drawing Sheets

(56) References Cited

U.S. PATENT DOCUMENTS

| | | |
|---|---|---|
| 2016/0276577 A1 | 9/2016 | Ebihara |
| 2017/0074947 A1* | 3/2017 | Mori .................. G01R 33/09 |
| 2017/0108558 A1 | 4/2017 | Mori |
| 2017/0271401 A1 | 9/2017 | Kishi et al. |
| 2017/0341934 A1 | 11/2017 | Stringer et al. |
| 2017/0343622 A1 | 11/2017 | Mazotti et al. |
| 2019/0148629 A1* | 5/2019 | Sasaki .................. H01F 10/329 |
| | | 257/421 |

FOREIGN PATENT DOCUMENTS

| | | |
|---|---|---|
| JP | 2010-159982 A | 7/2010 |
| JP | 2013-044641 A | 3/2013 |
| JP | 2015-118067 A | 6/2015 |
| JP | 2016-125901 A | 7/2016 |
| JP | 2016-173317 A | 9/2016 |
| JP | 2017-166925 A | 9/2017 |
| WO | 2007/119569 A1 | 10/2007 |
| WO | 2015/182365 A1 | 12/2015 |
| WO | 2016/013345 A1 | 1/2016 |

\* cited by examiner

MAGNETIC SENSOR

CROSS REFERENCE TO RELATED APPLICATIONS

This application claims the benefit of priority to Japanese Patent Application No. 2017-232852 filed on Dec. 4, 2017 and is a Continuation Application of PCT Application No. PCT/JP2018/043608 filed on Nov. 27, 2018. The entire contents of each application are hereby incorporated herein by reference.

BACKGROUND OF THE INVENTION

1. Field of the Invention

The present invention relates to a magnetic sensor, and more particularly, to a magnetic sensor including magnetoresistance elements.

2. Description of the Related Art

Examples of the related art that disclose the configuration of a conventional magnetic sensor are Japanese Unexamined Patent Application Publication No. 2013-44641, International Publication No. 2015/182365, International Publication No. 2016/013345, International Publication No. 2007/119569, and Japanese Unexamined Patent Application Publication No. 2017-166925.

The magnetic sensor disclosed in Japanese Unexamined Patent Application Publication No. 2013-44641 includes first through fourth magnetoresistance elements formed in a meandering shape and connected with each other so as to form a bridge circuit. The surfaces of the first through fourth magnetoresistance elements are covered with an insulating film. A magnetic-flux converging film made of a magnetic material is formed on the surfaces of the third and fourth magnetoresistance elements, which are fixed resistors, with the insulating film interposed therebetween.

The magnetic sensors disclosed in International Publication No. 2015/182365 and International Publication No. 2016/013345 each include first and second magnetoresistance elements. The rate of a change in the resistance of the second magnetoresistance element is smaller than that of the first magnetoresistance element. The first magnetoresistance element, which is a magneto-sensitive element, includes concentrically disposed patterns.

The magnetic sensor disclosed in International Publication No. 2007/119569 includes a semiconductor substrate and a magnetic member. The semiconductor substrate includes multiple Hall elements. The magnetic member has a magnetism amplifying function provided on the semiconductor substrate. An underlying layer, which defines and functions as a base of the magnetic member, is provided on the semiconductor substrate. The coefficient of thermal expansion of the underlying layer is different from that of the multiple Hall elements. The underlying layer is large enough to at least partially cover a region where the multiple Hall elements are disposed. The area of the magnetic member is larger than that of the underlying layer.

The magnetic sensor disclosed in Japanese Unexamined Patent Application Publication No. 2017-166925 includes a semiconductor substrate and a magnetic member. The semiconductor substrate includes multiple Hall elements. The magnetic member has a magnetic-flux converging function provided on the semiconductor substrate. An outer peripheral section of the magnetic member on the semiconductor substrate defines the exterior surface of the magnetic member in a longitudinal section. The outer peripheral section at least partially includes a curved portion and a portion substantially parallel with the semiconductor substrate. At least part of a structure made of a non-magnetic material is embedded in the magnetic member.

In the magnetic sensor disclosed in Japanese Unexamined Patent Application Publication No. 2013-44641, each of the first and second magnetoresistance elements, which are magneto-sensitive elements, includes a meandering pattern. This decreases the isotropic characteristics in detecting a horizontal magnetic field.

In each of the magnetic sensors disclosed in International Publication No. 2015/182365 and International Publication No. 2016/013345, the first magnetoresistance element includes concentrically disposed patterns. Because of this configuration, the magnetic sensors exhibit high isotropic characteristics in detecting a horizontal magnetic field. However, they are unable to detect a weak vertical magnetic field.

The magnetic sensors disclosed in International Publication No. 2007/119569 and Japanese Unexamined Patent Application Publication No. 2017-166925 are magnetic sensors including Hall elements, and are not intended to detect a horizontal magnetic field and a vertical magnetic field by using magnetoresistance elements.

SUMMARY OF THE INVENTION

Preferred embodiments of the present invention provide magnetic sensors each of which achieve high isotropic characteristics in detecting a horizontal magnetic field and are each also able to detect a weak vertical magnetic field by using magnetoresistance elements to regulate a decrease in the output accuracy, which would be caused by a stress applied to the magnetoresistance elements from a structure disposed above the magnetoresistance elements.

A magnetic sensor according to a preferred embodiment of the present invention includes a first magnetoresistance element, a second magnetoresistance element, an insulating layer, at least a first conductor from between the first conductor and a second conductor, and at least a first magnetic member from between the first magnetic member and a second magnetic member. The second magnetoresistance element is electrically connected to the first magnetoresistance element to define a bridge circuit. The insulating layer covers the first and second magnetoresistance elements. The first and second conductors are on the insulating layer. The second conductor is different from the first conductor. The first magnetic member is on the first conductor and covers the first conductor, as viewed from a direction perpendicular or substantially perpendicular to the insulating layer. The second magnetic member is on the second conductor and covers the second conductor, as viewed from the direction perpendicular or substantially perpendicular to the insulating layer. The second magnetic member is different from the first magnetic member. From between outer and inner peripheral edges, the first magnetoresistance element at least includes the outer peripheral edge. As viewed from the direction perpendicular or substantially perpendicular to the insulating layer, the first magnetic member is provided in a region farther inward than the outer peripheral edge of the first magnetoresistance element. As viewed from the direction perpendicular or substantially perpendicular to the insulating layer, the second magnetoresistance element is provided in a region farther inward than the inner peripheral edge of the first magnetoresistance element and is covered by the first magnetic member, or is provided in a region farther outward than the outer peripheral edge of the first magnetoresistance element and is covered by the second magnetic member. The first conductor includes a first base section and a first narrow section. An area of an exterior surface of the first narrow section as viewed from the direction perpendicular or substantially perpendicular to the insulating layer is smaller than an area of an exterior surface of the first base section as viewed from the direction perpendicular or substantially perpendicular to the insulating layer. In the first conductor, the first base section and the first narrow section are arranged side by side in the direction perpendicular or substantially perpendicular to the insulating layer.

In a preferred embodiment of the present invention, in the direction perpendicular or substantially perpendicular to the insulating layer, the first narrow section of the first conductor is provided at an end portion of the first conductor closer to the insulating layer.

In a preferred embodiment of the present invention, in the direction perpendicular or substantially perpendicular to the insulating layer, the first narrow section of the first conductor is provided at an end portion of the first conductor closer to the first magnetic member.

In a preferred embodiment of the present invention, in the direction perpendicular or substantially perpendicular to the insulating layer, the first base section of the first conductor is provided at an end portion of the first conductor closer to the insulating layer and is also provided at an end portion of the first conductor closer to the first magnetic member. In the direction perpendicular or substantially perpendicular to the insulating layer, the first narrow section of the first conductor is sandwiched between the first base sections of the first conductor.

In a preferred embodiment of the present invention, the second conductor includes a second base section and a second narrow section. The area of the exterior surface of the second narrow section as viewed from the direction perpendicular or substantially perpendicular to the insulating layer is smaller than that of the second base section. In the second conductor, the second base section and the second narrow section are arranged side by side in the direction perpendicular or substantially perpendicular to the insulating layer.

In a preferred embodiment of the present invention, in the direction perpendicular or substantially perpendicular to the insulating layer, the second narrow section of the second conductor is provided at an end portion of the second conductor closer to the insulating layer.

In a preferred embodiment of the present invention, in the direction perpendicular or substantially perpendicular to the insulating layer, the second narrow section of the second conductor is provided at an end portion of the second conductor closer to the second magnetic member.

In a preferred embodiment of the present invention, in the direction perpendicular or substantially perpendicular to the insulating layer, the second base section of the second conductor is provided at an end portion of the second conductor closer to the insulating layer and is also provided at an end portion of the second conductor closer to the second magnetic member. In the direction perpendicular or substantially perpendicular to the insulating layer, the second narrow section of the second conductor is sandwiched between the second base sections of the second conductor.

A magnetic sensor according to a preferred embodiment of the present invention includes a first magnetoresistance element, a second magnetoresistance element, an insulating layer, and at least a first magnetic member from between the first magnetic member and a second magnetic member. The second magnetoresistance element is electrically connected to the first magnetoresistance element to define a bridge circuit. The insulating layer covers the first and second magnetoresistance elements. The first and second magnetic members are on the insulating layer. The second magnetic member is different from the first magnetic member. From between outer and inner peripheral edges, the first magnetoresistance element at least includes the outer peripheral edge. As viewed from a direction perpendicular or substantially perpendicular to the insulating layer, the first magnetic member is provided in a region farther inward than the outer peripheral edge of the first magnetoresistance element. As viewed from the direction perpendicular or substantially perpendicular to the insulating layer, the second magnetoresistance element is provided in a region farther inward than the inner peripheral edge of the first magnetoresistance element and is covered by the first magnetic member, or is provided in a region farther outward than the outer peripheral edge of the first magnetoresistance element and is covered by the second magnetic member. The first magnetic member includes a first base section and a first narrow section. An area of the exterior surface of the first narrow section as viewed from the direction perpendicular or substantially perpendicular to the insulating layer is smaller than that of the first base section. In the first magnetic member, the first base section and the first narrow section are arranged side by side in the direction perpendicular or substantially perpendicular to the insulating layer. In the direction perpendicular or substantially perpendicular to the insulating layer, the first narrow section of the first magnetic member is provided at an end portion of the first magnetic member closer to the insulating layer.

In a preferred embodiment of the present invention, the second magnetic member includes a second base section and a second narrow section. An area of the exterior surface of the second narrow section as viewed from the direction perpendicular or substantially perpendicular to the insulating layer is smaller than an area of the exterior surface of the second base section. In the second magnetic member, the second base section, and the second narrow section are arranged side by side in the direction perpendicular or substantially perpendicular to the insulating layer. In the direction perpendicular or substantially perpendicular to the insulating layer, the second narrow section of the second magnetic member is provided at an end portion of the second magnetic member closer to the insulating layer.

In a preferred embodiment of the present invention, as viewed from the direction perpendicular or substantially perpendicular to the insulating layer, at least a portion of the first magnetoresistance element is located in at least a portion of an area from a position separated inward from the outer peripheral edge of the first magnetic member by about 2 μm to a position separated outward from the outer peripheral edge of the first magnetic member by y μm indicated in the following expression:

$$y=-0.0008x^2+0.2495x+6.6506$$

where the thickness of the first magnetoresistance element is x μm.

In a preferred embodiment of the present invention, as viewed from the direction perpendicular or substantially perpendicular to the insulating layer, the first magnetic member is arranged concentrically with the outer peripheral edge of the first magnetoresistance element.

In a preferred embodiment of the present invention, as viewed from the direction perpendicular or substantially perpendicular to the insulating layer, the second magnetoresistance element is provided in a region farther inward than the inner peripheral edge of the first magnetoresistance element and is covered by the first magnetic member. As viewed from the direction perpendicular or substantially perpendicular to the insulating layer, the first magnetic member is provided in a region including the inner peripheral edge of the first magnetoresistance element and an area inward of the inner peripheral edge.

In a preferred embodiment of the present invention, as viewed from the direction perpendicular or substantially perpendicular to the insulating layer, the second magnetoresistance element is provided in a region farther inward than the inner peripheral edge of the first magnetoresistance element and is covered by the first magnetic member. As viewed from the direction perpendicular or substantially perpendicular to the insulating layer, the first magnetic member does not cover the first magnetoresistance element, but covers the second magnetoresistance element.

In a preferred embodiment of the present invention, as viewed from the direction perpendicular or substantially perpendicular to the insulating layer, the second magnetoresistance element is located in an area from a center of the first magnetic member to a position separated inward from the outer peripheral edge of the first magnetic member by about 7 μm.

In a preferred embodiment of the present invention, as viewed from the direction perpendicular or substantially perpendicular to the insulating layer, the second magnetoresistance element is provided in a region farther outward than the outer peripheral edge of the first magnetoresistance element and is covered by the second magnetic member. As viewed from the direction perpendicular or substantially perpendicular to the insulating layer, the first magnetic member covers only a portion of the first magnetoresistance element among the first and the second magnetoresistance elements.

In a preferred embodiment of the present invention, as viewed from the direction perpendicular or substantially perpendicular to the insulating layer, the second magnetic member does not cover the first magnetoresistance element, but covers the second magnetoresistance element.

In a preferred embodiment of the present invention, as viewed from the direction perpendicular or substantially perpendicular to the insulating layer, the second magnetoresistance element is located in an area from a center of the second magnetic member to a position separated inward from the outer peripheral edge of the second magnetic member by about 7 μm.

In a preferred embodiment of the present invention, the first magnetoresistance element includes multiple first patterns that are concentrically arranged and are connected with each other, as viewed from the direction perpendicular or substantially perpendicular to the insulating layer.

A magnetic sensors according to a preferred embodiment of the present invention include a magneto-sensitive element, an insulating layer, a first conductor, and a first magnetic member. The insulating layer covers the magneto-sensitive element. The first conductor is on the insulating layer. The first magnetic member is on the first conductor and covers the first conductor, as viewed from a direction perpendicular or substantially perpendicular to the insulating layer. The first conductor includes a first base section and a first narrow section. The area of the exterior surface of the first narrow section as viewed from the direction perpendicular or substantially perpendicular to the insulating layer is smaller than that of the first base section. The first base section and the first narrow section are arranged side by side in the direction perpendicular or substantially perpendicular to the insulating layer.

In a preferred embodiment of the present invention, in the direction perpendicular or substantially perpendicular to the insulating layer, the first narrow section of the first conductor is provided at an end portion of the first conductor closer to the insulating layer.

In a preferred embodiment of the present invention, in the direction perpendicular or substantially perpendicular to the insulating layer, the first narrow section of the first conductor is provided at an end portion of the first conductor closer to the first magnetic member.

In a preferred embodiment of the present invention, in the direction perpendicular or substantially perpendicular to the insulating layer, the first base section of the first conductor is provided at an end portion of the first conductor closer to the insulating layer and is also provided at an end portion of the first conductor closer to the first magnetic member. In the direction perpendicular or substantially perpendicular to the insulating layer, the first narrow section of the first conductor is sandwiched between the first base sections of the first conductor.

In a preferred embodiment of the present invention, the magneto-sensitive element includes an outer peripheral edge. As viewed from the direction perpendicular or substantially perpendicular to the insulating layer, the first magnetic member is provided in a region farther inward than the outer peripheral edge of the magneto-sensitive element.

According to preferred embodiments of the present invention, it is possible to achieve high isotropic characteristics in detecting a horizontal magnetic field and to detect a weak vertical magnetic field by using magnetoresistance elements and also to regulate a decrease in the output accuracy of magnetic sensors, which would be caused by a stress applied to the magnetoresistance elements from a structure disposed above the magnetoresistance elements.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
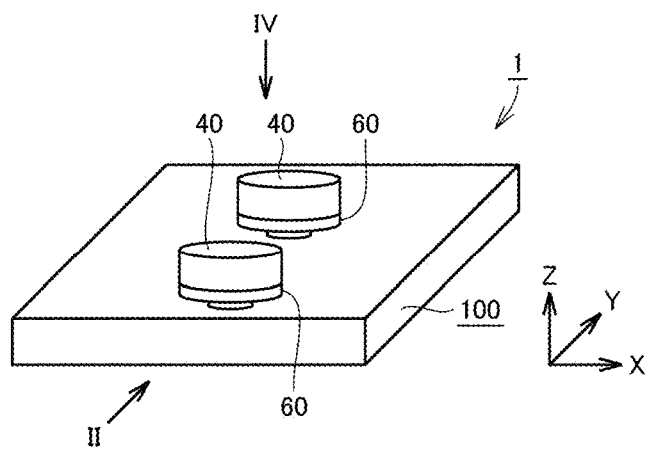
FIG. 1 is a perspective view illustrating the configuration of a magnetic sensor according to a first preferred embodiment of the present invention.

Magnetic sensors according to preferred embodiments of the present invention will be described below with reference to the drawings. In the following description of the preferred embodiments, the same element or associated elements shown in the drawings are designated by like reference numeral, and an explanation thereof will not be repeated.

First Preferred Embodiment

Figure 2:
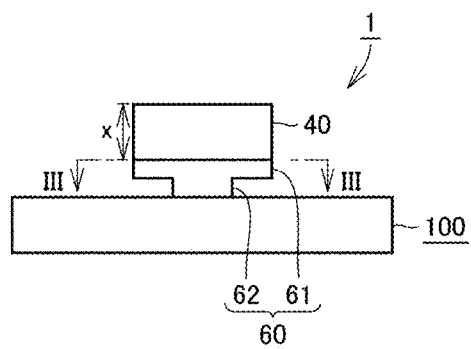
FIG. 2 is a front view of the magnetic sensor in FIG. 1, as viewed from the direction indicated by the arrow II in FIG. 1.
Figure 3:
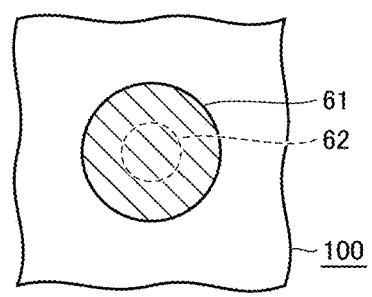
FIG. 3 is a sectional view of the magnetic sensor in FIG. 2, as viewed from the direction indicated by the arrow of line III-III in FIG. 2.
Figure 4:
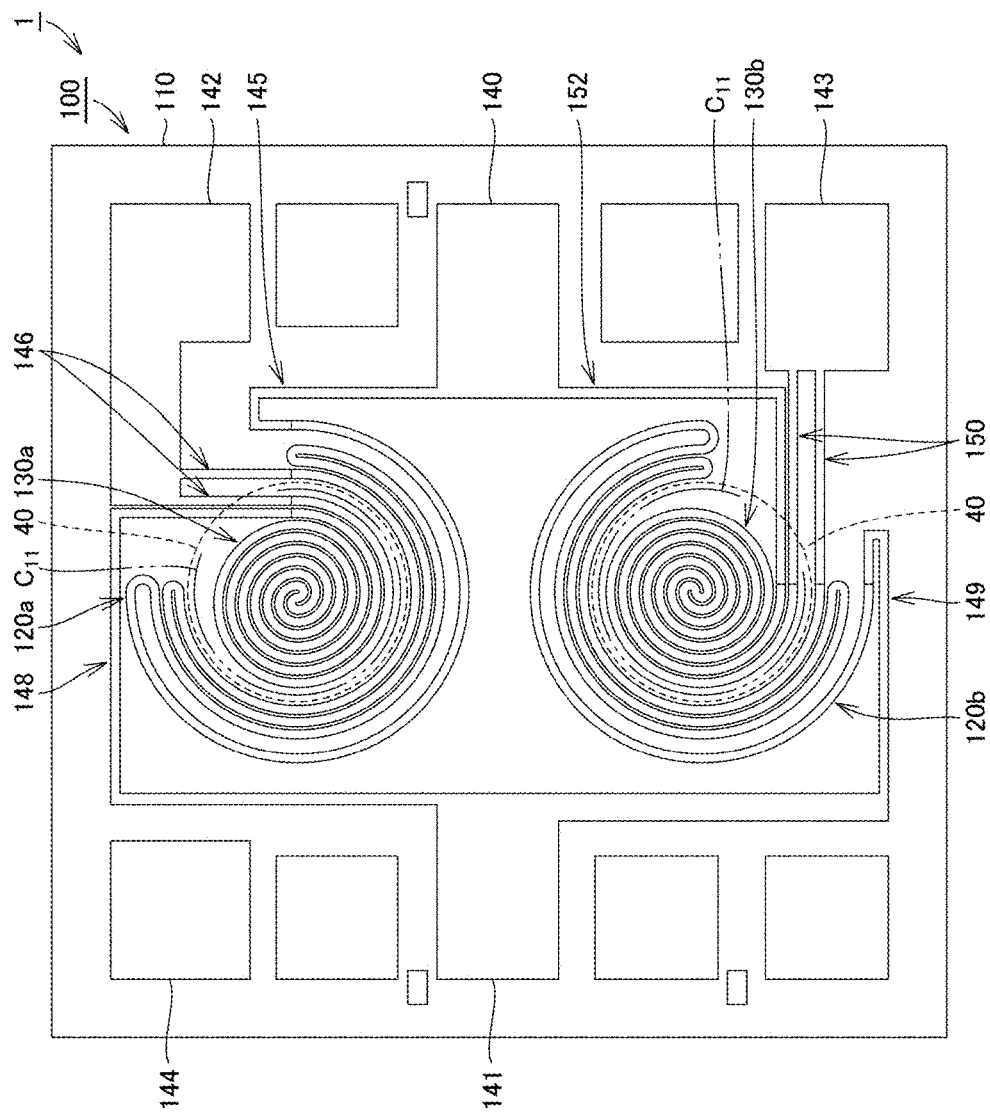
FIG. 4 is a plan view of the magnetic sensor in FIG. 1, as viewed from the direction indicated by the arrow IV in FIG. 1.
Figure 5:
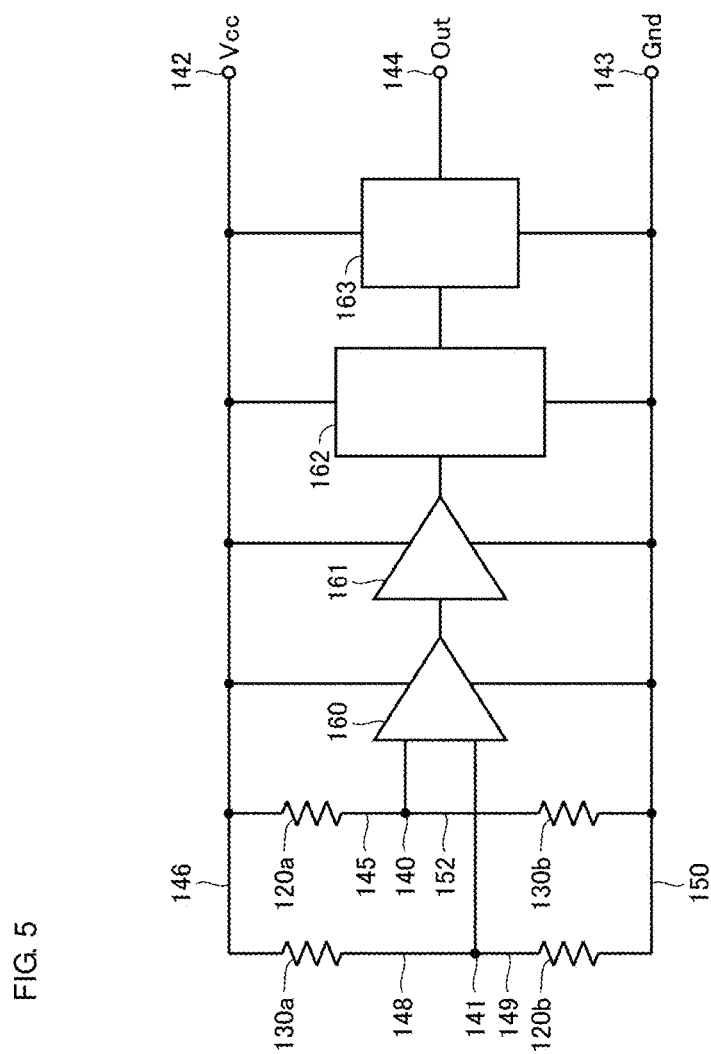
FIG. 5 is an equivalent circuit diagram of the magnetic sensor according to the first preferred embodiment of the present invention.

FIG. 1 is a perspective view illustrating the configuration of a magnetic sensor according to a first preferred embodiment of the present invention. FIG. 2 is a front view of the magnetic sensor in FIG. 1, as viewed from the direction indicated by the arrow II in FIG. 1. FIG. 3 is a sectional view of the magnetic sensor in FIG. 2, as viewed from the direction indicated by the arrow of line III-III in FIG. 2. FIG. 4 is a plan view of the magnetic sensor in FIG. 1, as viewed from the direction indicated by the arrow IV in FIG. 1. FIG. 5 is an equivalent circuit diagram of the magnetic sensor according to the first preferred embodiment of the present invention.

In FIG. 1, the widthwise direction of a circuit substrate 100, which will be discussed later, is the X-axis direction, the longitudinal direction thereof is the Y-axis direction, and the thickness direction thereof is the Z-axis direction. In FIG. 4, the outer edges of first magnetic members, which will be discussed later, are indicated by dotted lines. In FIG.

4, some elements, such as a differential amplifier and a temperature compensation circuit, which will be discussed later, are not shown.

As shown in FIGS. 1 through 4, a magnetic sensor 1 according to a first preferred embodiment of the present invention preferably includes the circuit substrate 100 and two first magnetic members 40 above the circuit substrate 100. In the magnetic sensor 1 according to the first preferred embodiment of the present invention, two first conductors 60 are provided on the circuit substrate 100. An insulating layer 30 is provided on the front layer of the circuit substrate 100, and the two first conductors 60 are located on the insulating layer 30, as will be described. The circuit substrate 100 preferably includes a semiconductor substrate 110.

Each of the first conductors 60 includes a first base section 61 and a first narrow section 62. The area of the exterior surface of the first narrow section 62 as viewed from the Z-axis direction, which is perpendicular to the insulating layer 30, is smaller than that of the first base section 61. In the first conductor 60, the first base section 61 and the first narrow section 62 are arranged side by side in the Z-axis direction, which is perpendicular or substantially perpendicular to the insulating layer 30. In the present preferred embodiment, the first narrow section 62 of the first conductor 60 is located at the end portion of the first conductor 60 closer to the insulating layer 30 in the Z-axis direction, which is perpendicular or substantially perpendicular to the insulating layer 30. That is, the first narrow section 62 of the first conductor 60 contacts the insulating layer 30 on the circuit substrate 100.

As viewed from the Z-axis direction, which is perpendicular or substantially perpendicular to the insulating layer 30, the exterior surface of each of the first base section and the first narrow section 62 is preferably circular or substantially circular, for example. The diameter of the exterior surface of the first narrow section 62 is smaller than that of the first base section 61. The first base section 61 and the first narrow section 62 are disposed substantially coaxially. The first base section 61 is not restricted to the above-described shape and may have an elliptical or polygonal shape, for example, as viewed from the direction perpendicular or substantially perpendicular to the insulating layer 30. The first narrow section 62 is not restricted to the above-described shape and may have any shape as long as the area of the exterior surface as viewed from the Z-axis direction, which is perpendicular or substantially perpendicular to the insulating layer 30, is smaller than that of the first base section 61.

The first narrow section 62 in the first conductor 60 defines a gap partially between the first base section 61 and the insulating layer 30. In the present preferred embodiment, the gap is preferably defined between the first base section 61 and the insulating layer 30 all around the outer peripheral portion of the first conductor 60.

The two first magnetic members 40 are located on the two first conductors 60 in a one-on-one relationship. The first magnetic members 40 cover the associated first conductors 60, as viewed from the Z-axis direction, which is perpendicular or substantially perpendicular to the insulating layer 30.

With a view to decreasing the distance between each first magnetic member 40 and the circuit substrate 100, the thickness of the first conductor 60 in the Z-axis direction, that is, the total thickness of the first base section 61 and the first narrow section 62 in the Z-axis direction, is preferably about 2.0 µm or smaller, for example. As the distance between the first magnetic member 40 and the circuit substrate 100 is smaller, the magnetic shielding function of the first magnetic member 40, which will be discussed later, can be provided more effectively.

To form the first narrow section 62, patterning with a resist or etching with a sacrificial layer, for example, may be utilized.

In the present preferred embodiment, the first conductor 60 is positioned on the insulating layer 30 and is preferably made of a layer including titanium (Ti) and a layer including gold (Au) in this order from the bottom. The layer including titanium (Ti) is a contact layer. If the first magnetic member 40 is formed with electrolytic plating, the layer including gold (Au) defines and functions as an electrode reaction layer, that is, a seed layer. The first conductor 60 is not limited to the above-described configuration, and may include a layer made of at least one of, for example, iron (Fe), molybdenum (Mo), tantalum (Ta), platinum (Pt), and copper (Cu), which are materials serving as a plating seed layer. If the first magnetic member 40 is formed by a method other than plating, such as by vapor-deposition, for example, the first conductor 60 may be made of a conductor including at least one of a metal or a resin.

As shown in FIGS. 4 and 5, four magnetoresistance elements electrically connected with each other by wiring to define a Wheatstone bridge circuit are provided on the circuit substrate 100 of the magnetic sensor 1 according to the first preferred embodiment of the present invention. The four magnetoresistance elements are defined by two pairs of first magnetoresistance elements and second magnetoresistance elements. More specifically, the magnetic sensor 1 preferably includes first and second magnetoresistance elements 120a and 130a and first and second magnetoresistance elements 120b and 130b. The first and second magnetoresistance elements 120a and 130a define one pair. The first and second magnetoresistance elements 120b and 130b define the other pair.

In the present preferred embodiment, the magnetic sensor 1 preferably includes two pairs of first and second magnetoresistance elements. However, this is only an example. It is sufficient if the magnetic sensor 1 includes at least one pair of first and second magnetoresistance elements. If the magnetic sensor 1 includes one pair of first and second magnetoresistance elements, a half bridge circuit is provided on the circuit substrate 100.

Each of the first magnetoresistance elements 120a and 120b and the second magnetoresistance elements 130a and 130b is preferably, for example, an AMR (Anisotropic Magneto Resistance) element. Instead of the AMR element, each of the first magnetoresistance elements 120a and 120b and the second magnetoresistance elements 130a and 130b may be another magnetoresistance element, such as, for example, a GMR (Giant Magneto Resistance) element, a TMR (Tunnel Magneto Resistance) element, a BMR (Ballistic Magneto Resistance) element, or a CMR (Colossal Magneto Resistance) element.

The second magnetoresistance element 130a is magnetically shielded by the first magnetic member 40 and only barely detects, if at all, a magnetic field in the Z-axis direction (vertical magnetic field) and a magnetic field in the X-axis and Y-axis directions (horizontal magnetic field). That is, the second magnetoresistance element 130a is a fixed resistor. This will be discussed later. The first magnetoresistance element 120a is a magneto-sensitive resistor whose electrical resistance changes in response to the application of an external magnetic field. That is, the first magnetoresistance element 120a serves as a magneto-sensitive element, and the second magnetoresistance element 130a does not serve as a magneto-sensitive element. It is preferable that the resistance change rate of the second magnetoresistance element 130a in response to an external magnetic field be lower than that of the first magnetoresistance element 120a.

Similarly, the second magnetoresistance element 130b is preferably magnetically shielded by the first magnetic member 40 and only barely detects, if at all, a magnetic field in the Z-axis direction (vertical magnetic field) and a magnetic field in the X-axis and Y-axis directions (horizontal magnetic field). That is, the second magnetoresistance elements 130b is a fixed resistor. This will be discussed later. The first magnetoresistance element 120b is a magneto-sensitive resistor whose electrical resistance changes in response to the application of an external magnetic field. That is, the first magnetoresistance element 120b serves as a magneto-sensitive element, and the second magnetoresistance element 130b does not serve as a magneto-sensitive element. It is preferable that the resistance change rate of the second magnetoresistance element 130b in response to an external magnetic field be lower than that of the first magnetoresistance element 120b.

The first magnetoresistance elements 120a and 120b and the second magnetoresistance elements 130a and 130b are electrically connected with each other by wiring provided on the semiconductor substrate 110. More specifically, the first and second magnetoresistance elements 120a and 130a are connected in series with each other by a wiring 146, while the first and second magnetoresistance elements 120b and 130b are connected in series with each other by a wiring 150.

On the semiconductor substrate 110 of the circuit substrate 100, for example, nodes 140 and 141, a power supply terminal (Vcc) 142, a ground terminal (Gnd) 143, and an output terminal (Out) 144 are also preferably provided.

Each of the first and second magnetoresistance elements 120a and 130b is connected to the node 140. More specifically, the first magnetoresistance element 120a is connected to the node 140 by wiring 145, while the second magnetoresistance element 130b is connected to the node 140 by wiring 152.

Each of the first and second magnetoresistance elements 120b and 130a is connected to the node 141. More specifically, the first magnetoresistance element 120b is connected to the node 141 by wiring 149, while the second magnetoresistance element 130a is connected to the node 141 by wiring 148.

The wiring 146 is connected to the power supply terminal (Vcc) 142 into which a current is input. The wiring 150 is connected to the ground terminal (Gnd) 143.

As shown in FIG. 5, the magnetic sensor 1 also includes, for example, a differential amplifier 160, a temperature compensation circuit 161, a latch/switch circuit 162, and a CMOS (Complementary Metal Oxide Semiconductor) driver 163. The differential amplifier 160, the temperature compensation circuit 161, the latch/switch circuit 162, and the CMOS driver 163 are provided on the semiconductor substrate 110.

The input terminals of the differential amplifier 160 are connected to the nodes 140 and 141, while the output terminal is connected to the temperature compensation circuit 161. The differential amplifier 160 is also connected to the power supply terminal (Vcc) 142 and the ground terminal (Gnd) 143.

The output terminal of the temperature compensation circuit 161 is connected to the latch/switch circuit 162. The temperature compensation circuit 161 is also connected to the power supply terminal (Vcc) 142 and the ground terminal (Gnd) 143.

The output terminal of the latch/switch circuit 162 is connected to the CMOS driver 163. The latch/switch circuit 162 is also connected to the power supply terminal (Vcc) 142 and the ground terminal (Gnd) 143.

The output terminal of the CMOS driver 163 is connected to the output terminal (Out) 144. The CMOS driver 163 is also connected to the power supply terminal (Vcc) 142 and the ground terminal (Gnd) 143.

With the above-described circuit configuration of the magnetic sensor 1, a potential difference is generated between the nodes 140 and 141 in accordance with the strength of an external magnetic field. When the potential difference exceeds a preset detection level, a signal is output from the output terminal (Out) 144.

Figure 6:
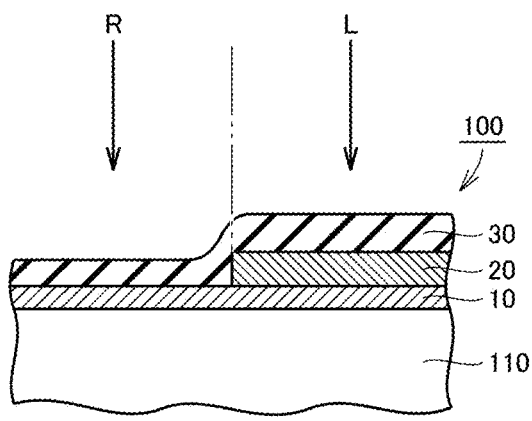
FIG. 6 is a sectional view of a multilayer structure of a connecting portion between magnetoresistance elements and wiring on a circuit substrate of the magnetic sensor according to the first preferred embodiment of the present invention.

FIG. 6 is a sectional view of a multilayer structure of a connecting portion between the magnetoresistance elements and the wiring on the circuit substrate of the magnetic sensor according to the first preferred embodiment of the present invention. In FIG. 6, only the connecting portion between a region R serving as the magnetoresistance elements and a region L serving as the wiring is shown.

As shown in FIG. 6, each of the first magnetoresistance elements 120a and 120b and the second magnetoresistance elements 130a and 130b is provided on the semiconductor substrate 110 preferably made of Si, for example, having a $SiO_2$ layer or a $Si_3N_4$ layer on the front surface. The first magnetoresistance elements 120a and 120b and the second magnetoresistance elements 130a and 130b are formed as a result of a magnetic layer 10 made of an Ni—Fe alloy on the semiconductor substrate 110 being patterned by ion milling. The thickness of the magnetic layer 10 is preferably about 0.04 μm, for example.

The wiring 145, 146, 148, 149, 150, and 152 is preferably formed as a result of a conductive layer 20 made of Au or Al, for example, provided on the semiconductor substrate 110 being patterned by wet etching. The conductive layer 20 is positioned immediately on the top of the magnetic layer 10 in the region L defining and functioning as the wiring and is not provided in the region R defining and functioning as the magnetoresistance elements. As shown in FIG. 6, at the connecting portion between the region R defining and functioning as the magnetoresistance elements and the region L defining and functioning as the wiring, the end portion of the conductive layer 20 is positioned immediately on the top of the magnetic layer 10.

The nodes 140 and 141, the power supply terminal (Vcc) 142, the ground terminal (Gnd) 143, and the output terminal (Out) 144 are defined by the conductive layer 20 positioned immediately on the top of the semiconductor substrate 110. That is, each of the nodes 140 and 141, the power supply terminal (Vcc) 142, the ground terminal (Gnd) 143, and the output terminal (Out) 144 is a pad provided on the semiconductor substrate 110.

A Ti layer, which is not shown, is preferably provided immediately on the top of the conductive layer 20. The insulating layer 30 made of $SiO_2$, for example, covers the magnetic layer 10 and the conductive layer 20. That is, the insulating layer 30 covers the first magnetoresistance elements 120a and 120b and the second magnetoresistance elements 130a and 130b.

Figure 7:
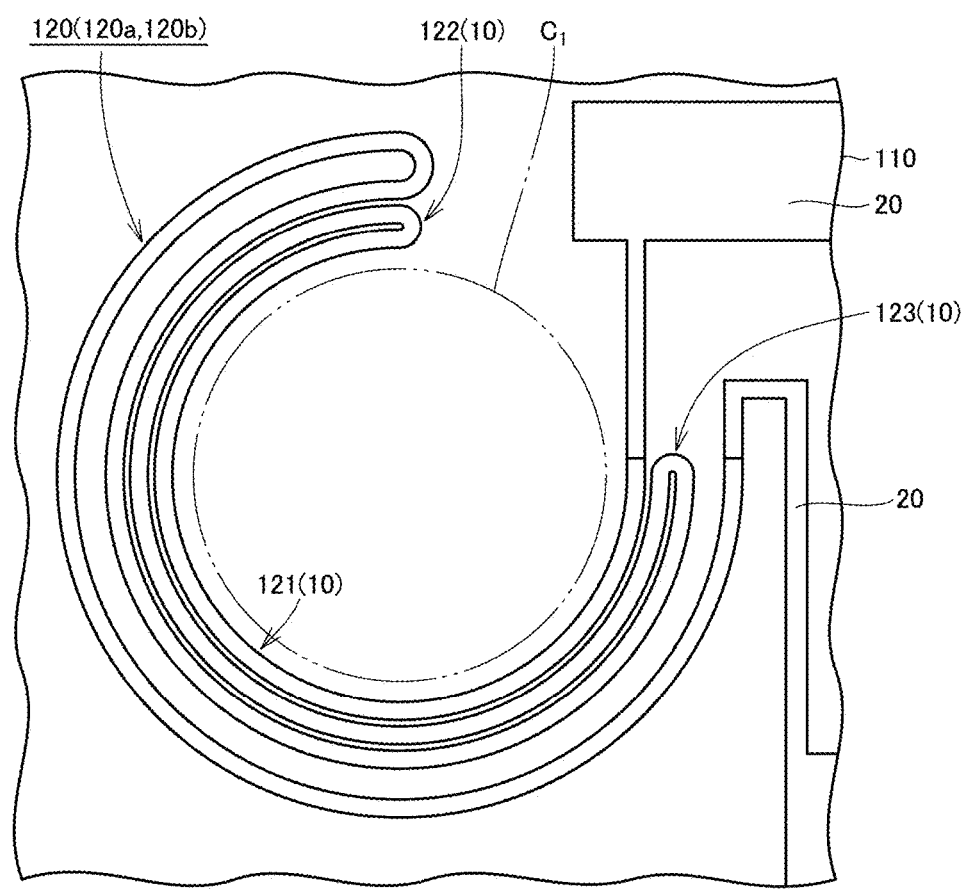
FIG. 7 is a plan view illustrating a pattern of a first magnetoresistance element of the magnetic sensor according to the first preferred embodiment of the present invention.

FIG. 7 is a plan view illustrating a pattern of each of the first magnetoresistance elements of the magnetic sensor according to the first preferred embodiment of the present invention. As shown in FIGS. 4 and 7, a pattern 120 of each of the first magnetoresistance elements 120a and 120b includes four first patterns. The four first patterns are provided along the circumference of an imaginary circle $C_1$ to be arranged side by side in the radial direction of the imaginary circle $C_1$ and are connected with each other, as viewed from a direction perpendicular or substantially perpendicular to the insulating layer 30. The direction perpendicular or substantially perpendicular to the insulating layer 30 is the Z-axis direction and is parallel or substantially parallel with a direction perpendicular or substantially perpendicular to the top surface of the semiconductor substrate 110.

The four first patterns are located along an imaginary C-shaped configuration Cu, which is opened at a portion where the wiring 146, 148, 150, and 152 is positioned, on the circumference of the imaginary circle $C_1$. The four first patterns are C-shaped patterns 121 concentrically disposed along the imaginary C-shaped configuration $C_{11}$ so as to be arranged side by side in the radial direction of the imaginary circle $C_1$.

The four C-shaped patterns 121 are connected with each other alternately at one end and at the other end starting from the central side of the imaginary circle $C_1$. The C-shaped patterns 121 connected with each other at one end are connected with each other by a semi-circular pattern 122. The C-shaped patterns 121 connected with each other at the other end are connected with each other by a semi-circular pattern 123.

The pattern 120 of each of the first magnetoresistance elements 120a and 120b includes two semi-circular patterns 122 and one semi-circular pattern 123. With this configuration, the four C-shaped patterns 121 are connected in series with each other. The semi-circular patterns 122 and 123 do not include any linearly extending portions and are defined only by curved portions.

Among the four C-shaped patterns 121, regarding the C-shaped pattern positioned at the outermost side from the center of the imaginary circle $C_1$, the end portion of this C-shaped pattern which is not connected to the semi-circular pattern 122 is connected to the wiring 145 or 149 defined by the conductive layer 20. Similarly, among the four C-shaped patterns 121, regarding the C-shaped pattern positioned at the innermost side from the center of the imaginary circle $C_1$, the end portion of this C-shaped pattern which is not connected to the semi-circular pattern 122 is connected to the wiring 146 or 150 defined by the conductive layer 20. The position at which the conductive layer 20 is provided, which is the position at which the conductive layer 20 is connected to the end portion of the C-shaped pattern 121, can be changed so as to adjust the electrical resistance of each of the first magnetoresistance elements 120a and 120b.

More specifically, at the connecting portion between the region R defining and functioning as the magnetoresistance elements and the region L defining and functioning as the wiring shown in FIG. 6, the conductive layer 20 extends toward the region R so as to increase the region L. This can reduce the electrical resistance of the first magnetoresistance elements 120a and 120b. Conversely, at the connecting portion between the region R defining and functioning as the magnetoresistance elements and the region L defining and functioning as the wiring, the conductive layer 20 retreats toward the region L so as to decrease the region L. This can increase the electrical resistance of the first magnetoresistance elements 120a and 120b.

The above-described adjustment of the electrical resistance of the first magnetoresistance elements 120a and 120b is performed by partially removing or adding the conductive layer 20, and is thus preferably done before the insulating layer 30 is formed.

Among the four C-shaped patterns 121, the outer peripheral edge of the C-shaped pattern 121 positioned at the outermost side from the center of the imaginary circle $C_1$ is the outer peripheral edge of each of the first magnetoresistance elements 120a and 120b. Among the four C-shaped patterns 121, the inner peripheral edge of the C-shaped pattern 121 positioned at the innermost side from the center of the imaginary circle $C_1$ is the inner peripheral edge of each of the first magnetoresistance elements 120a and 120b.

As shown in FIG. 4, the orientation of the circumferential direction of the first magnetoresistance element 120a and that of the first magnetoresistance element 120b are preferably different from each other so that the orientations of the two imaginary C-shaped configurations $C_{11}$ become different. That is, the orientation of the circumferential direction of the pattern 120 of the first magnetoresistance element 120a and that of the first magnetoresistance element 120b are different from each other so that the orientation of the C-shaped patterns 121 of the first magnetoresistance element 120a and that of the first magnetoresistance element 120b become different.

In the present preferred embodiment, the orientation of the circumferential direction of the pattern 120 of the first magnetoresistance element 120a and that of the first magnetoresistance element 120b preferably differ from each other by 90° or about 90°, for example, so that the orientation of the C-shaped patterns 121 of the first magnetoresistance element 120a and that of the first magnetoresistance element 120b become different from each other by 90° or about 90°, for example.

Figure 8:
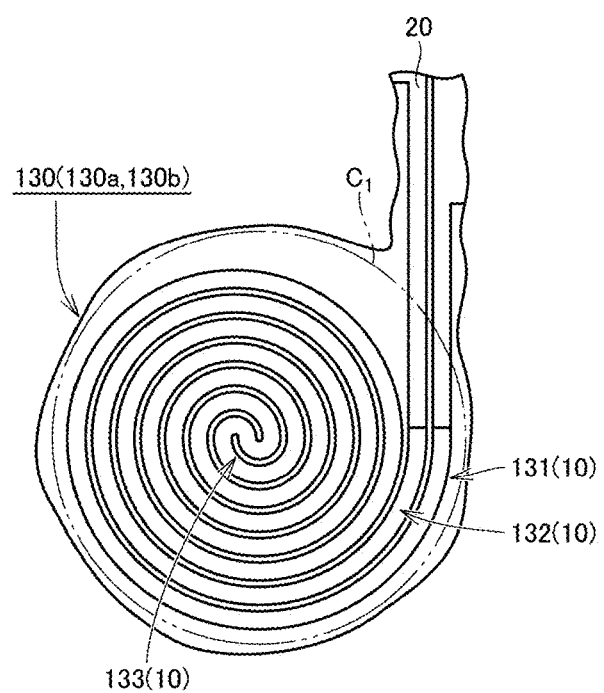
FIG. 8 is a plan view illustrating a pattern of a second magnetoresistance element of the magnetic sensor according to the first preferred embodiment of the present invention.

FIG. 8 is a plan view illustrating a pattern of each of the second magnetoresistance elements of the magnetic sensor according to the first preferred embodiment of the present invention. As shown in FIGS. 4 and 8, as viewed from the direction perpendicular or substantially perpendicular to the insulating layer 30, the second magnetoresistance element 130a is positioned at the central side of the imaginary circle $C_1$ and is surrounded by the first magnetoresistance element 120a, while the second magnetoresistance element 130b is positioned at the central side of the imaginary circle $C_1$ and is surrounded by the first magnetoresistance element 120b. That is, as viewed from the direction perpendicular or substantially perpendicular to the insulating layer 30, the second magnetoresistance element 130a is located farther inward than the inner peripheral edge of the first magnetoresistance element 120a, while the second magnetoresistance element 130b is located farther inward than the inner peripheral edge of the first magnetoresistance element 120b.

The second magnetoresistance element 130a is connected to the wiring 146 and 148 defined by the conductive layer 20 from the central side of the imaginary circle $C_1$ to the outer side of the imaginary circle $C_1$. The second magnetoresistance element 130b is connected to the wiring 150 and 152 defined by the conductive layer 20 from the central side of the imaginary circle $C_1$ to the outer side of the imaginary circle $C_1$.

Each of the second magnetoresistance elements 130a and 130b preferably includes a double-spiral pattern 130, as viewed from the direction perpendicular or substantially perpendicular to the insulating layer 30. The double-spiral pattern 130 includes spiral patterns 131 and 132 and a reversed-S-shaped pattern 133. The spiral pattern 131 is one of two second patterns, while the spiral pattern 132 is the other one of the two second patterns. The reversed-S-shaped pattern 133 connects the spiral patterns 131 and 132 at the central portion of the double-spiral pattern 130. The reversed-S-shaped pattern 133 does not have any linearly extending portions and are defined only by curved portions.

The double-spiral pattern 130 preferably has the same or substantially the same thickness as the pattern 120. The spiral patterns 131 and 132 accordingly have the same or substantially the same thickness as each of the four C-shaped patterns 121.

As shown in FIG. 8, the double-spiral pattern 130 preferably has a substantially point-symmetrical configuration with respect to the center of the imaginary circle $C_1$. That is, the double-spiral pattern 130 has a rotationally symmetrical configuration with respect to the center of the imaginary circle $C_1$ by about 180°.

As shown in FIG. 4, the orientation of the circumferential direction of the double-spiral pattern 130 of the second magnetoresistance element 130a and that of the second magnetoresistance element 130b are different from each other so that the orientation of the reversed-S-shaped pattern 133 of the second magnetoresistance element 130a and that of the second magnetoresistance element 130b become different.

In the present preferred embodiment, the orientation of the circumferential direction of the double-spiral pattern 130 of the second magnetoresistance element 130a and that of the second magnetoresistance element 130b are preferably different from each other by 90 or about 90°, for example, so that the orientation of the reversed-S-shaped pattern 133 of the second magnetoresistance element 130a and that of the second magnetoresistance element 130b become different from each other by 90° or about 90°.

In the magnetic sensor 1 according to the present preferred embodiment, each of the first magnetoresistance elements 120a and 120b preferably includes the C-shaped patterns 121. The C-shaped patterns 121 are defined by arcs. The adjacent C-shaped patterns 121 are connected with each other by the semi-circular pattern 122 or 123. In this manner, the first magnetoresistance elements 120a and 120b do not have any linearly extending portions, thus reducing the anisotropic characteristics in detecting a magnetic field.

Additionally, in the magnetic sensor 1 according to the present preferred embodiment, the orientation of the circumferential direction of the pattern 120 of the first magnetoresistance element 120a and that of the first magnetoresistance element 120b are different from each other so that the orientation of the C-shaped patterns 121 of the first magnetoresistance element 120a and that of the first magnetoresistance element 120b become different, thus improving the isotropic characteristics in detecting a magnetic field.

In the magnetic sensor 1 according to the present preferred embodiment, each of the second magnetoresistance elements 130a and 130b preferably has the double-spiral pattern 130. The double-spiral pattern 130 is formed principally by winding substantially circular-arc curved portions. The shape of a circular arc approximates a shape having an infinite number of corners of a polygon. Thus, the direction of a current flowing through the double-spiral pattern 130 covers substantially 360° in the horizontal direction. The horizontal direction is a direction parallel with the top surface of the semiconductor substrate 110.

In the magnetic sensor 1 according to the present preferred embodiment, the center of the double-spiral pattern 130 is the reversed-S-shaped pattern 133 defined only by curved portions. In this manner, the second magnetoresistance elements 130a and 130b do not include any linearly extending portions, thus reducing the anisotropic characteristics of the magnetoresistance effect.

In the magnetic sensor 1 according to the present preferred embodiment, the orientation of the circumferential direction of the double-spiral pattern 130 of the second magnetoresistance element 130a and that of the second magnetoresistance element 130b are different from each other so that the orientation of the reversed-S-shaped pattern 133 of the second magnetoresistance element 130a and that of the second magnetoresistance element 130b become different, thus improving the isotropic characteristics of the magnetoresistance effect.

The reason for this is as follows. As discussed above, the double-spiral pattern 130 preferably has a rotationally symmetrical configuration with respect to the center of the imaginary circle $C_1$ by about 180°. Because of this configuration, the second magnetoresistance elements 130a and 130b slightly exhibit the anisotropic characteristics of the magnetoresistance effect.

To compensate for the anisotropic characteristics, the orientation of the circumferential direction of the double-spiral pattern 130 of the second magnetoresistance element 130a and that of the second magnetoresistance element 130b are different from each other. Accordingly, the anisotropic characteristics of the magnetoresistance effect of the second magnetoresistance element 130a and that of the second magnetoresistance element 130b can offset each other and be reduced to a smaller level.

If the orientation of the circumferential direction of the double-spiral pattern 130 of the second magnetoresistance element 130a and that of the second magnetoresistance element 130b differ from each other by 90° or about 90°, for example, the anisotropic characteristics of the magnetoresistance effect of each of the second magnetoresistance elements 130a and 130b can be reduced or minimized.

In this case, the direction in which the second magnetoresistance element 130a becomes most sensitive coincides with that in which the second magnetoresistance element 130b becomes least sensitive, whereas the direction in which the second magnetoresistance element 130a becomes least sensitive coincides with that in which the second magnetoresistance element 130b becomes most sensitive. As a result, the potential difference generated between the nodes 140 and 141 when an external magnetic field is applied to the magnetic sensor 1 is less likely to vary depending on the application direction of the external magnetic field.

The double-spiral pattern 130 is preferably provided in a shape with a high density per unit area. With such a double-spiral pattern 130, the pattern of each of the second magnetoresistance elements 130a and 130b within the imaginary circle $C_1$ can be elongated so as to increase the resistance of the second magnetoresistance elements 130a and 130b. As the electrical resistance of the second magnetoresistance elements 130a and 130b is higher, the current consumed in the magnetic sensor 1 can be reduced by a greater amount.

As stated above, as a result of distributing the orientation of the current flowing through the double-spiral pattern 130 in the horizontal direction, the anisotropic characteristics of the magnetoresistance effect of each of the second magnetoresistance elements 130a and 130b is reduced. It is thus possible to reduce output variations of the magnetic sensor 1 when the external magnetic field is 0, which would be caused by the influence of residual magnetization.

The double-spiral pattern 130 may be wound in the opposite direction, in which case, the central portion of the double-spiral pattern 130 is an S-shaped pattern defined only by curved portions. That is, the two spiral patterns are connected with each other by the S-shaped pattern.

In the magnetic sensor 1 according to the present preferred embodiment, the second magnetoresistance elements 130a and 130b are inward of the first magnetoresistance elements 120a and 120b, respectively, thus making it possible to reduce the size of the magnetic sensor 1. Additionally, in the magnetic sensor 1, it is not necessary to three-dimensionally lay the wiring to connect the first magnetoresistance elements 120a and 120b and the second magnetoresistance elements 130a and 130b. Thus, the circuit substrate 100 can be manufactured with a simple manufacturing process.

In the magnetic sensor 1 according to the present preferred embodiment, the two first magnetic members 40 are disposed above the insulating layer 30 and are arranged side by side in the Y-axis direction. The thickness x of each first magnetic member 40 is preferably about 10 μm or greater, for example, and more specifically, about 20 μm to about 150 μm, for example. If the thickness x of the first magnetic member 40 is about 10 μm or greater, a vertical magnetic field deflected substantially in the horizontal direction by the first magnetic member 40 can be detected by each of the first magnetoresistance elements 120a and 120b. This will be discussed later. If the thickness x of the first magnetic member 40 is about 20 μm or greater, a vertical magnetic field can be more effectively deflected substantially in the horizontal direction by the first magnetic member 40, so that the first magnetoresistance elements 120a and 120b can each detect a weaker vertical magnetic field. If the thickness x of the first magnetic member 40 is about 150 μm or smaller, the time needed to make the first magnetic member 40 can be reduced, thus making it possible to maintain the mass-production of the magnetic sensors 1.

As shown in FIG. 4, as viewed from the direction perpendicular or substantially perpendicular to the insulating layer 30, the first magnetic members 40 preferably have an externally circular or substantially circular shape and are located in the regions farther inward than the outer peripheral edges of the first magnetoresistance elements 120a and 120b. The regions farther inward than the outer peripheral edges of the first magnetoresistance elements 120a and 120b are regions surrounded by the outer peripheral edges of the first magnetoresistance elements 120a and 120b when both ends of the outer peripheral edge of each of the first magnetoresistance elements 120a and 120b are connected with each other by an imaginary line, as viewed from the direction perpendicular or substantially perpendicular to the insulating layer 30. Preferably, for example, at least about one half, and more preferably, at least about ⅔, of the region farther inward than the outer peripheral edge of each of the first magnetoresistance elements 120a and 120b overlaps the corresponding first magnetic member 40, as viewed from the direction perpendicular or substantially perpendicular to the insulating layer 30.

In the present preferred embodiment, as viewed from the direction perpendicular or substantially perpendicular to the insulating layer 30, the first magnetic members 40 are located in the regions farther inward than the inner peripheral edges of the first magnetoresistance elements 120a and 120b. The regions farther inward than the inner peripheral edges of the first magnetoresistance elements 120a and 120b are regions surrounded by the inner peripheral edges of the first magnetoresistance elements 120a and 120b when both ends of the inner peripheral edge of each of the first magnetoresistance elements 120a and 120b are connected with each other by an imaginary line, as viewed from the direction perpendicular or substantially perpendicular to the insulating layer 30. The first magnetic members 40 may be each located in a region including the inner peripheral edge of the corresponding one of the first magnetoresistance elements 120a and 120b and the area inward of the inner peripheral edge, as viewed from the direction perpendicular or substantially perpendicular to the insulating layer 30. Preferably, for example, at least about one half, and more preferably, at least about ⅔, of the region farther inward than the inner peripheral edge of each of the first magnetoresistance elements 120a and 120b overlaps the corresponding first magnetic member 40, as viewed from the direction perpendicular or substantially perpendicular to the insulating layer 30.

In the present preferred embodiment, the first magnetic members 40 are preferably located concentrically with the outer peripheral edges of the first magnetoresistance elements 120a and 120b, as viewed from the direction perpendicular or substantially perpendicular to the insulating layer 30.

In the present preferred embodiment, the first magnetic members 40 do not cover the first magnetoresistance elements 120a and 120b, but cover the second magnetoresistance elements 130a and 130b, as viewed from the direction perpendicular or substantially perpendicular to the insulating layer 30. The first magnetic members 40 are thus surrounded by the first magnetoresistance elements 120a and 120b, as viewed from the direction perpendicular or substantially perpendicular to the insulating layer 30. The first magnetic members 40 are preferably made of a magnetic material having a high permeability and a high saturation magnetic flux density, such as, for example, electromagnetic steel, mild steel, silicon steel, permalloy, supermalloy, a nickel alloy, an iron alloy, or ferrite. These magnetic materials preferably have low magnetic coercivity.

If a magnetic material whose permeability increases at high temperatures and decreases at low temperatures, such as an Fe-78Ni alloy, is used as the magnetic material for the first magnetic members 40, the temperature dependence of the resistance change rate of the first magnetoresistance elements 120a and 120b can be reduced.

The first magnetic members 40 are preferably formed by plating, for example. A thin layer may be disposed between the insulating layer 30 and the first magnetic members 40.

A description will be provided of a first example in which the influence of the first magnetic member 40 on the distribution of a vertical magnetic field and that of a horizontal magnetic field is verified by simulations. In the first example, the exterior surface of the first magnetic member 40 was a cylinder having a diameter of about 140 μm and a thickness x of about 100 μm. The first magnetic member 40 was made of permalloy. The first magnetic members 40 were provided over the second magnetoresistance elements 130a and 130b such that they would not cover the first magnetoresistance elements 120a and 120b and cover the second magnetoresistance elements 130a and 130b. As viewed from the direction perpendicular or substantially perpendicular to the insulating layer 30, the first magnetic members 40 were provided such that the inner peripheral edges of the first magnetoresistance elements 120a and 120b were located adjacent to and outward of the outer peripheral edges of the first magnetic members 40. The strength of a vertical magnetic field or a horizontal magnetic field to be applied to the magnetic sensor 1 was about 30 mT.

Figure 9:
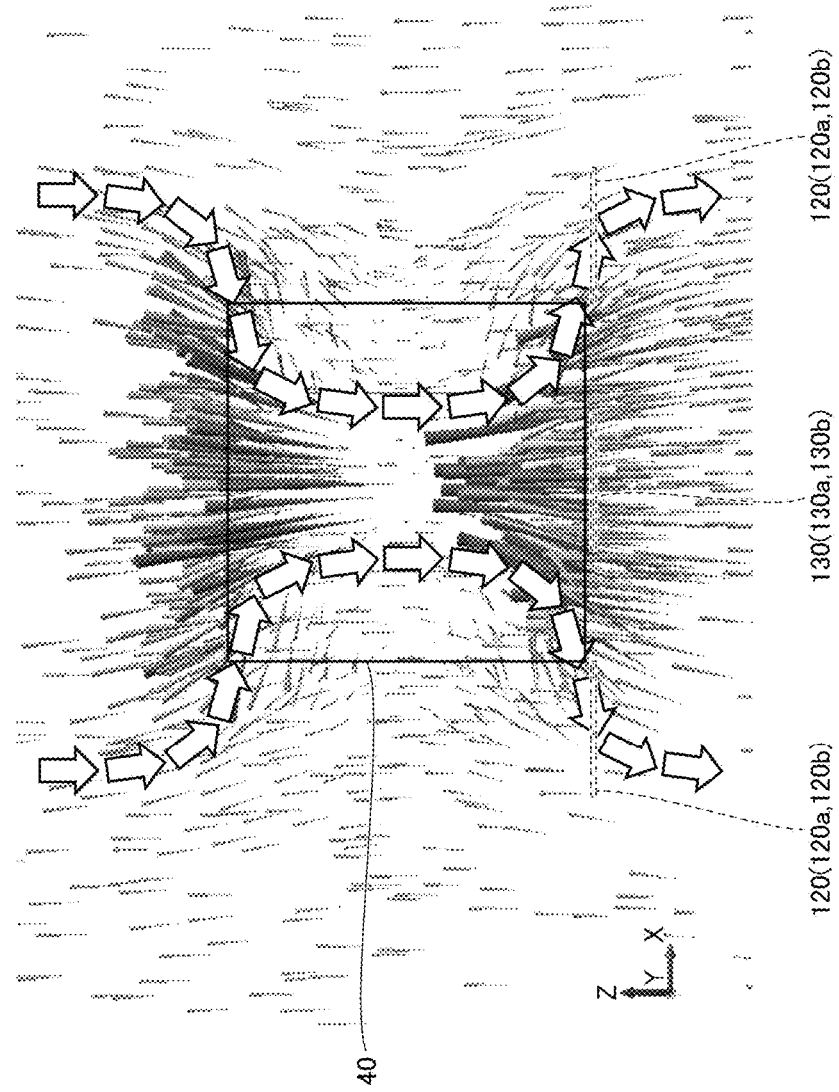
FIG. 9 is a magnetic flux diagram illustrating a distribution of the magnetic flux density when a vertical magnetic field is applied to a magnetic sensor according to a first example.
Figure 10:
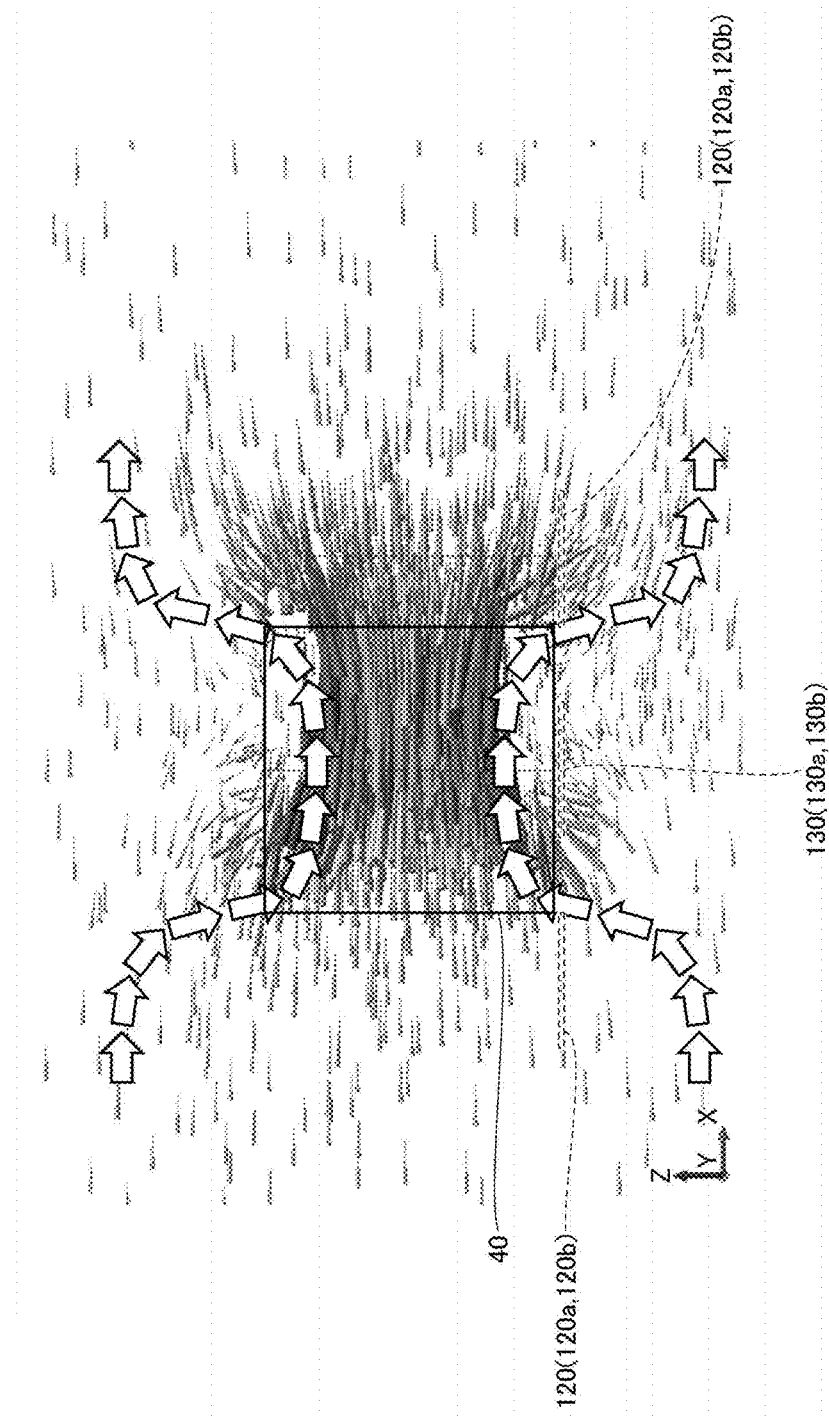
FIG. 10 is a magnetic flux diagram illustrating a distribution of the magnetic flux density when a horizontal magnetic field is applied to the magnetic sensor according to the first example.
Figure 11:
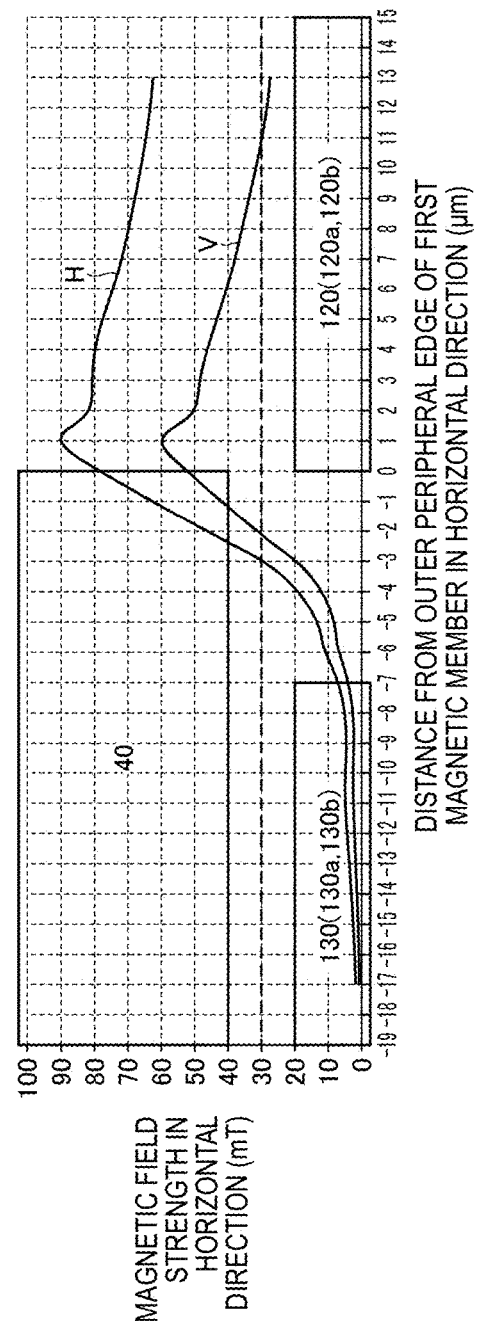
FIG. 11 is a graph illustrating a relationship between the distance from the outer peripheral edge of a first magnetic member in the horizontal direction and the horizontal-direction magnetic field strength when a vertical magnetic field or a horizontal magnetic field is applied to the magnetic sensor according to the first example.

FIG. 9 is a magnetic flux diagram illustrating a distribution of the magnetic flux density when a vertical magnetic field is applied to the magnetic sensor according to the first example. FIG. 10 is a magnetic flux diagram illustrating a distribution of the magnetic flux density when a horizontal magnetic field is applied to the magnetic sensor according to the first example. FIG. 11 is a graph illustrating a relationship between the distance from the outer peripheral edge of the first magnetic member in the horizontal direction and the magnetic field strength in the horizontal direction when a vertical magnetic field or a horizontal magnetic field is applied to the magnetic sensor according to the first example. FIGS. 9 and 10 illustrate the magnetic sensor 1 as viewed from the horizontal direction and show only the first magnetic member 40, the first magnetoresistance elements 120a and 120b, and the second magnetoresistance elements 130a and 130b.

In FIG. 11, the vertical axis indicates the magnetic field strength (mT) in the horizontal direction, while the horizontal axis indicates the distance (μm) from the outer peripheral edge of the first magnetic member in the horizontal direction. Regarding the distance from the outer peripheral edge of the first magnetic member in the horizontal direction, the distance outward from the outer peripheral edge of the first magnetic member 40 is represented by a positive value, while the distance inward from the outer peripheral edge of the first magnetic member 40 is represented by a negative value. The distribution of the magnetic field strength in the horizontal direction when a vertical magnetic field is applied is indicated by the solid line V, while that when a horizontal magnetic field is applied is indicated by the solid line H.

As shown in FIG. 9, when a vertical magnetic field heading from upward to downward was applied to the magnetic sensor 1 of the first example, the magnetic flux was attracted and concentrated toward the first magnetic member 40 having a high permeability on its top surface. The magnetic flux entering the first magnetic member 40 passed through the first magnetic member 40 in the vertical direction and was output from its bottom surface while diffusing.

In this case, the magnetic field was applied substantially in the vertical direction to each of the second magnetoresistance elements 130a and 130b positioned immediately under the first magnetic member 40. The second magnetoresistance elements 130a and 130b barely detect, or do not detect, the vertical magnetic field. In contrast, the magnetic field deflected substantially in the horizontal direction, as indicated by the arrows in FIG. 9, was applied to each of the first magnetoresistance elements 120a and 120b positioned downward from the outer peripheral edge of the first magnetic member 40. The first magnetoresistance elements 120a and 120b were thus able to detect the vertical magnetic field as a magnetic field deflected substantially in the horizontal direction.

As shown in FIG. 10, when a horizontal magnetic field heading from left to right was applied to the magnetic sensor of the first example, the magnetic flux was attracted and concentrated toward the first magnetic member 40 on its left surface. The magnetic flux entering the first magnetic member 40 passed through the first magnetic member 40 in the horizontal direction and was output from its right surface while diffusing.

In this case, the horizontal-direction magnetic field was barely applied, or not applied, to each of the second magnetoresistance elements 130a and 130b positioned immediately under the first magnetic member 40, as indicated by the arrow in FIG. 10. The second magnetoresistance elements 130a and 130b thus barely detect, or do not detect, the horizontal magnetic field. In contrast, the horizontal-direction magnetic field was applied to each of the first magnetoresistance elements 120a and 120b positioned downward from the outer peripheral edge of the first magnetic member 40. The first magnetoresistance elements 120a and 120b were thus able to detect the horizontal magnetic field.

FIG. 11 shows that, in a certain area of positions outward of the outer peripheral edge of the first magnetic member 40, the horizontal-direction magnetic field strength exceeds about 30 mT, which is the strength of the vertical magnetic field or the horizontal magnetic field applied to the magnetic sensor 1. More specifically, in the case of the application of the vertical magnetic field, the horizontal-direction magnetic field strength exceeds about 30 mT, which is the strength of the applied vertical magnetic field, in the area from the position separated inward from the outer peripheral edge of the first magnetic member 40 by about 2 μm to the position separated outward from the outer peripheral edge of the first magnetic member 40 by about 10 μm. In the case of the application of the horizontal magnetic field, too, the horizontal-direction magnetic field strength exceeds 30 mT, which is the strength of the applied horizontal magnetic field, at positions separated outward from the outer peripheral edge of the first magnetic member 40. The reason for this is that the magnetic field attracted and concentrated toward the first magnetic member 40 was output from the first magnetic member 40 in the horizontal direction at a high magnetic field strength. This horizontal-direction magnetic field having a high magnetic field strength was applied to the first magnetoresistance elements 120a and 120b.

FIG. 11 shows that the horizontal-direction magnetic field strength is about ⅓ or lower of the strength of the applied vertical magnetic field or horizontal magnetic field, which is about 30 mT, at positions separated inward from the outer peripheral edge of the first magnetic member 40 by about 7 μm or greater. Thus, the second magnetoresistance elements 130a and 130b are preferably disposed at positions separated inward from the outer peripheral edge of the first magnetic member 40 by about 7 μm or greater.

As described above, the horizontal-direction magnetic field strength exceeds about 30 mT, which is the strength of the applied vertical magnetic field or horizontal magnetic field, in the area from the position separated inward from the outer peripheral edge of the first magnetic member 40 by about 2 μm to the position separated outward from the outer peripheral edge of the first magnetic member 40 by about 10 μm. It is thus preferable that at least part of each of the first magnetoresistance elements 120a and 120b be provided in at least a portion of this area. As viewed from the direction perpendicular or substantially perpendicular to the insulating layer 30, each of the first magnetoresistance elements 120a and 120b disposed in this area preferably surrounds, for example, at least about ½, and more preferably, at least about ⅔, of the entirety of the outer peripheral portion of the first magnetic member 40.

As viewed from the direction perpendicular or substantially perpendicular to the insulating layer 30, the first magnetic members 40 are located concentrically with the outer peripheral edges of the first magnetoresistance elements 120a and 120b and are surrounded by the first magnetoresistance elements 120a and 120b. With this configuration, the horizontal-direction magnetic field output outward from the outer peripheral edge of the first magnetic member 40 was applied to each of the first magnetoresistance elements 120a and 120b substantially equally in the circumferential direction.

The results of the first example show that the magnetic sensor 1 of the first preferred embodiment of the present invention can improve the detection sensitivity of the first magnetoresistance elements 120a and 120b for a vertical magnetic field while reducing a change in the resistance of the second magnetoresistance elements 130a and 130b in response to a vertical magnetic field. That is, the first magnetoresistance elements 120a and 120b can detect a weak vertical magnetic field. The results of the first example also show that the magnetic sensor 1 of the first preferred embodiment of the present invention can improve the detection sensitivity of the first magnetoresistance elements 120a and 120b for a horizontal magnetic field while reducing a change in the resistance of the second magnetoresistance elements 130a and 130b in response to a horizontal magnetic field. That is, the first magnetoresistance elements 120a and 120b can detect a weak horizontal magnetic field.

A description will now be provided of a second example. In the second example, the influence of the thickness of the first magnetic member on the relationship between the distance from the outer peripheral edge of the first magnetic member in the horizontal direction and the horizontal-direction magnetic field strength when a vertical magnetic field was applied to a magnetic sensor was verified by simulations.

Figure 12:
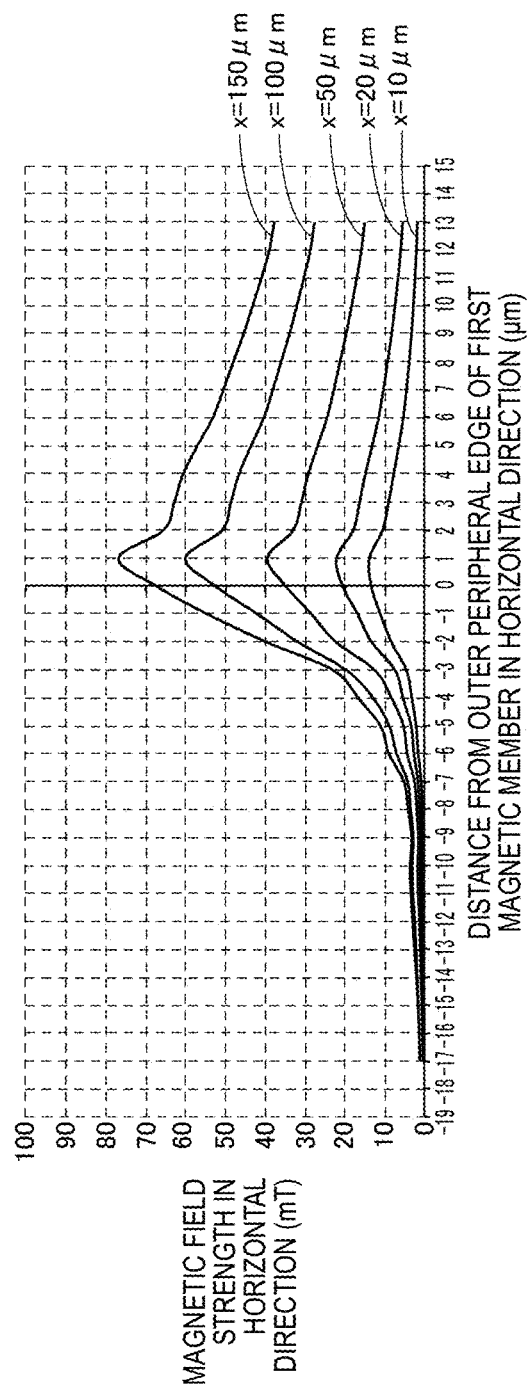
FIG. 12 is a graph illustrating the influence of the thickness of a first magnetic member on the relationship between the distance from the outer peripheral edge of the first magnetic member in the horizontal direction and the horizontal-direction magnetic field strength when a vertical magnetic field is applied to a magnetic sensor according to a second example.
Figure 13:
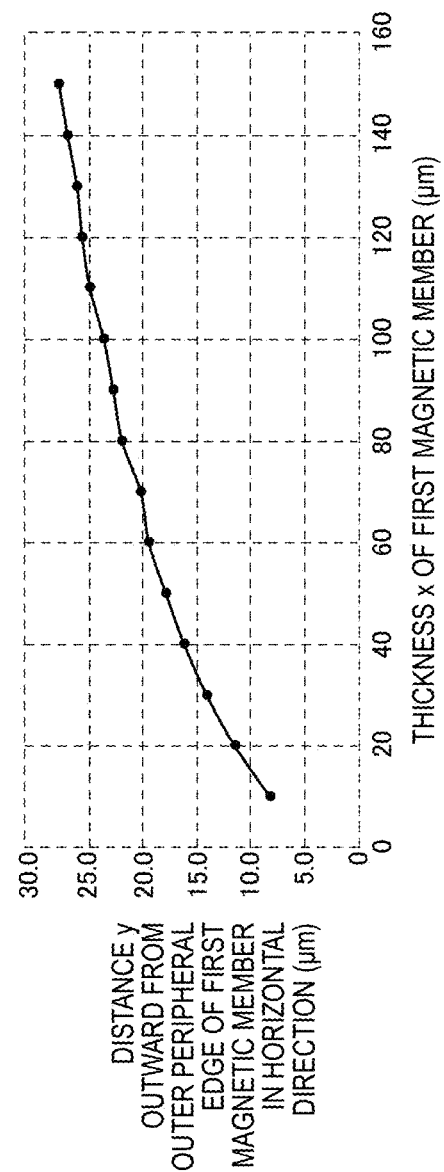
FIG. 13 is a graph illustrating a relationship between the thickness of the first magnetic member and the distance outward from the outer peripheral edge of the first magnetic member in the horizontal direction at which the horizontal-direction magnetic field strength reaches ⅓ of its peak value.

FIG. 12 is a graph illustrating the influence of the thickness of the first magnetic member on the relationship between the distance from the outer peripheral edge of the first magnetic member in the horizontal direction and the horizontal-direction magnetic field strength when a vertical magnetic field is applied to the magnetic sensor according to the second example. In FIG. 12, the vertical axis indicates the magnetic field strength (mT) in the horizontal direction, while the horizontal axis indicates the distance (μm) from the outer peripheral edge of the first magnetic member in the horizontal direction. FIG. 13 is a graph illustrating a relationship between the thickness of the first magnetic member and the distance outward from the outer peripheral edge of the first magnetic member in the horizontal direction at which the horizontal-direction magnetic field strength reaches ⅓ of its peak value. In FIGS. 12 and 13, regarding the distance from the outer peripheral edge of the first magnetic member in the horizontal direction, the distance outward from the outer peripheral edge of the first magnetic member 40 is represented by a positive value, while the distance inward from the outer peripheral edge of the first magnetic member 40 is represented by a negative value.

In the second example, the exterior surface of the first magnetic member 40 was a cylinder having a diameter of 140 μm. As the thickness x of the first magnetic member 40, five values were set, such as about 10 μm, about 20 μm, about 50 μm, about 100 μm, and about 150 μm. The first magnetic member 40 was made of permalloy. The first magnetic member 40 was arranged similarly to the first example. The strength of a vertical magnetic field to be applied to the magnetic sensor was about 30 mT.

As shown in FIG. 12, as the thickness x of the first magnetic member 40 becomes greater, the peak value of the horizontal-direction magnetic field strength becomes higher. As long as the permeability of permalloy is in a range of about 10000 to about 100000, the result shown in the graph of FIG. 12 is not considerably influenced by the permeability of the first magnetic member 40 and remains almost the same even when the permeability of the first magnetic members 40 is changed.

To obtain stable output from the bridge circuit of the magnetic sensor 1, the strength of a horizontal-direction magnetic field applied to the first magnetoresistance elements 120a and 120b is preferably, for example, about ⅓ or higher of its peak value, while the strength of a horizontal-direction magnetic field applied to the second magnetoresistance elements 130a and 130b is preferably, for example, about 1/10 or lower of its peak value.

As shown in FIG. 12, regardless of the thickness x of the first magnetic member 40, the horizontal-direction magnetic field strength is about ⅓ or higher of its peak value in the area of the positions separated inward from the outer peripheral edge of the first magnetic member 40 by about 2 μm or smaller.

As shown in FIG. 13, as the thickness x of the first magnetic member 40 becomes thicker, the distance y outward from the outer peripheral edge of the first magnetic member 40 in the horizontal direction at which the horizontal-direction magnetic field strength reaches about ⅓ of its peak value is greater. The relationship between the thickness x and the distance y is represented by the following approximate expression (I):

$$y=-0.0008x^2+0.2495x+6.6506 \qquad (I)$$

That is, in the area within y μm outward from the outer peripheral edge of the first magnetic member 40 in the horizontal direction, the horizontal-direction magnetic field strength becomes about ⅓ or higher of its peak value. Thus, as viewed from the direction perpendicular or substantially perpendicular to the insulating layer 30, the horizontal-direction magnetic field strength becomes about ⅓ or higher of its peak value in the area from the position separated inward from the outer peripheral edge of the first magnetic member 40 by about 2 μm to the position separated outward from the outer peripheral edge of the first magnetic member 40 by y μm indicated in the above-described expression (I).

As shown in FIG. 12, regardless of the thickness x of the first magnetic member 40, the horizontal-direction magnetic field strength is about 1/10 or lower of its peak value in the area inward from the outer peripheral edge of the first magnetic member 40 by about 7 μm or greater. That is, as viewed from the direction perpendicular or substantially perpendicular to the insulating layer 30, the horizontal-direction magnetic field strength becomes about 1/10 or lower of its peak value in the area from the center of the first magnetic member 40 to the position separated inward from the outer peripheral edge of the first magnetic member 40 by about 7 μm.

It is thus preferable that, as viewed from the direction perpendicular or substantially perpendicular to the insulating layer 30, at least a portion of each of the first magnetoresistance elements 120a and 120b is located in at least a portion of the area from the position separated inward from the outer peripheral edge of the first magnetic member 40 by about 2 μm to the position separated outward from the outer peripheral edge of the first magnetic member 40 by y μm indicated in the above-described expression (I).

It is also preferable that, as viewed from the direction perpendicular or substantially perpendicular to the insulating layer 30, each of the second magnetoresistance elements 130a and 130b be located in the area from the center of the first magnetic member 40 to the position separated inward from the outer peripheral edge of the first magnetic member 40 by about 7 μm.

As described above, the magnetic sensor 1 according to the first preferred embodiment of the present invention is able to detect a vertical magnetic field and a horizontal magnetic field with high sensitivity. In the magnetic sensor 1 according to the first preferred embodiment of the present invention, each of the first magnetoresistance elements 120a and 120b includes concentrically disposed multiple first patterns, thus improving the isotropic characteristics in detecting a horizontal magnetic field.

In the present preferred embodiment, the double-spiral patterns 130 of the second magnetoresistance elements 130a and 130b preferably have the same or substantially the same thickness as the patterns 120 of the first magnetoresistance elements 120a and 120b. Because of this configuration, even if the first magnetoresistance elements 120a and 120b and the second magnetoresistance elements 130a and 130b are formed in the same step, variations in the processing precision of the first magnetoresistance elements 120a and 120b and the second magnetoresistance elements 130a and 130b are reduced. Thus, the output characteristics of the magnetic sensor 1 can be stabilized.

However, the double-spiral patterns 130 may be narrower than the patterns 120. In this case, the magnetoresistance effect of the second magnetoresistance elements 130a and 130b becomes even smaller than that of the first magnetoresistance elements 120a and 120b. As a result, the magnetoresistance effect of the second magnetoresistance elements 130a and 130b is lessened, thus considerably decreasing the resistance change rate of the second magnetoresistance elements 130a and 130b.

This can increase the potential difference generated between the nodes 140 and 141 when an external magnetic field is applied to the magnetic sensor 1, thus improving the detection sensitivity of the magnetic sensor 1. Additionally, since the electrical resistance of the second magnetoresistance elements 130a and 130b is high, there is only a relatively small decrease in the potential difference generated between the nodes 140 and 141 when an external magnetic field having a high magnetic field strength is applied to the magnetic sensor 1, thus stabilizing the output characteristics of the magnetic sensor 1.

In the present preferred embodiment, the second magnetoresistance elements 130a and 130b are magnetically shielded by the first magnetic members 40 and barely detect, or do not detect, vertical magnetic fields and horizontal magnetic fields. For this reason, the resistance change rate of the second magnetoresistance elements 130a and 130b may not necessarily be smaller than that of the first magnetoresistance elements 120a and 120b.

In the magnetic sensor 1 according to the first preferred embodiment of the present invention, the first conductor 60 is provided between the first magnetic member 40 and the circuit substrate 100. The first conductor 60 includes the first base section 61 and the first narrow section 62, and the first narrow section 62 contacts the circuit substrate 100. More specifically, the first narrow section 62 contacts the insulating layer 30 provided on the front layer of the circuit substrate 100.

This configuration can reduce the contact area between the first conductor 60 and the circuit substrate 100, thus decreasing a stress applied from the first magnetic member 40 to each of the first magnetoresistance elements 120a and 120b and the second magnetoresistance elements 130a and 130b via the first conductor 60. A decrease in the output accuracy of the magnetic sensor 1 can accordingly be regulated. It is also less likely that the insulating layer 30 cracks due to a stress applied from the first magnetic member 40 to the insulating layer 30 via the first conductor 60. This can maintain the reliability of the magnetic sensor 1.

In the present preferred embodiment, a gap is provided between the first base section 61 and the insulating layer 30 all around the outer peripheral portion of the first conductor 60. This can effectively reduce the application of a stress caused by a distortion produced at the outer peripheral portion of the first magnetic member 40 to the circuit substrate 100 via the first conductor 60.

As described above, the magnetic sensor 1 according to the first preferred embodiment of the present invention achieves high isotropic characteristics in detecting a horizontal magnetic field and is also able to detect a weak vertical magnetic field by using magnetoresistance elements. The magnetic sensor 1 can also regulate a decrease in the output accuracy, which would be caused by a stress applied to the magnetoresistance elements from a structure disposed above the magnetoresistance elements. By using the thickness x of the first magnetic member 40 for that of a portion of the first magnetic member 40 positioned on the first conductor 60, the verification results based on the first and second examples can be utilized.

Second Preferred Embodiment

A magnetic sensor according to a second preferred embodiment of the present invention will be described below with reference to the drawing. The magnetic sensor according to the second preferred embodiment of the present invention is different from the magnetic sensor 1 of the first preferred embodiment of the present invention mainly in the configuration of the first conductor. An explanation of elements configured similarly to those of the magnetic sensor 1 of the first preferred embodiment of the present invention will not be repeated.

Figure 14:
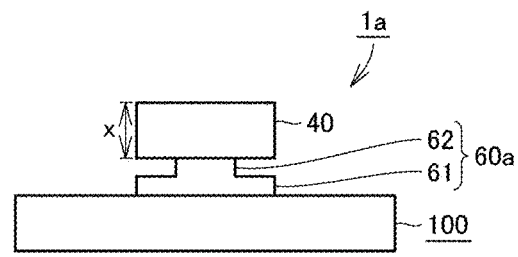
FIG. 14 is a front view illustrating the configuration of a magnetic sensor according to a second preferred embodiment of the present invention.

FIG. 14 is a front view illustrating the configuration of the magnetic sensor according to the second preferred embodiment of the present invention. In FIG. 14, the magnetic sensor as viewed from the same direction as that in FIG. 2 is shown.

As shown in FIG. 14, in a magnetic sensor 1a according to the second preferred embodiment of the present invention, a first conductor 60a is provided on the circuit substrate 100. The first conductor 60a preferably includes a first base section 61 and a first narrow section 62. In the first conductor 60a, the first base section 61 and the first narrow section 62 are arranged side by side in the direction perpendicular or substantially perpendicular to the insulating layer 30. In the present preferred embodiment, the first narrow section 62 of the first conductor 60a is positioned at the end portion of the first conductor 60a closer to the first magnetic member 40 in the direction perpendicular or substantially perpendicular to the insulating layer 30. That is, the first narrow section 62 of the first conductor 60a contacts the first magnetic member 40.

The first narrow section 62 in the first conductor 60a defines a gap partially between the first base section 61 and the first magnetic member 40. In the present preferred embodiment, the gap is provided between the first base section 61 and the first magnetic member 40 all around the outer peripheral portion of the first conductor 60a.

In the magnetic sensor 1a according to the second preferred embodiment of the present invention, the first conductor 60a is provided between the first magnetic member 40 and the circuit substrate 100. The first conductor 60a includes the first base section 61 and the first narrow section 62, and the first narrow section 62 contacts the first magnetic member 40.

This configuration can reduce the contact area between the first conductor 60a and the first magnetic member 40, thus decreasing a stress applied from the first magnetic member 40 to each of the first magnetoresistance elements 120a and 120b and the second magnetoresistance elements 130a and 130b via the first conductor 60a. A decrease in the output accuracy of the magnetic sensor 1a can accordingly be regulated. It is also less likely that the insulating layer 30 cracks due to a stress applied from the first magnetic member 40 to the insulating layer 30 via the first conductor 60a. This can maintain the reliability of the magnetic sensor 1a.

In the present preferred embodiment, a gap is provided between the first base section 61 and the first magnetic member 40 all around the outer peripheral portion of the first conductor 60a. This can effectively reduce the application of a stress caused by a distortion produced at the outer peripheral portion of the first magnetic member 40 to the circuit substrate 100 via the first conductor 60a.

Third Preferred Embodiment

A magnetic sensor according to a third preferred embodiment of the present invention will be described below with reference to the drawing. The magnetic sensor according to the third preferred embodiment of the present invention is different from the magnetic sensor 1 of the first preferred embodiment of the present invention mainly in the configuration of the first conductor. An explanation of elements configured similarly to those of the magnetic sensor 1 of the first preferred embodiment of the present invention will not be repeated.

Figure 15:
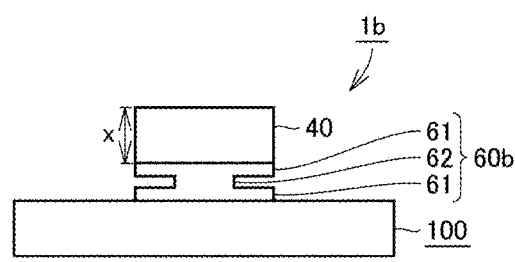
FIG. 15 is a front view illustrating the configuration of a magnetic sensor according to a third preferred embodiment of the present invention.

FIG. 15 is a front view illustrating the configuration of the magnetic sensor according to the third preferred embodiment of the present invention. In FIG. 15, the magnetic sensor as viewed from the same direction as that in FIG. 2 is shown.

As shown in FIG. 15, in a magnetic sensor 1b according to the third preferred embodiment of the present invention, a first conductor 60b is provided on the circuit substrate 100. The first conductor 60b includes first base sections 61 and a first narrow section 62. In the first conductor 60b, the first base sections 61 and the first narrow section 62 are arranged side by side in the direction perpendicular or substantially perpendicular to the insulating layer 30. In the present preferred embodiment, the first base section 61 of the first conductor 60b is preferably located at the end portion of the first conductor 60b closer to the insulating layer 30 and that adjacent to the first magnetic member 40 in the direction perpendicular or substantially perpendicular to the insulating layer 30. The first narrow section 62 of the first conductor 60b is sandwiched between the first base sections 61 of the first conductor 60b in the direction perpendicular or substantially perpendicular to the insulating layer 30.

The first narrow section 62 in the first conductor 60b defines a gap partially between the first base sections 61. In the present preferred embodiment, the gap is provided between the first base sections 61 all around the outer peripheral portion of the first conductor 60b.

In the magnetic sensor 1b according to the third preferred embodiment of the present invention, the first conductor 60b is provided between the first magnetic member 40 and the circuit substrate 100. The first conductor 60b includes the first narrow section 62 between the first base sections 61.

This enables the first narrow section 62 to relax a stress within the first conductor 60b, thus decreasing a stress applied from the first magnetic member 40 to each of the first magnetoresistance elements 120a and 120b and the second magnetoresistance elements 130a and 130b via the first conductor 60b. A decrease in the output accuracy of the magnetic sensor 1b can accordingly be regulated. It is also less likely that the insulating layer 30 cracks due to a stress applied from the first magnetic member 40 to the insulating layer 30 via the first conductor 60b. This can maintain the reliability of the magnetic sensor 1b.

In the present preferred embodiment, a gap is provided between the first base sections 61 all around the outer peripheral portion of the first conductor 60b. This can effectively reduce the application of a stress caused by a distortion produced at the outer peripheral portion of the first magnetic member 40 to the circuit substrate 100 via the first conductor 60b.

Fourth Preferred Embodiment

A magnetic sensor according to a fourth preferred embodiment of the present invention will be described below with reference to the drawing. The magnetic sensor according to the fourth preferred embodiment of the present invention is different from the magnetic sensor 1 of the first preferred embodiment of the present invention mainly in the configuration of the first magnetic member and the omission of the first conductor. An explanation of elements configured similarly to those of the magnetic sensor 1 of the first preferred embodiment of the present invention will not be repeated.

Figure 16:
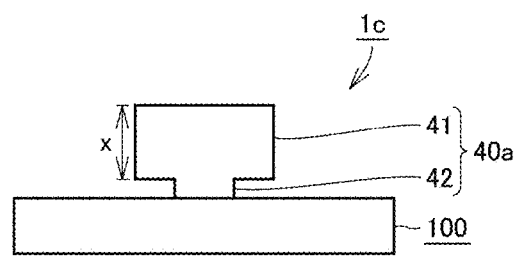
FIG. 16 is a front view illustrating the configuration of a magnetic sensor according to a fourth preferred embodiment of the present invention.

FIG. 16 is a front view illustrating the configuration of the magnetic sensor according to the fourth preferred embodiment of the present invention. In FIG. 16, the magnetic sensor as viewed from the same direction as that in FIG. 2 is shown.

As shown in FIG. 16, in a magnetic sensor 1c according to the fourth preferred embodiment of the present invention, a first magnetic member 40a is provided on the circuit substrate 100. The first magnetic member 40a includes a first base section 41 and a first narrow section 42. The area of the exterior surface of the first narrow section 42 is smaller than that of the first base section 41, as viewed from the direction perpendicular or substantially perpendicular to the insulating layer 30. In the first magnetic member 40a, the first base section 41 and the first narrow section 42 are arranged side by side in the direction perpendicular or substantially perpendicular to the insulating layer 30. In the present preferred embodiment, the first narrow section 42 of the first magnetic member 40a is positioned at the end portion of the first magnetic member 40a closer to the insulating layer 30 in the direction perpendicular or substantially perpendicular to the insulating layer 30. That is, the first narrow section 42 of the first magnetic member 40a contacts the circuit substrate 100.

As viewed from the direction perpendicular or substantially perpendicular to the insulating layer 30, the exterior surface of each of the first base section 41 and the first narrow section 42 is preferably circular or substantially circular, for example. The diameter of the exterior surface of the first narrow section 42 is smaller than that of the first base section 41. The first base section 41 and the first narrow section 42 are provided substantially coaxially or coaxially. The first base section 41 is not restricted to the above-described shape and may be provided in an elliptical or polygonal shape, for example. The first narrow section 42 is not restricted to the above-described shape and may be formed in any shape if the area of the exterior surface as viewed from the direction perpendicular or substantially perpendicular to the insulating layer 30 is smaller than that of the first base section 41.

The first narrow section 42 in the first magnetic member 40a defines a gap partially between the first base section 41 and the circuit substrate 100. In the present preferred embodiment, the gap is provided between the first base section 41 and the circuit substrate 100 all around the outer peripheral portion of the first magnetic member 40*a*.

With a view to decreasing the distance between the first magnetic member 40*a* and the circuit substrate 100, the thickness of the first narrow section 42 in the Z-axis direction is preferably about 2.0 μm or smaller, for example. As the distance between the first base section 41 of the first magnetic member 40*a* and the circuit substrate 100 is smaller, the magnetic shielding function of the first magnetic member 40*a* can be provided more effectively.

To form the first narrow section 42, patterning with a resist or etching with a sacrificial layer, for example, may be utilized.

In the magnetic sensor 1*c* according to the fourth preferred embodiment of the present invention, the first narrow section 42 of the first magnetic member 40*a* contacts the circuit substrate 100. This configuration can reduce the contact area between the first magnetic member 40*a* and the circuit substrate 100, thus decreasing a stress applied from the first magnetic member 40*a* to each of the first magnetoresistance elements 120*a* and 120*b* and the second magnetoresistance elements 130*a* and 130*b*. A decrease in the output accuracy of the magnetic sensor 1*c* can accordingly be regulated. It is also less likely that the insulating layer 30 cracks due to a stress applied from the first magnetic member 40*a* to the insulating layer 30. This can maintain the reliability of the magnetic sensor 1*c*.

In the present preferred embodiment, a gap is provided between the first base section 41 of the first magnetic member 40*a* and the circuit substrate 100 all around the outer peripheral portion of the first magnetic member 40*a*. This can effectively reduce the application of a stress caused by a distortion produced at the outer peripheral portion of the first magnetic member 40*a* to the circuit substrate 100. By using the thickness x of the first magnetic member 40*a* for that of the first base section 41, the verification results based on the first and second examples can be utilized.

Fifth Preferred Embodiment

A magnetic sensor according to a fifth preferred embodiment of the present invention will be described below with reference to the drawings. The magnetic sensor according to the fifth preferred embodiment of the present invention is different from the magnetic sensor 1 of the first preferred embodiment of the present invention mainly in the pattern of second magnetoresistance elements. An explanation of elements configured similarly to those of the magnetic sensor 1 of the first preferred embodiment of the present invention will not be repeated.

Figure 17:
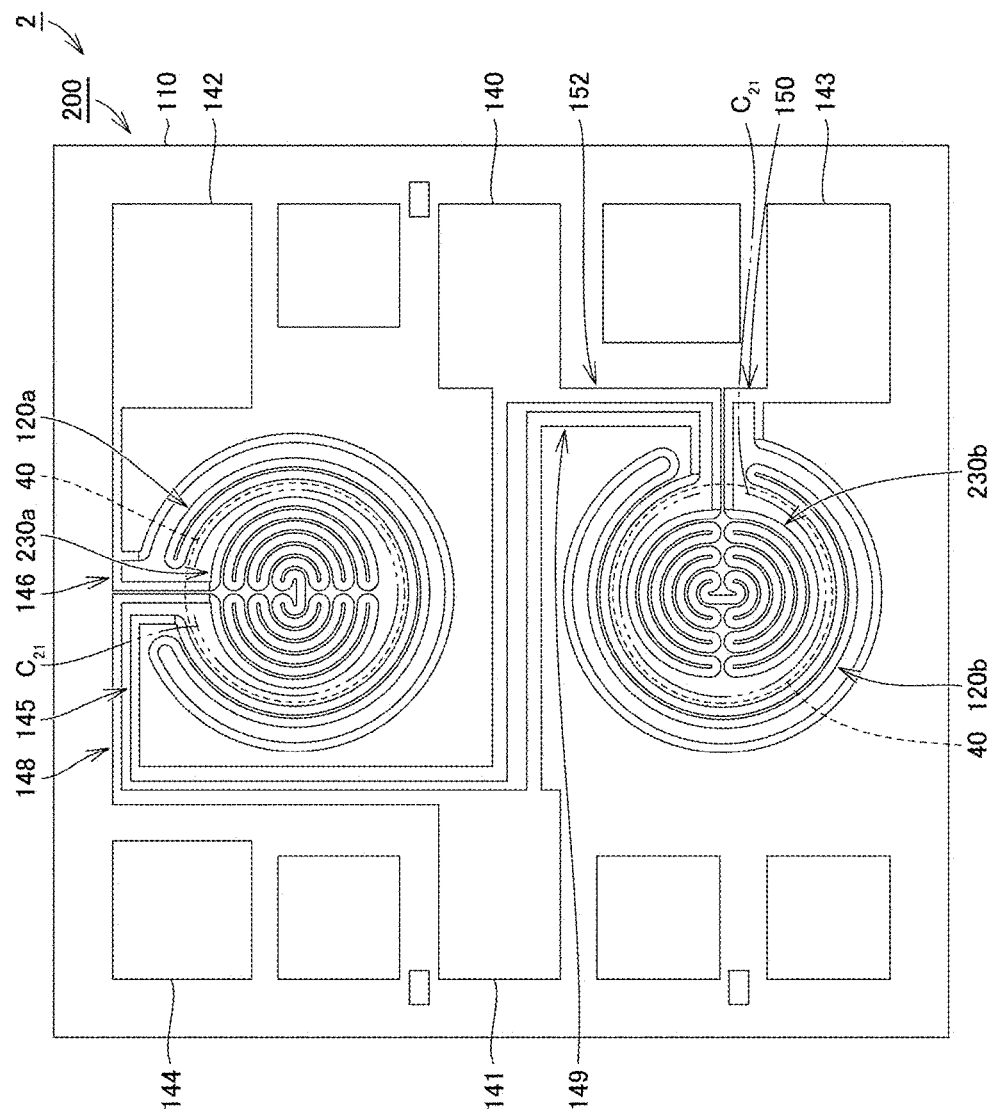
FIG. 17 is a plan view of a magnetic sensor according to a fifth preferred embodiment of the present invention.
Figure 18:
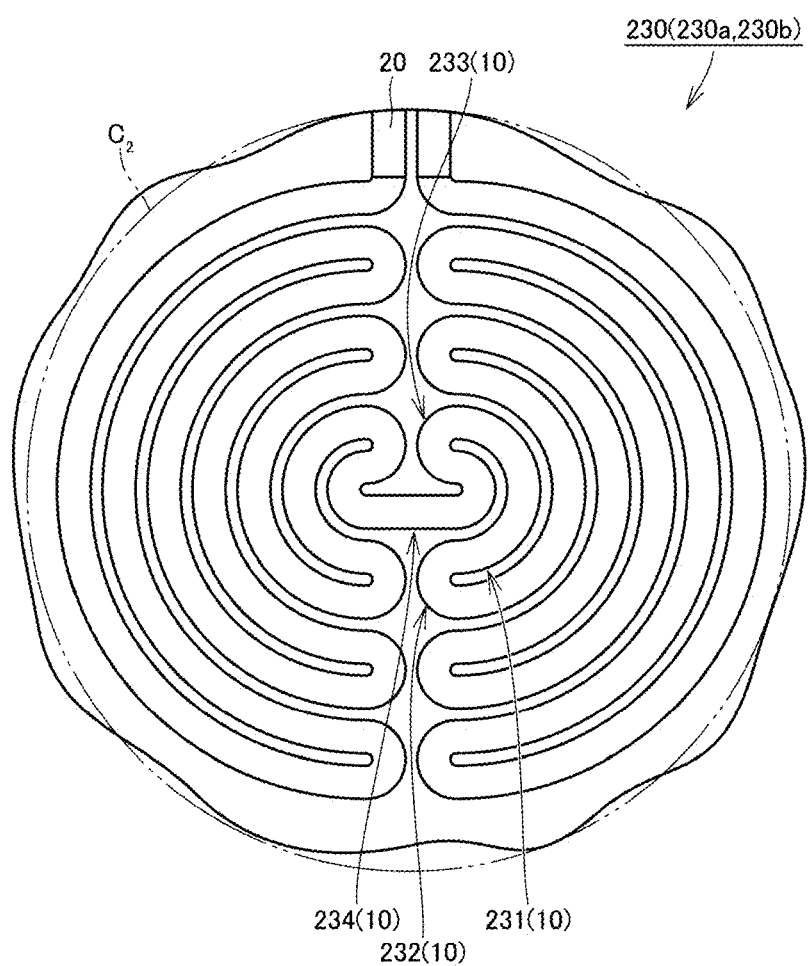
FIG. 18 is a plan view illustrating a pattern of a second magnetoresistance element of the magnetic sensor according to the fifth preferred embodiment of the present invention.

FIG. 17 is a plan view of the magnetic sensor according to the fifth preferred embodiment of the present invention. FIG. 18 is a plan view illustrating a pattern of a second magnetoresistance element of the magnetic sensor according to the fifth preferred embodiment of the present invention. As shown in FIG. 17, a magnetic sensor 2 according to the fifth preferred embodiment of the present invention includes a circuit substrate 200 and two first magnetic members 40 provided above the circuit substrate 200. In the magnetic sensor 2 according to the fifth preferred embodiment of the present invention, on the circuit substrate 200, two first conductors are provided. The first magnetic members 40 cover the associated first conductors, as viewed from the direction perpendicular or substantially perpendicular to the insulating layer 30.

As shown in FIGS. 17 and 18, a pattern of each of first magnetoresistance elements 120*a* and 120*b* of the magnetic sensor 2 according to the fifth preferred embodiment of the present invention preferably includes three first patterns. The three first patterns are disposed along the circumference of an imaginary circle $C_2$ so as to be arranged side by side in the radial direction of the imaginary circle $C_2$ and are connected with each other, as viewed from the direction perpendicular or substantially perpendicular to the insulating layer 30. The three first patterns are located along an imaginary C-shaped configuration $C_{21}$, which is opened at a portion where wiring 146, 148, 150, and 152 is positioned, on the circumference of the imaginary circle $C_2$. The three first patterns are C-shaped patterns disposed along the imaginary C-shaped configuration $C_{21}$ so as to be arranged side by side in the radial direction of the imaginary circle $C_2$.

As shown in FIG. 17, the orientation of the circumferential direction of the first magnetoresistance element 120*a* and that of the first magnetoresistance element 120*b* are different from each other so that the orientations of the two imaginary C-shaped configurations $C_{21}$ become different. That is, the orientation of the circumferential direction of the pattern of the first magnetoresistance element 120*a* and that of the first magnetoresistance element 120*b* are different from each other so that the orientation of the circumferential direction of the C-shaped patterns of the first magnetoresistance element 120*a* and that of the first magnetoresistance element 120*b* become different.

In the present preferred embodiment, the orientation of the circumferential direction of the pattern of the first magnetoresistance element 120*a* and that of the first magnetoresistance element 120*b* preferably differ from each other by 90° or about 90°, for example, so that the orientation of the C-shaped patterns of the first magnetoresistance element 120*a* and that of the first magnetoresistance element 120*b* become different from each other by 90° or about 90°.

As shown in FIGS. 17 and 18, as viewed from the direction perpendicular or substantially perpendicular to the insulating layer 30, a second magnetoresistance element 230*a* is positioned at the central side of the imaginary circle $C_2$ and is surrounded by the first magnetoresistance element 120*a*, while a second magnetoresistance element 230*b* is positioned at the central side of the imaginary circle $C_2$ and is surrounded by the first magnetoresistance element 120*b*. That is, as viewed from the direction perpendicular or substantially perpendicular to the insulating layer 30, the second magnetoresistance element 230*a* is located farther inward than the inner peripheral edge of the first magnetoresistance element 120*a*, while the second magnetoresistance element 230*b* is located farther inward than the inner peripheral edge of the first magnetoresistance element 120*b*.

Each of the second magnetoresistance elements 230*a* and 230*b* includes a pattern 230. The pattern 230 includes, for example, fourteen semi-circular patterns 231, which are second patterns, disposed along the circumference of the imaginary circle $C_2$ line-symmetrically to each other so as to be arranged side by side preferably in the radial direction of the imaginary circle $C_2$. The pattern 230 preferably has the same or substantially the same thickness as that of the pattern 120 of each of the first magnetoresistance elements 120*a* and 120*b*. However, the pattern 230 may be thinner than the pattern 120.

The fourteen semi-circular patterns 231 are connected with each other alternately at one end and at the other end starting from inward. The semi-circular patterns 231 connected with each other at one end are connected with each other by a semi-circular pattern 232. The semi-circular patterns 231 connected with each other at the other end are connected with each other by a semi-circular pattern 233.

The semi-circular patterns 231 positioned at the innermost side line-symmetrically to each other are connected with each other at one end by a linearly extending portion 234. The length of the linearly extending portion 234 is preferably shorter than about 10 μm, for example.

The pattern 230 of each of the second magnetoresistance elements 230a and 230b preferably includes, for example, the six semi-circular patterns 232, the six semi-circular patterns 233, and the linearly extending portion 234. With this configuration, the fourteen semi-circular patterns 231 are connected in series with each other. The semi-circular patterns 232 and 233 do not include any linearly extending portions and are defined only by curved portions.

In the magnetic sensor 2 according to the present preferred embodiment, each of the second magnetoresistance elements 230a and 230b includes the semi-circular patterns 231. The semi-circular patterns 231 are preferably arcs. The two adjacent semi-circular patterns 231 are connected with each other by the semi-circular pattern 232 or 233. Each of the second magnetoresistance elements 230a and 230b preferably includes the linearly extending portion 234 merely having a length shorter than about 10 μm. This configuration can reduce the anisotropic characteristics in detecting a magnetic field.

The orientation of the circumferential direction of the pattern 230 of the second magnetoresistance element 230a and that of the second magnetoresistance element 230b are different from each other. In the present preferred embodiment, the orientation of the circumferential direction of the pattern 230 of the second magnetoresistance element 230a and that of the second magnetoresistance element 230b are different from each other by 90° or about 90°, for example. Accordingly, the anisotropic characteristics of the magnetoresistance effect of the second magnetoresistance element 230a and that of the second magnetoresistance element 230b can be offset each other and be reduced to a smaller level.

In the magnetic sensor 2 according to the present preferred embodiment, the second magnetoresistance elements 230a and 230b are inward of the first magnetoresistance elements 120a and 120b, respectively, thus making it possible to reduce the size of the magnetic sensor 2. Additionally, in the magnetic sensor 2, too, it is not necessary to three-dimensionally lay the wiring to connect the first magnetoresistance elements 120a and 120b and the second magnetoresistance elements 230a and 230b. Thus, the circuit substrate 200 can be manufactured with a simple manufacturing process.

As shown in FIG. 17, the first magnetic members 40 do not cover the first magnetoresistance elements 120a and 120b, but cover the second magnetoresistance elements 230a and 230b, as viewed from the direction perpendicular or substantially perpendicular to the insulating layer 30.

The magnetic sensor 2 according to the present preferred embodiment is also able to detect a vertical magnetic field and a horizontal magnetic field with high sensitivity. In the magnetic sensor 2 according to the fifth preferred embodiment of the present invention, each of the first magnetoresistance elements 120a and 120b includes concentrically disposed multiple first patterns, thus improving the isotropic characteristics in detecting a horizontal magnetic field.

In the present preferred embodiment, the second magnetoresistance elements 230a and 230b are magnetically shielded by the first magnetic members 40 and barely detect, or do not detect, vertical magnetic fields and horizontal magnetic fields. For this reason, the resistance change rate of the second magnetoresistance elements 230a and 230b may not necessarily be smaller than that of the first magnetoresistance elements 120a and 120b.

The magnetic sensor 2 according to the fifth preferred embodiment of the present invention also achieves high isotropic characteristics in detecting a horizontal magnetic field and is also able to detect a weak vertical magnetic field by using magnetoresistance elements. The magnetic sensor 2 can also regulate a decrease in the output accuracy, which would be caused by a stress applied to the magnetoresistance elements from a structure disposed above the magnetoresistance elements.

Sixth Preferred Embodiment

A magnetic sensor according to a sixth preferred embodiment of the present invention will be described below with reference to the drawings. The magnetic sensor according to the sixth preferred embodiment of the present invention is different from the magnetic sensor 1 of the first preferred embodiment of the present invention mainly in the patterns of the first and second magnetoresistance elements, the arrangement of the second magnetoresistance elements, and the addition of second conductors. An explanation of elements configured similarly to those of the magnetic sensor 1 of the first preferred embodiment of the present invention will not be repeated.

Figure 19:
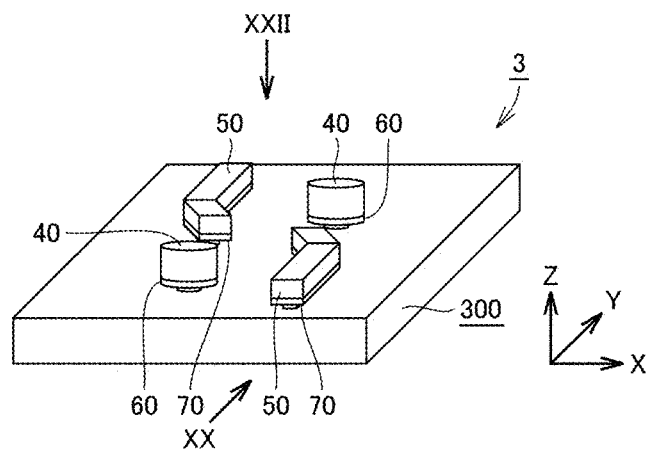
FIG. 19 is a perspective view illustrating the configuration of a magnetic sensor according to a sixth preferred embodiment of the present invention.
Figure 20:
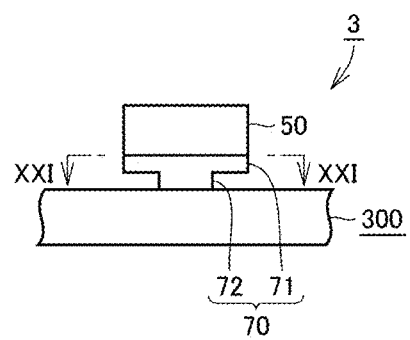
FIG. 20 is a front view of the magnetic sensor in FIG. 19, as viewed from the direction indicated by the arrow XX in FIG. 19.
Figure 21:
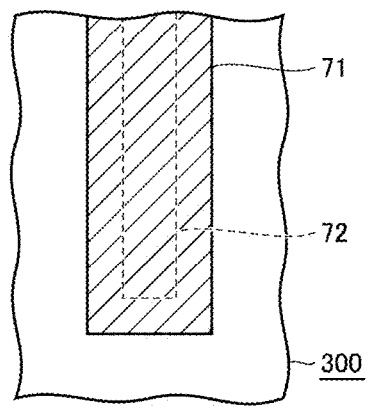
FIG. 21 is a sectional view of the magnetic sensor in FIG. 20, as viewed from the direction indicated by the arrow of line XXI-XXI in FIG. 20.
Figure 22:
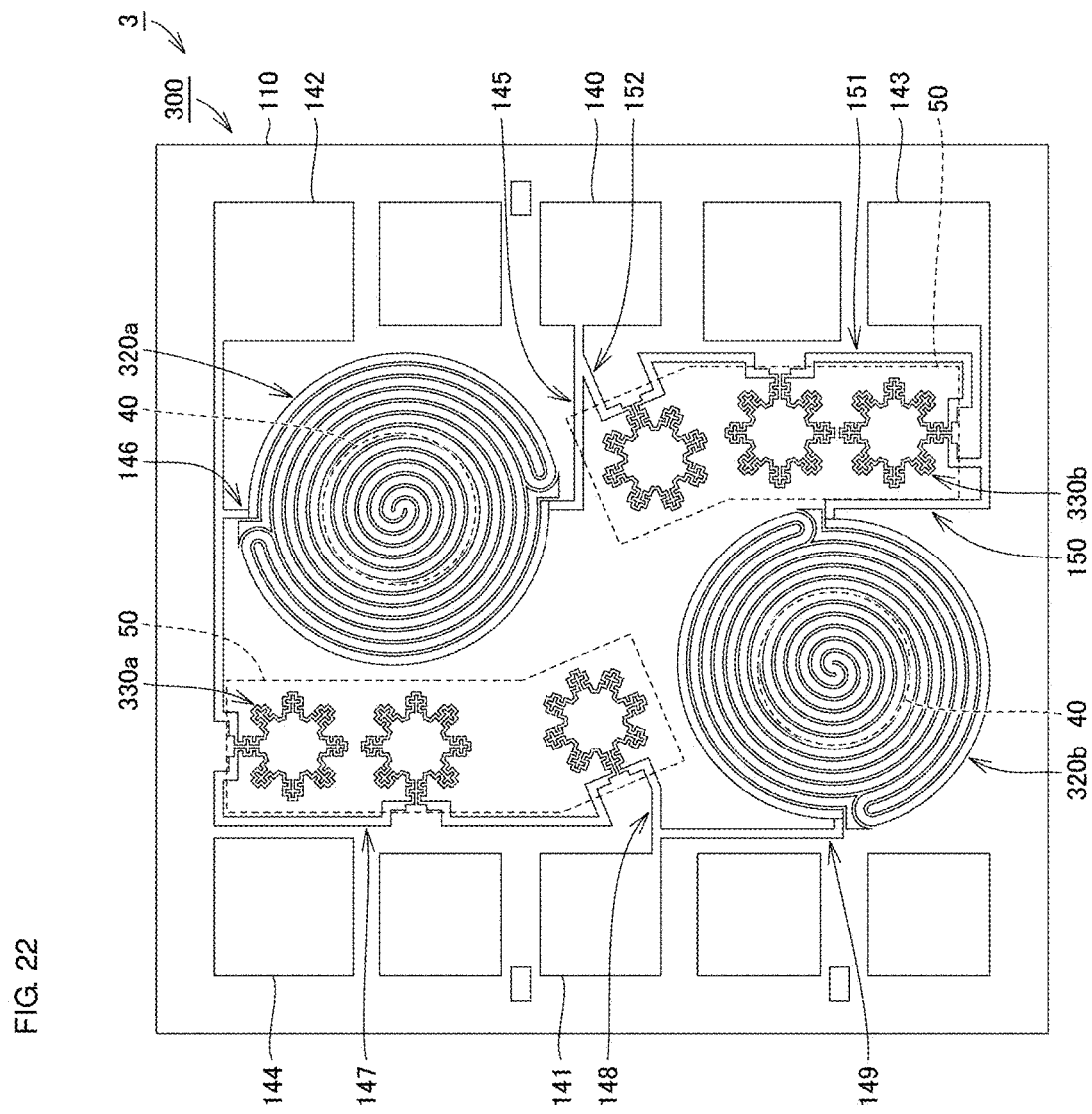
FIG. 22 is a plan view of the magnetic sensor in FIG. 19, as viewed from the direction indicated by the arrow XXII in FIG. 19.

FIG. 19 is a perspective view illustrating the configuration of the magnetic sensor according to the sixth preferred embodiment of the present invention. FIG. 20 is a front view of the magnetic sensor in FIG. 19, as viewed from the direction indicated by the arrow XX in FIG. 19. FIG. 21 is a sectional view of the magnetic sensor in FIG. 20, as viewed from the direction indicated by the arrow of line XXI-XXI in FIG. 20. FIG. 22 is a plan view of the magnetic sensor in FIG. 19, as viewed from the direction indicated by the arrow XXII in FIG. 19.

As shown in FIGS. 19 through 22, a magnetic sensor 3 according to the sixth preferred embodiment of the present invention includes a circuit substrate 300 and two first magnetic members 40 and two second magnetic members 50 provided above the circuit substrate 300. In the magnetic sensor 3 according to the sixth preferred embodiment of the present invention, two first conductors 60 and two second conductors 70 are preferably on the circuit substrate 300. An insulating layer 30 is provided on the front layer of the circuit substrate 300, and the two first conductors 60 and the two second conductors 70 are located on the insulating layer 30.

Each of the second conductors 70 preferably includes a second base section 71 and a second narrow section 72. The area of the exterior surface of the second narrow section 72 as viewed from the Z-axis direction, which is perpendicular or substantially perpendicular to the insulating layer 30, is smaller than that of the second base section 71. In the second conductor 70, the second base section 71 and the second narrow section 72 are arranged side by side in the Z-axis direction, which is perpendicular or substantially perpendicular to the insulating layer 30. In the present preferred embodiment, the second narrow section 72 of the second conductor 70 is positioned at the end portion of the second conductor 70 closer to the insulating layer 30 in the Z-axis direction, which is perpendicular or substantially perpendicular to the insulating layer 30. That is, the second narrow section 72 of the second conductor 70 contacts the insulating layer 30 on the circuit substrate 300.

As viewed from the Z-axis direction, which is perpendicular or substantially perpendicular to the insulating layer 30, the exterior surface of each of the second base section 71 and the second narrow section 72 is preferably, for example, a rectangle or substantially a rectangle including bending corners. The width of the exterior surface of the second narrow section 72 is smaller than that of the second base section 71. The second base section 71 and the second narrow section 72 are disposed substantially coaxially. The second base section 71 is not restricted to the above-described shape and may be provided in a circular or polygonal shape, for example. The second narrow section 72 is not restricted to the above-described shape and may have any shape as long as the area of the exterior surface as viewed from the Z-axis direction, which is perpendicular to the insulating layer 30, is smaller than that of the second base section 71.

The second narrow section 72 in the second conductor 70 defines a gap partially between the second base section 71 and the insulating layer 30. In the present preferred embodiment, the gap is provided between the second base section 71 and the insulating layer 30 all around the outer peripheral portion of the second conductor 70.

The two second magnetic members 50 are preferably located on the two second conductors 70 in a one-on-one relationship. The second magnetic members 50 cover the associated second conductors 70, as viewed from the Z-axis direction, which is perpendicular or substantially perpendicular to the insulating layer 30.

With a view to decreasing the distance between each second magnetic member 50 and the circuit substrate 100, the thickness of the second conductor 70 in the Z-axis direction, that is, the total thickness of the second base section 71 and the second narrow section 72 in the Z-axis direction, is preferably about 2.0 µm or smaller, for example. As the distance between the second magnetic member 50 and the circuit substrate 300 is smaller, the magnetic shielding function of the second magnetic member 50 can be provided more effectively.

To form the second narrow section 72, patterning with a resist or etching with a sacrificial layer, for example, may preferably be utilized.

In the present preferred embodiment, the second conductor 70 is positioned on the insulating layer 30 and is preferably defined by a layer including, for example, titanium (Ti) and a layer including gold (Au) in this order from the bottom. The layer including titanium (Ti) is a contact layer. If the second magnetic member 50 is formed with electrolytic plating, the layer including gold (Au) defines and functions as an electrode reaction layer, that is, a seed layer. The second conductor 70 is not limited to the above-described configuration, and may include a layer made of, for example, at least one of iron (Fe), molybdenum (Mo), tantalum (Ta), platinum (Pt), and copper (Cu), which are materials serving as a plating seed layer. If the second magnetic member 50 is formed by a method other than plating, such as by vapor-deposition, for example, the second conductor 70 may be defined by a conductor containing at least one of a metal or a resin.

As shown in FIG. 22, four magnetoresistance elements electrically connected with each other by wiring to define a Wheatstone bridge circuit are preferably provided on the circuit substrate 300 of the magnetic sensor 3 according to the sixth preferred embodiment of the present invention. The four magnetoresistance elements are defined by two pairs of first magnetoresistance elements and second magnetoresistance elements. More specifically, the magnetic sensor 3 includes first and second magnetoresistance elements 320a and 330a and first and second magnetoresistance elements 320b and 330b. The first and second magnetoresistance elements 320a and 330a define one pair. The first and second magnetoresistance elements 320b and 330b define the other pair.

Figure 23:
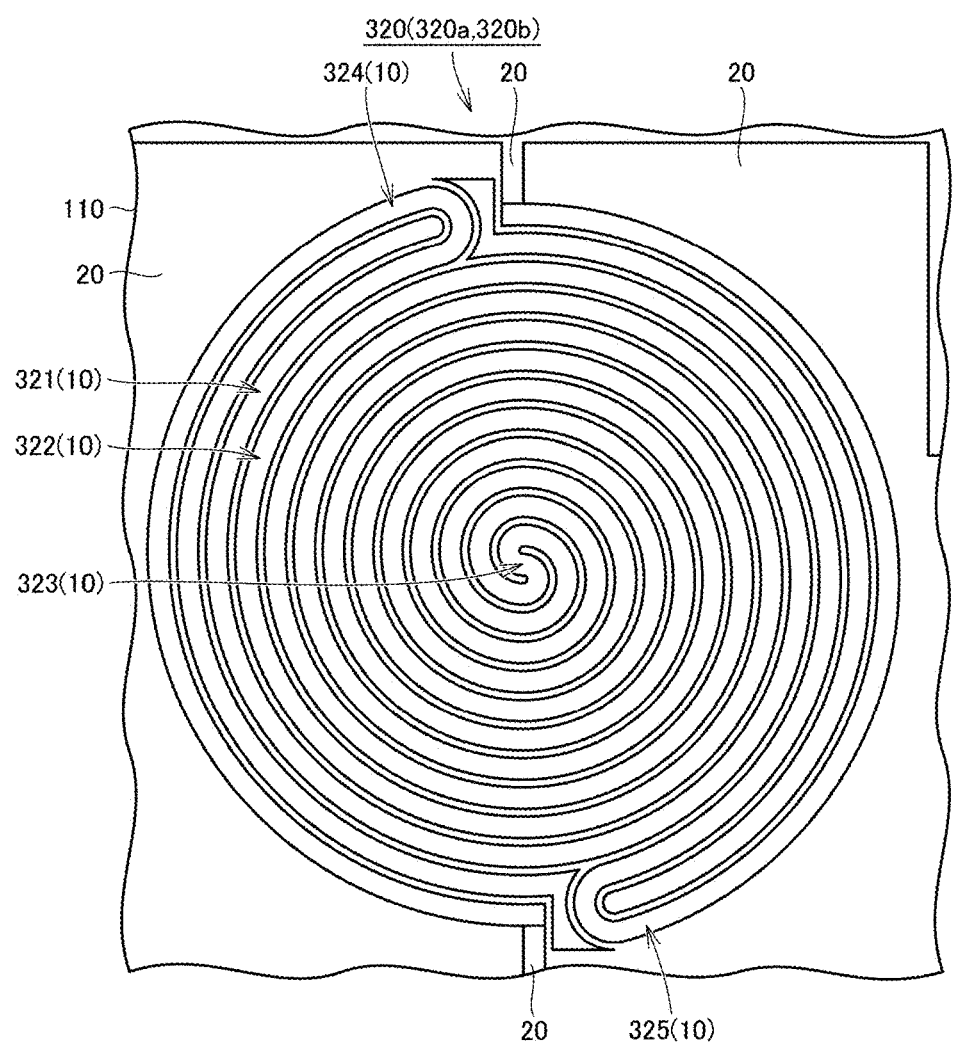
FIG. 23 is a plan view illustrating a pattern of a first magnetoresistance element of the magnetic sensor according to the sixth preferred embodiment of the present invention.

FIG. 23 is a plan view illustrating a pattern of each of the first magnetoresistance elements of the magnetic sensor according to the sixth preferred embodiment of the present invention. As shown in FIGS. 22 and 23, each of the first magnetoresistance elements 320a and 320b preferably has a double-spiral pattern 320, as viewed from the direction perpendicular or substantially perpendicular to the insulating layer 30. The double-spiral pattern 320 includes two first patterns. The two first patterns are concentrically provided along the circumference of an imaginary circle so as to be arranged side by side in the radial direction of the imaginary circle and are connected with each other, as viewed from the direction perpendicular or substantially perpendicular to the insulating layer 30.

The double-spiral pattern 320 preferably includes spiral patterns 321 and 322 and an S-shaped pattern 323. The spiral pattern 321 is one of the two first patterns, while the spiral pattern 322 is the other one of the two first patterns. The S-shaped pattern 323 connects the spiral patterns 321 and 322 at the central portion of the double-spiral pattern 320. The S-shaped pattern 323 does not have any linearly extending portions and are defined only by curved portions.

The double-spiral pattern 320 preferably includes a length-adjusting surplus section 324 at one end of the spiral pattern 321 and a length-adjusting surplus section 325 at one end of the spiral pattern 322. The length-adjusting surplus sections 324 and 325 are used to adjust the length of the double-spiral pattern 320. The end of the spiral pattern 321 is curved and bends back at its end to define the length-adjusting surplus section 324. The end of the spiral pattern 322 is curved and bends back at its end to define the length-adjusting surplus section 325. The length-adjusting surplus section 324 provided at the spiral pattern 321 and the length-adjusting surplus section 325 provided at the spiral pattern 322 are located at the opposite sides in the radial direction of the double-spiral pattern 320. Each of the length-adjusting surplus sections 324 and 325 does not have any linearly extending portions and is defined only by curved portions.

The double-spiral pattern 320 is connected at its length-adjusting surplus sections 324 and 325 to the conductive layer 20 defining the wiring. The connecting positions between the length-adjusting surplus sections 324 and 325 and the conductive layer 20 can be changed to adjust the electrical resistance of the first magnetoresistance elements 320a and 320b.

More specifically, at the connecting portion between the region R defining and functioning as the magnetoresistance elements and the region L defining and functioning as the wiring shown in FIG. 6, the conductive layer 20 extends toward the region R to increase the region L. This can reduce the electrical resistance of the first magnetoresistance elements 320a and 320b. Conversely, at the connecting portion between the region R defining and functioning as the magnetoresistance elements and the region L defining and functioning as the wiring, the conductive layer 20 retreats toward the region L to decrease the region L. This can increase the electrical resistance of the first magnetoresistance elements 320a and 320b.

The above-described adjustment of the electrical resistance of the first magnetoresistance elements 320a and 320b is performed by partially removing or adding the conductive layer 20, and is thus preferably done before the insulating layer 30 is formed.

As shown in FIG. 23, the double-spiral pattern 320 preferably has a substantially point-symmetrical configuration with respect to the center of the double-spiral pattern 320. That is, the double-spiral pattern 320 preferably has a rotationally symmetrical configuration with respect to the center of the double-spiral pattern 320 by about 180°, for example.

As shown in FIG. 22, the orientation of the circumferential direction of the double-spiral pattern 320 of the first magnetoresistance element 320a and that of the first magnetoresistance element 320b are preferably different from each other so that the orientation of the S-shaped pattern 323 of the first magnetoresistance element 320a and that of the first magnetoresistance element 320b become different.

In the present preferred embodiment, the orientation of the circumferential direction of the double-spiral pattern 320 of the first magnetoresistance element 320a and that of the first magnetoresistance element 320b are different from each other by 90° or about 90°, for example, so that the orientation of the S-shaped pattern 323 of the first magnetoresistance element 320a and that of the first magnetoresistance element 320b become different from each other by 90° or about 90°.

The double-spiral pattern 320 may be wound in the opposite direction, in which case, the central portion of the double-spiral pattern 320 is a reversed-S-shaped pattern defined only by curved portions. That is, one spiral pattern 321 and the other spiral pattern 322 are connected with each other by the reversed-S-shaped pattern.

Figure 24:
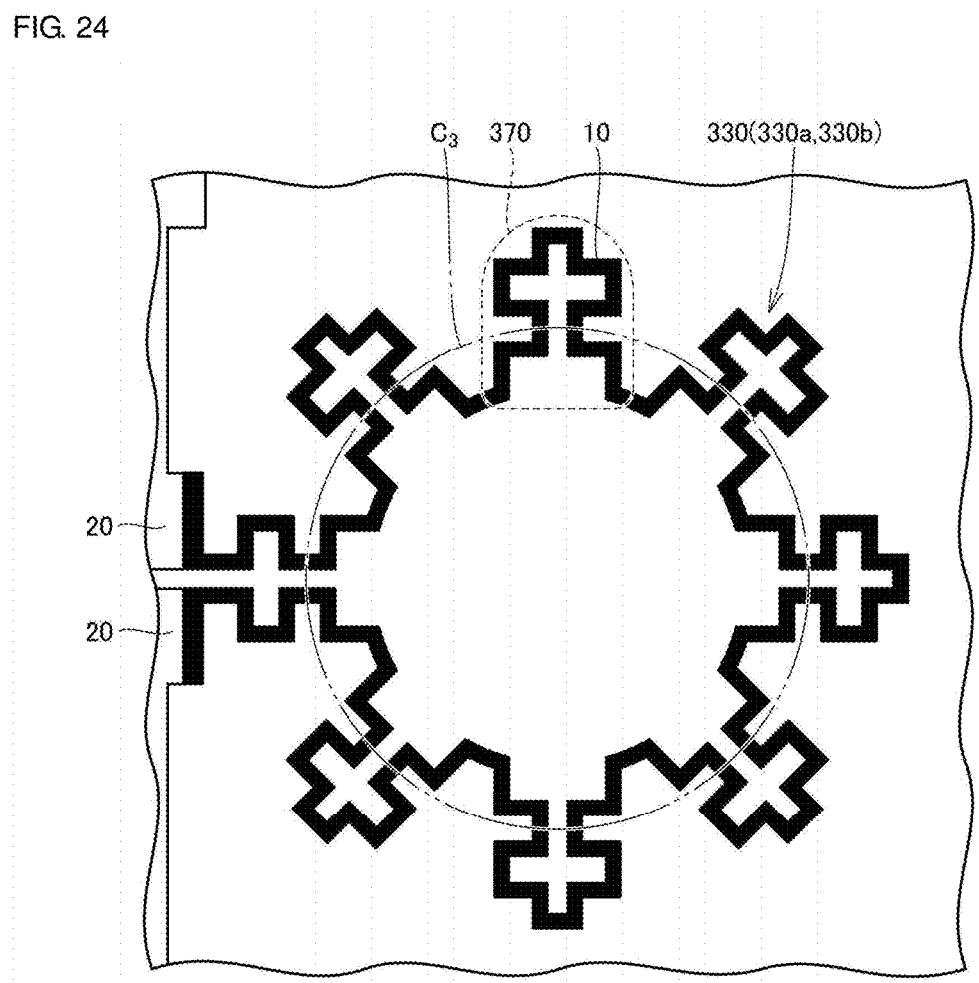
FIG. 24 is a plan view illustrating a pattern of a second magnetoresistance element of the magnetic sensor according to the sixth preferred embodiment of the present invention.
Figure 25:
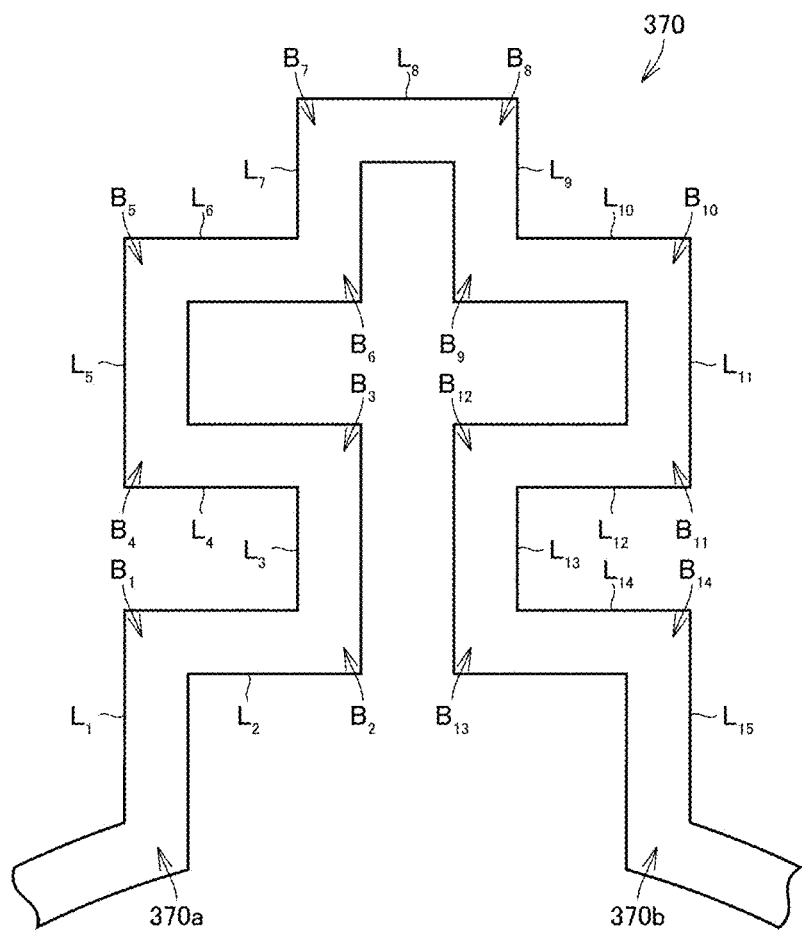
FIG. 25 is a plan view illustrating a second pattern included in the pattern of the second magnetoresistance element of the magnetic sensor according to the sixth preferred embodiment of the present invention.

FIG. 24 is a plan view illustrating a pattern of each second magnetoresistance element of the magnetic sensor according to the sixth preferred embodiment of the present invention. FIG. 25 is a plan view illustrating a second pattern included in the pattern of each second magnetoresistance element of the magnetic sensor according to the sixth preferred embodiment of the present invention. In FIG. 24, among three patterns 330 having the same shape included in each of the second magnetoresistance elements 330a and 330b, only one pattern 330 is shown.

As shown in FIGS. 22 and 24, the second magnetoresistance elements 330a and 330b are located farther outward than the outer peripheral edges of the first magnetoresistance elements 320a and 320b, as viewed from the direction perpendicular or substantially perpendicular to the insulating layer 30.

In each of the second magnetoresistance elements 330a and 330b, the three patterns 330 having the same shape and each including eight second patterns 370 are connected in series with each other. Each second pattern 370 includes bending portions. In the second magnetoresistance element 330a, the three patterns 330 having the same or substantially the same shape are connected with each other by wiring 147. In the second magnetoresistance element 330b, the three patterns 330 having the same or substantially the same shape are connected with each other by wiring 151. The patterns 330 are preferably thinner than the double-spiral patterns 320. This can secure the required electrical resistance in the second magnetoresistance elements 330a and 330b. As the electrical resistance of the second magnetoresistance elements 330a and 330b is higher, the current consumed in the magnetic sensor 3 can be reduced by a greater amount.

As shown in FIG. 24, the eight second patterns 370 are on an imaginary circle $C_3$ and are connected with each other. As shown in FIG. 25, each second pattern 370 preferably includes, for example, fourteen bending portions $B_1$ through $B_{10}$ and fifteen linearly extending portions $L_1$ through $L_{15}$ in a region from a starting portion 370a to a terminating portion 370b so that it bends back at the corners. The second pattern 370 has a bag shape using the starting portion 370a and the terminating portion 370b to define the mouth portion of the bag.

In the present preferred embodiment, the second pattern 370 bends at a right angle at each of the fourteen bending portions $B_1$ through $B_{14}$. The second pattern 370 does not include any linearly extending portions having a length of about 10 μm or longer, for example. That is, each of the fifteen linearly extending portions $L_1$ through $L_{15}$ preferably has a length shorter than about 10 μm, for example.

However, the second magnetoresistance elements 330a and 330b are not limited to the above-described pattern and may be provided in any pattern if they each include at least one second pattern defined by plural bending portions without having any linearly extending portion of a length of about 10 μm or longer, for example.

With the above-described pattern, the magnetoresistance effect of the second magnetoresistance elements 330a and 330b is reduced to significantly decrease their resistance change rate. As a result, the resistance change rate of the second magnetoresistance elements 330a and 330b becomes smaller than that of the first magnetoresistance elements 320a and 320b.

In the magnetic sensor 3 according to the present preferred embodiment, each of the first magnetoresistance elements 320a and 320b has the double-spiral pattern 320. The double-spiral pattern 320 is preferably formed principally by winding substantially circular-arc curved portions. The shape of a circular arc approximates to a shape having an infinite number of corners of a polygon. Thus, the direction of a current flowing through the double-spiral pattern 320 covers substantially 360° in the horizontal direction. The first magnetoresistance elements 320a and 320b are thus able to detect an external magnetic field at substantially 360° in the horizontal direction.

In the magnetic sensor 3 according to the present preferred embodiment, the center of the double-spiral pattern 320 is the S-shaped pattern 323 defined only by curved portions, and the peripheral portions are the length-adjusting surplus sections 324 and 325 defined by curved portions. In this manner, the first magnetoresistance elements 320a and 320b do not have any linearly extending portions, thus reducing the anisotropic characteristics in detecting a magnetic field.

In the magnetic sensor 3 according to the present preferred embodiment, the orientation of the circumferential direction of the double-spiral pattern 320 of the first magnetoresistance element 320a and that of the first magnetoresistance element 320b are different from each other so that the orientation of the S-shaped pattern 323 of the first magnetoresistance element 320a and that of the first magnetoresistance element 320b become different, thus improving the isotropic characteristics in detecting a magnetic field.

In the magnetic sensor 3 according to the present preferred embodiment, each of the second magnetoresistance elements 330a and 330b preferably includes the following second patterns 370. The second pattern 370 bends at a right angle at each of the fourteen bending portions $B_1$ through $B_{14}$ without having any linearly extending portion having a length of about 10 μm or longer so as to define a bag shape using the starting portion 370a and the terminating portion 370b to form the mouth portion of the bag.

This configuration can distribute the orientation of the current flowing through the second pattern 370 in the horizontal direction, thus reducing the anisotropic characteristics of the magnetoresistance effect of each of the second magnetoresistance elements 330a and 330b. It is thus possible to reduce output variations of the magnetic sensor 3 when the external magnetic field is 0, which would be caused by the influence of residual magnetization.

Additionally, the plural second patterns 370 are on the imaginary circle $C_3$ so as to distribute the orientation of the current flowing through the pattern 330 in the horizontal direction, thus reducing the anisotropic characteristics of the magnetoresistance effect of each of the second magnetoresistance elements 330a and 330b.

In the magnetic sensor 3 according to the present preferred embodiment, too, it is not necessary to three-dimensionally lay the wiring to connect the first magnetoresistance elements 320a and 320b and the second magnetoresistance elements 330a and 330b. Thus, the circuit substrate 300 can be manufactured with a simple manufacturing process.

The pattern 330 is preferably thinner than the double-spiral pattern 320. This can reduce the magnetoresistance effect of the second magnetoresistance elements 330a and 330b so as to significantly decrease their resistance change rate.

This can increase the potential difference generated between the nodes 140 and 141 when an external magnetic field is applied to the magnetic sensor 3, thus improving the detection sensitivity of the magnetic sensor 3. Additionally, since the electrical resistance of the second magnetoresistance elements 330a and 330b is high, there is only a relatively small decrease in the potential difference generated between the nodes 140 and 141 when an external magnetic field having a high magnetic field strength is applied to the magnetic sensor 3, thereby stabilizing the output characteristics of the magnetic sensor 3.

In the magnetic sensor 3 according to the present preferred embodiment, the two first magnetic members 40 and the two second magnetic members 50 are on the insulating layer 30. The thickness of each of the first magnetic members 40 and the second magnetic members 50 is preferably about 10 μm or greater, for example, and more preferably, about 20 μm to about 150 μm, for example. The thicknesses of the first and second magnetic members 40 and 50 may be different from each other. However, if the two first magnetic members 40 and the two second magnetic members 50 have the same or substantially the same thickness, they can be formed in the same step, thus facilitating the formation of the two first magnetic members 40 and the two second magnetic members 50.

As shown in FIG. 22, as viewed from the direction perpendicular or substantially perpendicular to the insulating layer 30, the first magnetic members 40 preferably have an externally circular or substantially circular shape and are located in the regions farther inward than the outer peripheral edges of the first magnetoresistance elements 320a and 320b. In the present preferred embodiment, the first magnetic members 40 are located concentrically with the outer peripheral edges of the first magnetoresistance elements 320a and 320b, as viewed from the direction perpendicular or substantially perpendicular to the insulating layer 30.

In the present preferred embodiment, as viewed from the direction perpendicular or substantially perpendicular to the insulating layer 30, the first magnetic members 40 cover only the central portions of the first magnetoresistance elements 320a and 320b among the first magnetoresistance elements 320a and 320b and the second magnetoresistance elements 330a and 330b. The first magnetic members 40 are thus surrounded by the outer peripheral portions of the first magnetoresistance elements 320a and 320b, as viewed from the direction perpendicular or substantially perpendicular to the insulating layer 30.

As viewed from the direction perpendicular or substantially perpendicular to the insulating layer 30, the second magnetic members 50 do not cover the first magnetoresistance elements 320a and 320b, but cover the second magnetoresistance elements 330a and 330b. It is preferable that, as viewed from the direction perpendicular or substantially perpendicular to the insulating layer 30, each of the second magnetoresistance elements 330a and 330b be positioned in the area from the center of the second magnetic member 50 to the position separated inward from the outer peripheral edge of the second magnetic member 50 by about 7 μm, for example. The second magnetic members 50 are made of a magnetic material having a high permeability and a high saturation magnetic flux density, such as, for example, electromagnetic steel, mild steel, silicon steel, permalloy, supermalloy, a nickel alloy, an iron alloy, or ferrite. These magnetic materials preferably have low magnetic coercivity.

The magnetic sensor 3 of the sixth preferred embodiment of the present invention can improve the detection sensitivity of the first magnetoresistance elements 320a and 320b for a vertical magnetic field by using the first magnetic members 40 while reducing a change in the resistance of the second magnetoresistance elements 330a and 330b in response to a vertical magnetic field.

The magnetic sensor 3 of the sixth preferred embodiment of the present invention can also improve the detection sensitivity of the first magnetoresistance elements 320a and 320b for a horizontal magnetic field by using the first magnetic members 40 while reducing a change in the resistance of the second magnetoresistance elements 330a and 330b in response to a horizontal magnetic field by using the second magnetic members 50.

The reason why the detection sensitivity of the first magnetoresistance elements 320a and 320b for a horizontal magnetic field can be improved by the first magnetic members 40 is as follows. The strength of a horizontal magnetic field applied to the central portion of each of the first magnetoresistance elements 320a and 320b is low because the central portion thereof is covered by the first magnetic member 40. Yet, a horizontal-direction magnetic field output from the first magnetic member 40 at a high magnetic field strength is applied to the outer peripheral portion of each of the first magnetoresistance elements 320a and 320b, which has a longer circumference and has a higher resistance ratio to that of the entire pattern than the central portion. As a whole, the strength of the horizontal magnetic field applied from the first magnetic members 40 to the first magnetoresistance elements 320a and 320b becomes high.

The magnetic sensor 3 according to the present preferred embodiment is also able to detect a vertical magnetic field and a horizontal magnetic field with high sensitivity. In the magnetic sensor 3 according to the sixth preferred embodiment of the present invention, each of the first magnetoresistance elements 320a and 320b includes concentrically disposed multiple first patterns, thus improving the isotropic characteristics in detecting a horizontal magnetic field.

In the present preferred embodiment, the second magnetoresistance elements 330a and 330b are magnetically shielded by the second magnetic members 50 and barely detect, or do not detect, vertical magnetic fields and horizontal magnetic fields. For this reason, the resistance change rate of the second magnetoresistance elements 330a and 330*b* may not necessarily be smaller than that of the first magnetoresistance elements 320*a* and 320*b*.

In the magnetic sensor 3 according to the sixth preferred embodiment of the present invention, the second conductors 70 are provided between the second magnetic members 50 and the circuit substrate 300. Each second conductor 70 includes the second base section 71 and the second narrow section 72, and the second narrow section 72 of the second conductor 70 contacts the circuit substrate 300.

This configuration can reduce the contact area between the second conductor 70 and the circuit substrate 300, thereby decreasing a stress applied from the second magnetic member 50 to each of the second magnetoresistance elements 330*a* and 330*b* via the second conductor 70. A decrease in the output accuracy of the magnetic sensor 3 can accordingly be regulated. It is also less likely that the insulating layer 30 cracks due to a stress applied from the second magnetic member 50 to the insulating layer 30 via the second conductor 70. This can maintain the reliability of the magnetic sensor 3.

In the present preferred embodiment, a gap is provided between the second base section 71 and the insulating layer 30 all around the outer peripheral portion of the second conductor 70. This can effectively reduce the application of a stress caused by a distortion produced at the outer peripheral portion of the second magnetic member 50 to the circuit substrate 300 via the second conductor 70.

The magnetic sensor 3 according to the sixth preferred embodiment of the present invention also achieves high isotropic characteristics in detecting a horizontal magnetic field and is also able to detect a weak vertical magnetic field by using magnetoresistance elements. The magnetic sensor 3 can also regulate a decrease in the output accuracy, which would be caused by a stress applied to the magnetoresistance elements from a structure disposed above the magnetoresistance elements.

The configuration of the first conductor 60*a* according to the second preferred embodiment may be applied to the second conductor 70. In this case, the second narrow section of the second conductor is located at the end portion of the second conductor closer to the second magnetic member 50 in the direction perpendicular or substantially perpendicular to the insulating layer 30.

Alternatively, the configuration of the first conductor 60*b* according to the third preferred embodiment may be applied to the second conductor 70. In this case, the second base section of the second conductor is located at the end portion of the second conductor closer to the insulating layer 30 and that closer to the second magnetic member 50 in the direction perpendicular or substantially perpendicular to the insulating layer 30. The second narrow section of the second conductor is sandwiched between the second base sections of the second conductor in the direction perpendicular or substantially perpendicular to the insulating layer 30.

Alternatively, the configuration of the first magnetic member 40*a* according to the fourth preferred embodiment may be applied to the second magnetic member 50. In this case, the magnetic sensor 3 does not include the second conductor 70. The second magnetic member includes a second base section and a second narrow section. The area of the exterior surface of the second narrow section is smaller than that of the second base section, as viewed from the direction perpendicular or substantially perpendicular to the insulating layer 30. In the second magnetic member, the second base section and the second narrow section are arranged side by side in the direction perpendicular or substantially perpendicular to the insulating layer 30. The second narrow section of the second magnetic member is positioned at the end portion of the second magnetic member closer to the insulating layer 30 in the direction perpendicular or substantially perpendicular to the insulating layer 30.

Seventh Preferred Embodiment

A magnetic sensor according to a seventh preferred embodiment of the present invention will be described below with reference to the drawings. The magnetic sensor according to the seventh preferred embodiment of the present invention is different from the magnetic sensor 3 of the sixth preferred embodiment of the present invention mainly in the patterns of first and second magnetoresistance elements. An explanation of elements configured similarly to those of the magnetic sensor 3 of the sixth preferred embodiment of the present invention will not be repeated.

Figure 26:
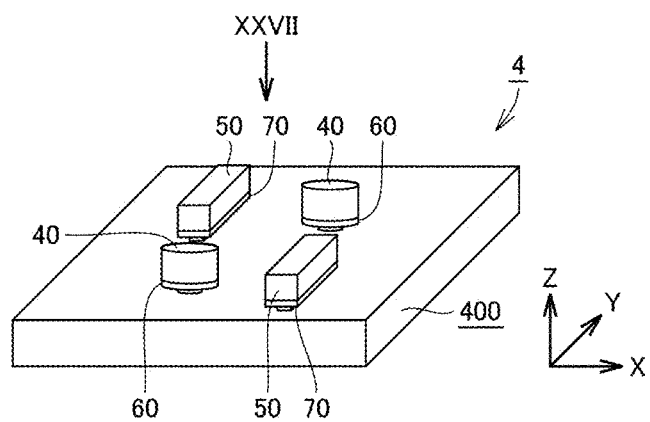
FIG. 26 is a perspective view illustrating the configuration of a magnetic sensor according to a seventh preferred embodiment of the present invention.
Figure 27:
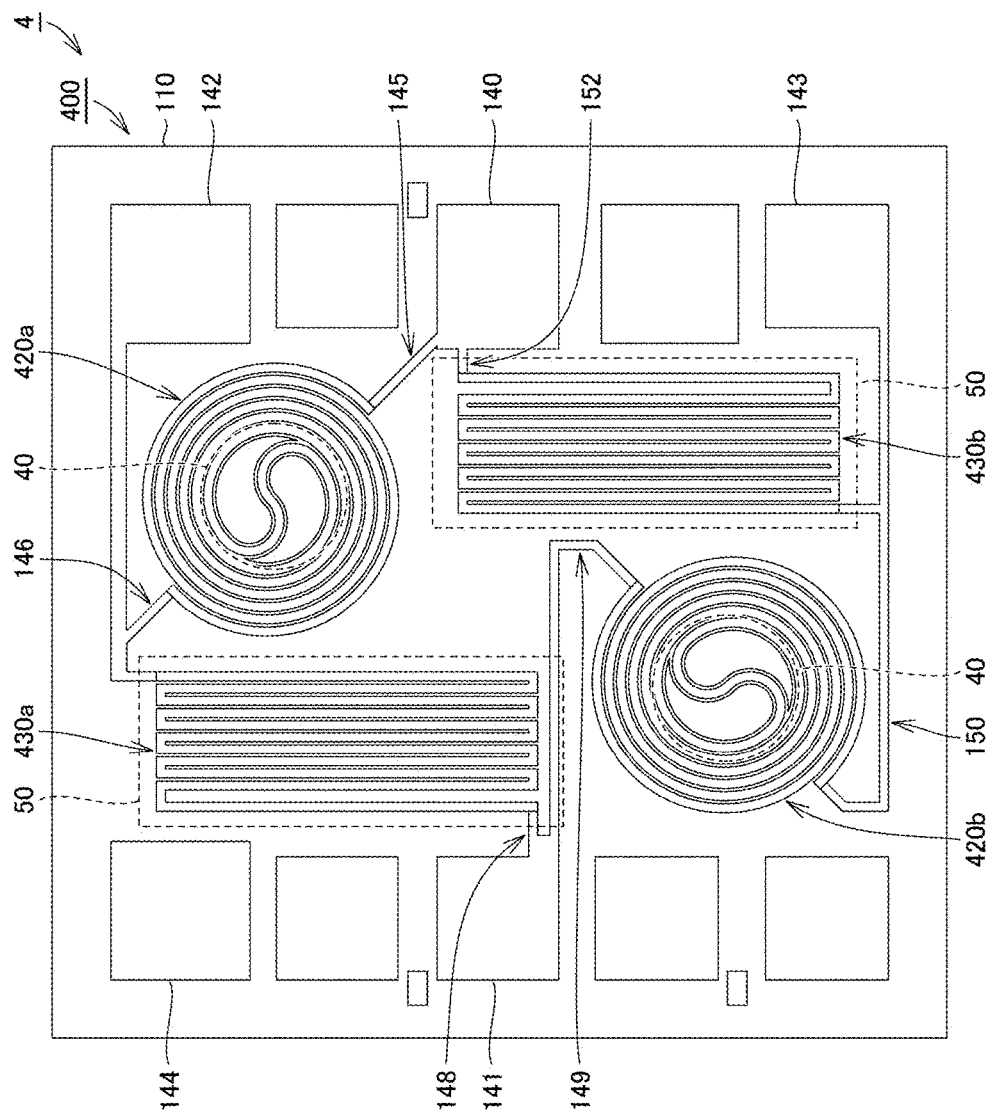
FIG. 27 is a plan view of the magnetic sensor in FIG. 26, as viewed from the direction indicated by the arrow XXVII in FIG. 26.

FIG. 26 is a perspective view illustrating the configuration of the magnetic sensor according to the seventh preferred embodiment of the present invention. FIG. 27 is a plan view of the magnetic sensor in FIG. 26, as viewed from the direction indicated by the arrow XXVII in FIG. 26. As shown in FIGS. 26 and 27, a magnetic sensor 4 according to the seventh preferred embodiment of the present invention includes a circuit substrate 400 and two first magnetic members 40 and two second magnetic members 50 disposed above the circuit substrate 400. In the magnetic sensor 4 according to the seventh preferred embodiment of the present invention, on the circuit substrate 400, two first conductors 60 and two second conductors 70 are provided. An insulating layer 30 is provided on the front layer of the circuit substrate 400, and the two first conductors 60 and the two second conductors 70 are located on the insulating layer 30. The first magnetic members 40 cover the associated first conductors 60, as viewed from the direction perpendicular or substantially perpendicular to the insulating layer 30. The second magnetic members 50 cover the associated second conductors 70, as viewed from the direction perpendicular or substantially perpendicular to the insulating layer 30.

Four magnetoresistance elements electrically connected with each other by wiring to define a Wheatstone bridge circuit are on the circuit substrate 400 of the magnetic sensor 4 according to the seventh preferred embodiment of the present invention. The four magnetoresistance elements are defined by two pairs of first magnetoresistance elements and second magnetoresistance elements.

More specifically, the magnetic sensor 4 includes first and second magnetoresistance elements 420*a* and 430*a* and first and second magnetoresistance elements 420*b* and 430*b*.

Each of the first magnetoresistance elements 420*a* and 420*b* preferably includes a double-spiral pattern, as viewed from the direction perpendicular or substantially perpendicular to the insulating layer 30. The double-spiral pattern preferably includes two first patterns. The two first patterns are concentrically disposed along the circumference of an imaginary circle so as to be arranged side by side in the radial direction of the imaginary circle and are connected with each other, as viewed from the direction perpendicular or substantially perpendicular to the insulating layer 30.

The double-spiral pattern includes two spiral patterns, which are the two first patterns, and an S-shaped pattern. The S-shaped pattern connects the two spiral patterns at the central portion of the double-spiral pattern. The S-shaped pattern does not have any linearly extending portions and are defined only by curved portions.

The orientation of the circumferential direction of the double-spiral pattern of the first magnetoresistance element 420a and that of the first magnetoresistance element 420b are preferably different from each other so that the orientation of the S-shaped pattern of the first magnetoresistance element 420a and that of the first magnetoresistance element 420b become different.

In the present preferred embodiment, the orientation of the circumferential direction of the double-spiral pattern of the first magnetoresistance element 420a and that of the first magnetoresistance element 420b are different from each other by 90° so that the orientation of the S-shaped pattern of the first magnetoresistance element 420a and that of the first magnetoresistance element 420b become different from each other by 90° or about 90°, for example.

The double-spiral pattern may be wound in the opposite direction, in which case, the central portion of the double-spiral pattern is a reversed-S-shaped pattern defined only by curved portions. That is, one spiral pattern and the other spiral pattern are connected with each other by the reversed-S-shaped pattern.

As shown in FIG. 27, the second magnetoresistance elements 430a and 430b are located farther outward than the outer peripheral edges of the first magnetoresistance elements 420a and 420b, respectively, as viewed from the direction perpendicular or substantially perpendicular to the insulating layer 30. The second magnetoresistance elements 430a and 430b each have a meandering or serpentine pattern, as viewed from the direction perpendicular or substantially perpendicular to the insulating layer 30. The meandering or serpentine patterns of the second magnetoresistance elements 430a and 430b preferably have the same or substantially the same thickness as the double-spiral patterns of the first magnetoresistance elements 420a and 420b. However, these meandering or serpentine patterns may be thinner than the double-spiral patterns of the first magnetoresistance elements 420a and 420b.

As shown in FIG. 27, as viewed from the direction perpendicular or substantially perpendicular to the insulating layer 30, the first magnetic members 40 preferably have an externally circular or substantially circular shape, for example, and are located in the regions farther inward than the outer peripheral edges of the first magnetoresistance elements 420a and 420b. In the present preferred embodiment, the first magnetic members 40 are located concentrically with the outer peripheral edges of the first magnetoresistance elements 420a and 420b, as viewed from the direction perpendicular or substantially perpendicular to the insulating layer 30.

In the present preferred embodiment, as viewed from the direction perpendicular or substantially perpendicular to the insulating layer 30, the first magnetic members 40 cover only the central portions of the first magnetoresistance elements 420a and 420b among the first magnetoresistance elements 420a and 420b and the second magnetoresistance elements 430a and 430b. The first magnetic members 40 are thus surrounded by the outer peripheral portions of the first magnetoresistance elements 420a and 420b, as viewed from the direction perpendicular or substantially perpendicular to the insulating layer 30.

As viewed from the direction perpendicular or substantially perpendicular to the insulating layer 30, the second magnetic members 50 do not cover the first magnetoresistance elements 420a and 420b, but cover the second magnetoresistance elements 430a and 430b.

The magnetic sensor 4 of the seventh preferred embodiment of the present invention can improve the detection sensitivity of the first magnetoresistance elements 420a and 420b for a vertical magnetic field by using the first magnetic members 40 while reducing a change in the resistance of the second magnetoresistance elements 430a and 430b in response to a vertical magnetic field.

The magnetic sensor 4 of the seventh preferred embodiment of the present invention can also improve the detection sensitivity of the first magnetoresistance elements 420a and 420b for a horizontal magnetic field by using the first magnetic members 40 while reducing a change in the resistance of the second magnetoresistance elements 430a and 430b in response to a horizontal magnetic field by using the second magnetic members 50.

The magnetic sensor 4 according to the present preferred embodiment is also able to detect a vertical magnetic field and a horizontal magnetic field with high sensitivity. In the magnetic sensor 4 according to the seventh preferred embodiment of the present invention, each of the first magnetoresistance elements 420a and 420b includes concentrically disposed multiple first patterns, thus improving the isotropic characteristics in detecting a horizontal magnetic field.

In the present preferred embodiment, the second magnetoresistance elements 430a and 430b are magnetically shielded by the second magnetic members 50 and barely detect, or do not detect, vertical magnetic fields and horizontal magnetic fields. For this reason, the resistance change rate of the second magnetoresistance elements 430a and 430b may not necessarily be smaller than that of the first magnetoresistance elements 420a and 420b.

The magnetic sensor 4 according to the seventh preferred embodiment of the present invention also achieves high isotropic characteristics in detecting a horizontal magnetic field and is also able to detect a weak vertical magnetic field by using magnetoresistance elements. The magnetic sensor 4 can also regulate a decrease in the output accuracy, which would be caused by a stress applied to the magnetoresistance elements from a structure disposed above the magnetoresistance elements.

Eighth Preferred Embodiment

A magnetic sensor according to an eighth preferred embodiment of the present invention will be described below with reference to the drawings. The magnetic sensor according to the eighth preferred embodiment of the present invention is different from the magnetic sensor 1 of the first preferred embodiment of the present invention mainly in the patterns of the first and second magnetoresistance elements and the configuration of the first magnetic members. An explanation of elements configured similarly to those of the magnetic sensor 1 of the first preferred embodiment of the present invention will not be repeated.

Figure 28:
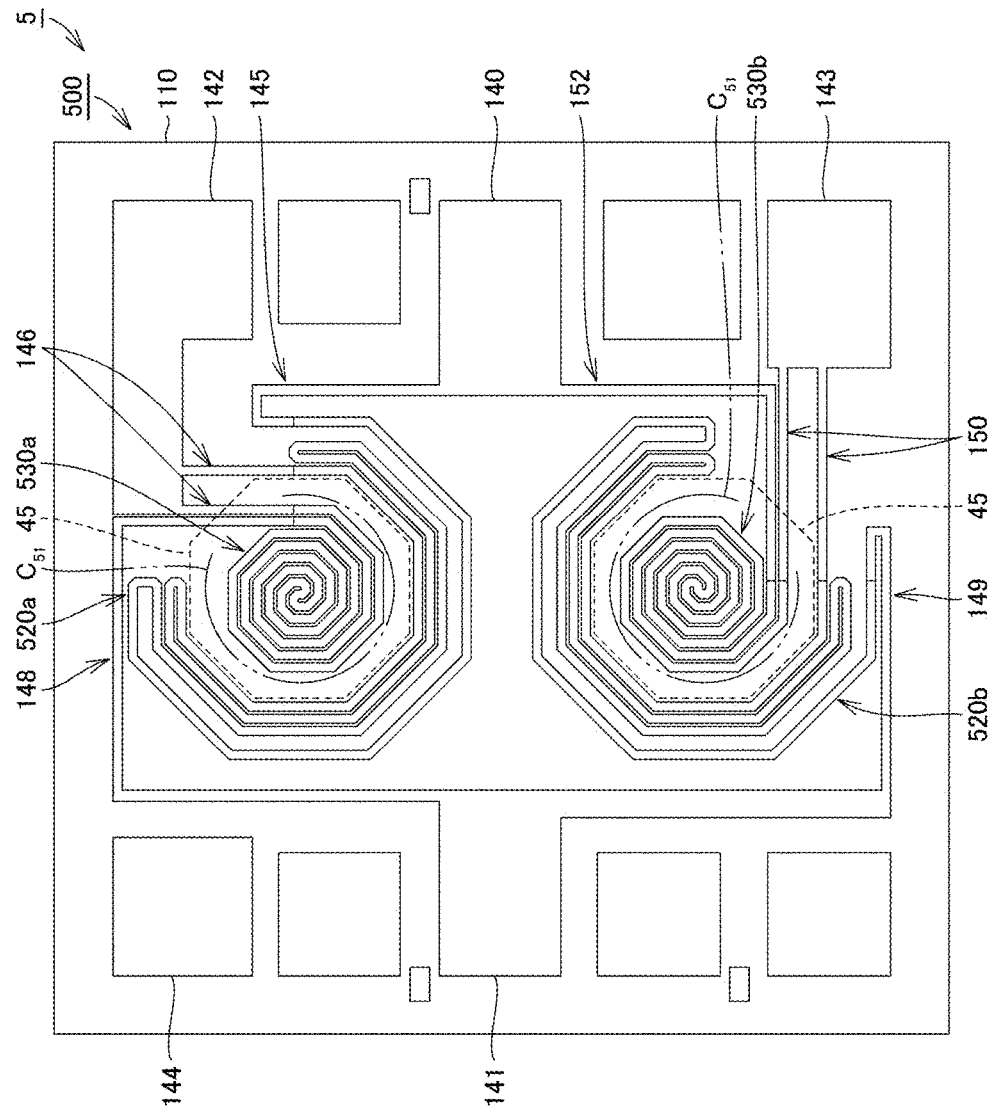
FIG. 28 is a plan view illustrating the configuration of a magnetic sensor according to an eighth preferred embodiment of the present invention.
Figure 29:
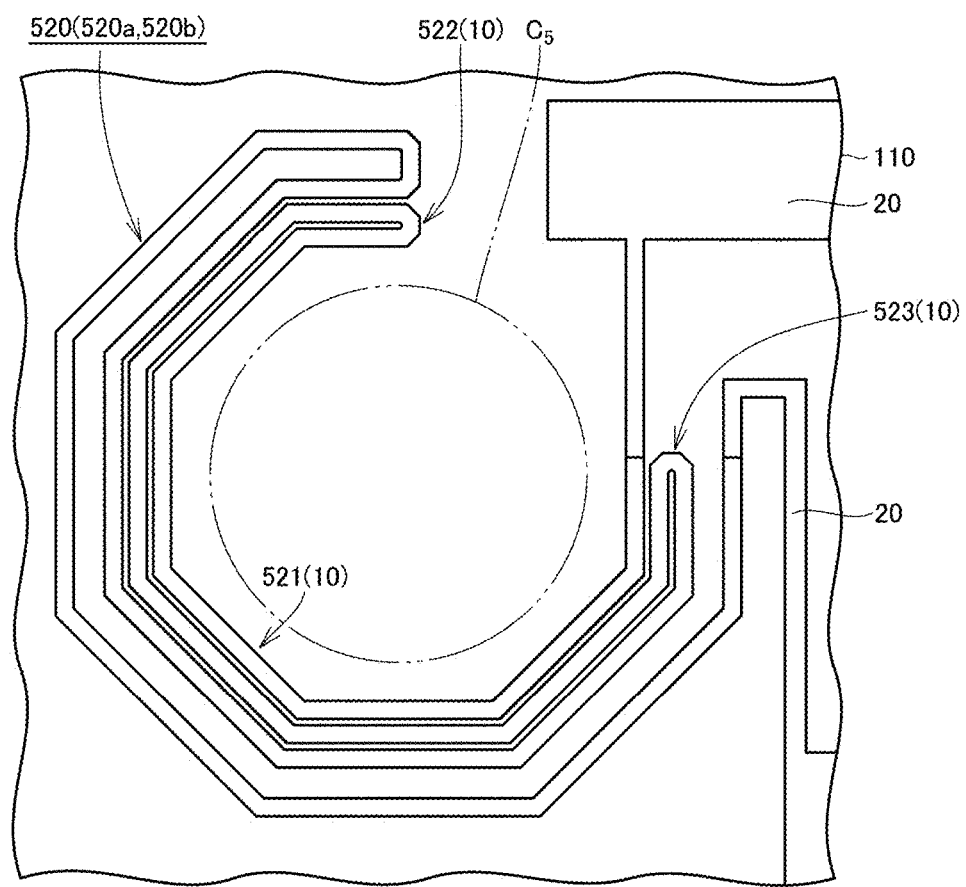
FIG. 29 is a plan view illustrating a pattern of a first magnetoresistance element of the magnetic sensor according to the eighth preferred embodiment of the present invention.
Figure 30:
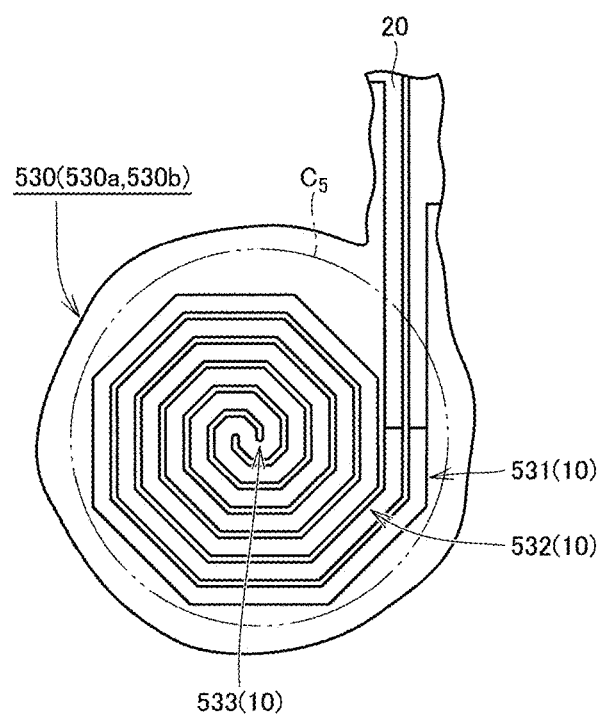
FIG. 30 is a plan view illustrating a pattern of a second magnetoresistance element of the magnetic sensor according to the eighth preferred embodiment of the present invention.

FIG. 28 is a plan view illustrating the configuration of the magnetic sensor according to the eighth preferred embodiment of the present invention. FIG. 29 is a plan view illustrating a pattern of a first magnetoresistance element of the magnetic sensor according to the eighth preferred embodiment of the present invention. FIG. 30 is a plan view illustrating a pattern of a second magnetoresistance element of the magnetic sensor according to the eighth preferred embodiment of the present invention.

As shown in FIG. 28, a magnetic sensor 5 of the eighth preferred embodiment of the present invention includes a circuit substrate 500 and two first magnetic members 45 disposed above the circuit substrate 500. In the magnetic sensor 5 according to the eighth preferred embodiment of the present invention, on the circuit substrate 500, two first conductors are disposed. The first magnetic members 45 cover the associated first conductors, as viewed from the direction perpendicular or substantially perpendicular to the insulating layer 30.

As shown in FIGS. 28 and 29, a pattern of each of first magnetoresistance elements 520a and 520b of the magnetic sensor 5 of the eighth preferred embodiment of the present invention preferably includes four first patterns. The four first patterns are disposed along the circumference of an imaginary circle $C_5$ so as to be arranged side by side in the radial direction of the imaginary circle $C_5$ and are connected with each other, as viewed from the direction perpendicular or substantially perpendicular to the insulating layer 30. The four first patterns are located along an imaginary C-shaped configuration $C_{51}$, which is opened at a portion where wiring 146, 148, 150, and 152 is positioned, on the circumference of the imaginary circle $C_5$. The four first patterns are C-shaped patterns 521 concentrically provided along the imaginary C-shaped configuration $C_{51}$ so as to be arranged side by side in the radial direction of the imaginary circle $C_5$.

The four C-shaped patterns 521 are connected with each other alternately at one end and at the other end starting from inward. The C-shaped patterns 521 connected with each other at one end are connected with each other by a linear pattern 522 extending in the radial direction of the imaginary circle $C_5$. The C-shaped patterns 521 connected with each other at the other end are connected with each other by a linear pattern 523 extending in the radial direction of the imaginary circle $C_5$.

The pattern 520 of each of the first magnetoresistance elements 520a and 520b preferably includes two linear patterns 522 and one linear pattern 523. With this configuration, the four C-shaped patterns 521 are connected in series with each other.

The outer peripheral edge of the C-shaped pattern 521 positioned at the outermost side is the outer peripheral edge of each of the first magnetoresistance elements 520a and 520b. The inner peripheral edge of the C-shaped pattern 521 positioned at the innermost side is the inner peripheral edge of each of the first magnetoresistance elements 520a and 520b.

As shown in FIG. 28, the orientation of the circumferential direction of the first magnetoresistance element 520a and that of the first magnetoresistance element 520b are different from each other so that the orientations of the imaginary C-shaped configurations $C_{51}$ become different. That is, the orientation of the circumferential direction of the pattern 520 of the first magnetoresistance element 520a and that of the first magnetoresistance element 520b are different from each other so that the orientation of the C-shaped patterns 521 of the first magnetoresistance element 520a and that of the first magnetoresistance element 520b become different.

In the present preferred embodiment, the orientation of the circumferential direction of the pattern 520 of the first magnetoresistance element 520a and that of the first magnetoresistance element 520b preferably differ from each other by 90° or about 90°, for example, so that the orientation of the C-shaped patterns 521 of the first magnetoresistance element 520a and that of the first magnetoresistance element 520b become different from each other by 90° or about 90°.

As shown in FIGS. 28 and 30, as viewed from the direction perpendicular or substantially perpendicular to the insulating layer 30, a second magnetoresistance element 530a is positioned at the central side of the imaginary circle $C_5$ and is surrounded by the first magnetoresistance element 520a, while a second magnetoresistance element 530b is positioned at the central side of the imaginary circle $C_5$ and is surrounded by the first magnetoresistance element 520b. That is, as viewed from the direction perpendicular or substantially perpendicular to the insulating layer 30, the second magnetoresistance element 530a is located farther inward than the inner peripheral edge of the first magnetoresistance element 520a, while the second magnetoresistance element 530b is located farther inward than the inner peripheral edge of the first magnetoresistance element 520b.

The second magnetoresistance element 530a is connected to the wiring 146 and 148 disposed from the central side of the imaginary circle $C_5$ to the outer side of the imaginary circle $C_5$. The second magnetoresistance element 530b is connected to the wiring 150 and 152 disposed from the central side of the imaginary circle $C_5$ to the outer side of the imaginary circle $C_5$.

Each of the second magnetoresistance elements 530a and 530b has a double-spiral pattern 530, as viewed from the direction perpendicular or substantially perpendicular to the insulating layer 30. The double-spiral pattern 530 includes spiral patterns 531 and 532 and a reversed-S-shaped pattern 533. The spiral pattern 531 is one of two second patterns, while the spiral pattern 532 is the other one of the two second patterns. The reversed-S-shaped pattern 533 connects the spiral patterns 531 and 532 at the central portion of the double-spiral pattern 530. The reversed-S-shaped pattern 533 is preferably defined by multiple linearly extending portions having a length shorter than about 10 µm, for example.

The double-spiral pattern 530 preferably has the same or substantially the same thickness as the pattern 520. The spiral patterns 531 and 532 accordingly have the same or substantially the same thickness as each of the four C-shaped patterns 521. However, the double-spiral pattern 530 may be thinner than the pattern 520.

As shown in FIG. 30, the double-spiral pattern 530 preferably has a substantially point-symmetrical configuration with respect to the center of the imaginary circle $C_5$. That is, the double-spiral pattern 530 has a rotationally symmetrical configuration with respect to the center of the imaginary circle $C_5$ by about 180°.

As shown in FIG. 28, the orientation of the circumferential direction of the double-spiral pattern 530 of the second magnetoresistance element 530a and that of the second magnetoresistance element 530b are preferably different from each other so that the orientation of the reversed-S-shaped pattern 533 of the second magnetoresistance element 530a and that of the second magnetoresistance element 530b become different.

In the present preferred embodiment, the orientation of the circumferential direction of the double-spiral pattern 530 of the second magnetoresistance element 530a and that of the second magnetoresistance element 530b are preferably different from each other by 90° or about 90°, for example so that the orientation of the reversed-S-shaped pattern 533 of the second magnetoresistance element 530a and that of the second magnetoresistance element 530b become different from each other by 90° or about 90°.

In the magnetic sensor 5 according to the present preferred embodiment, each of the first magnetoresistance elements 520a and 520b preferably includes the C-shaped patterns 521. The C-shaped patterns 521 are each defined by almost seven sides among the eight sides of a substantially regular octagon. In this manner, the first magnetoresistance elements 520a and 520b are defined by most of the sides of a polygon, thus reducing the anisotropic characteristics in detecting a magnetic field.

Additionally, in the magnetic sensor 5 according to the present preferred embodiment, the orientation of the circumferential direction of the pattern 520 of the first magnetoresistance element 520a and that of the first magnetoresistance element 520b are preferably different from each other so that the orientation of the C-shaped patterns 521 of the first magnetoresistance element 520a and that of the first magnetoresistance element 520b become different, thus improving the isotropic characteristics in detecting a magnetic field.

In the magnetic sensor 5 according to the present preferred embodiment, each of the second magnetoresistance elements 530a and 530b has the double-spiral pattern 530. The double-spiral pattern 530 is defined principally by winding the sides forming a substantially regular octagon.

In the magnetic sensor 5 according to the present preferred embodiment, the orientation of the circumferential direction of the double-spiral pattern 530 of the second magnetoresistance element 530a and that of the second magnetoresistance element 530b are different from each other so that the orientation of the reversed-S-shaped pattern 533 of the second magnetoresistance element 530a and that of the second magnetoresistance element 530b become different, thus improving the isotropic characteristics of the magnetoresistance effect.

In the magnetic sensor 5 according to the present preferred embodiment, the second magnetoresistance elements 530a and 530b are preferably inward of the first magnetoresistance elements 520a and 520b, respectively, thereby making it possible to reduce the size of the magnetic sensor 5. Additionally, in the magnetic sensor 5, too, it is not necessary to three-dimensionally lay the wiring to connect the first magnetoresistance elements 520a and 520b and the second magnetoresistance elements 530a and 530b. Hence, the circuit substrate 500 can be manufactured with a simple manufacturing process.

In the magnetic sensor 5 according to the present preferred embodiment, the two first magnetic members 45 are provided above the insulating layer 30. As shown in FIG. 28, as viewed from the direction perpendicular or substantially perpendicular to the insulating layer 30, the first magnetic members 45 each have an externally regular-octagonal shape and are located in the regions farther inward than the outer peripheral edges of the first magnetoresistance elements 520a and 520b. The regions farther inward than the outer peripheral edges of the first magnetoresistance elements 520a and 520b are regions surrounded by the outer peripheral edges of the first magnetoresistance elements 520a and 520b when both ends of the outer peripheral edge of each of the first magnetoresistance elements 520a and 520b are connected with each other by an imaginary line, as viewed from the direction perpendicular or substantially perpendicular to the insulating layer 30. Preferably, at least about one half, and more preferably, at least about ⅔, for example, of the region farther inward than the outer peripheral edge of each of the first magnetoresistance elements 520a and 520b overlaps the corresponding first magnetic member 45, as viewed from the direction perpendicular or substantially perpendicular to the insulating layer 30.

As viewed from the direction perpendicular or substantially perpendicular to the insulating layer 30, the first magnetic members 45 are located in the regions farther inward than the inner peripheral edges of the first magnetoresistance elements 520a and 520b. The first magnetic members 45 may be each located in a region including the inner peripheral edge of the corresponding one of the first magnetoresistance elements 520a and 520b and the area inward of the inner peripheral edge, as viewed from the direction perpendicular or substantially perpendicular to the insulating layer 30. The regions farther inward than the inner peripheral edges of the first magnetoresistance elements 520a and 520b are regions surrounded by the inner peripheral edges of the first magnetoresistance elements 520a and 520b when both ends of the inner peripheral edge of each of the first magnetoresistance elements 520a and 520b are connected with each other by an imaginary line, as viewed from the direction perpendicular or substantially perpendicular to the insulating layer 30. Preferably, at least about one half, and more preferably, at least about ⅔, for example, of the region farther inward than the inner peripheral edge of each of the first magnetoresistance elements 520a and 520b overlaps the corresponding first magnetic member 45, as viewed from the direction perpendicular or substantially perpendicular to the insulating layer 30.

In the present preferred embodiment, the first magnetic members 45 are located concentrically with the outer peripheral edges of the first magnetoresistance elements 520a and 520b, as viewed from the direction perpendicular or substantially perpendicular to the insulating layer 30.

In the present preferred embodiment, the first magnetic members 45 do not cover the first magnetoresistance elements 520a and 520b, but cover the second magnetoresistance elements 530a and 530b, as viewed from the direction perpendicular or substantially perpendicular to the insulating layer 30. As viewed from the direction perpendicular or substantially perpendicular to the insulating layer 30, at least about ½, for example, of the entirety of the outer peripheral portion of each of the first magnetic member 45 is surrounded by the corresponding first magnetoresistance elements 520a and 520b.

The magnetic sensor 5 according to the present preferred embodiment is also able to detect a vertical magnetic field and a horizontal magnetic field with high sensitivity. In the magnetic sensor 5 according to the eighth preferred embodiment of the present invention, each of the first magnetoresistance elements 520a and 520b includes multiple first patterns formed in a polygonal shape, thus improving the isotropic characteristics in detecting a horizontal magnetic field.

Although in the present preferred embodiment the first magnetoresistance elements 520a and 520b, the second magnetoresistance elements 530a and 530b, and the first magnetic members 45 preferably have concentric regular-octagonal shapes, they may be provided in any concentric polygonal shape, for example. With more corners of this polygonal shape, the isotropic characteristics of the first magnetoresistance elements 520a and 520b in detecting a horizontal magnetic field can be improved.

In the present preferred embodiment, the second magnetoresistance elements 530a and 530b are magnetically shielded by the first magnetic members 45 and only barely detect vertical magnetic fields and horizontal magnetic fields. For this reason, the resistance change rate of the second magnetoresistance elements 530a and 530b may not necessarily be smaller than that of the first magnetoresistance elements 520a and 520b.

The magnetic sensor 5 according to the eighth preferred embodiment of the present invention also achieves high isotropic characteristics in detecting a horizontal magnetic field and is also able to detect a weak vertical magnetic field by using magnetoresistance elements. The magnetic sensor 5 can also regulate a decrease in the output accuracy, which would be caused by a stress applied to the magnetoresistance elements from a structure disposed above the magnetoresistance elements.

Ninth Preferred Embodiment

A magnetic sensor according to a ninth preferred embodiment of the present invention will be described below with reference to the drawings. The magnetic sensor according to the ninth preferred embodiment of the present invention is different from the magnetic sensor 1c of the fourth preferred embodiment of the present invention mainly in the patterns of the first and second magnetoresistance elements. An explanation of elements configured similarly to those of the magnetic sensor 1c of the fourth preferred embodiment of the present invention will not be repeated.

Figure 31:
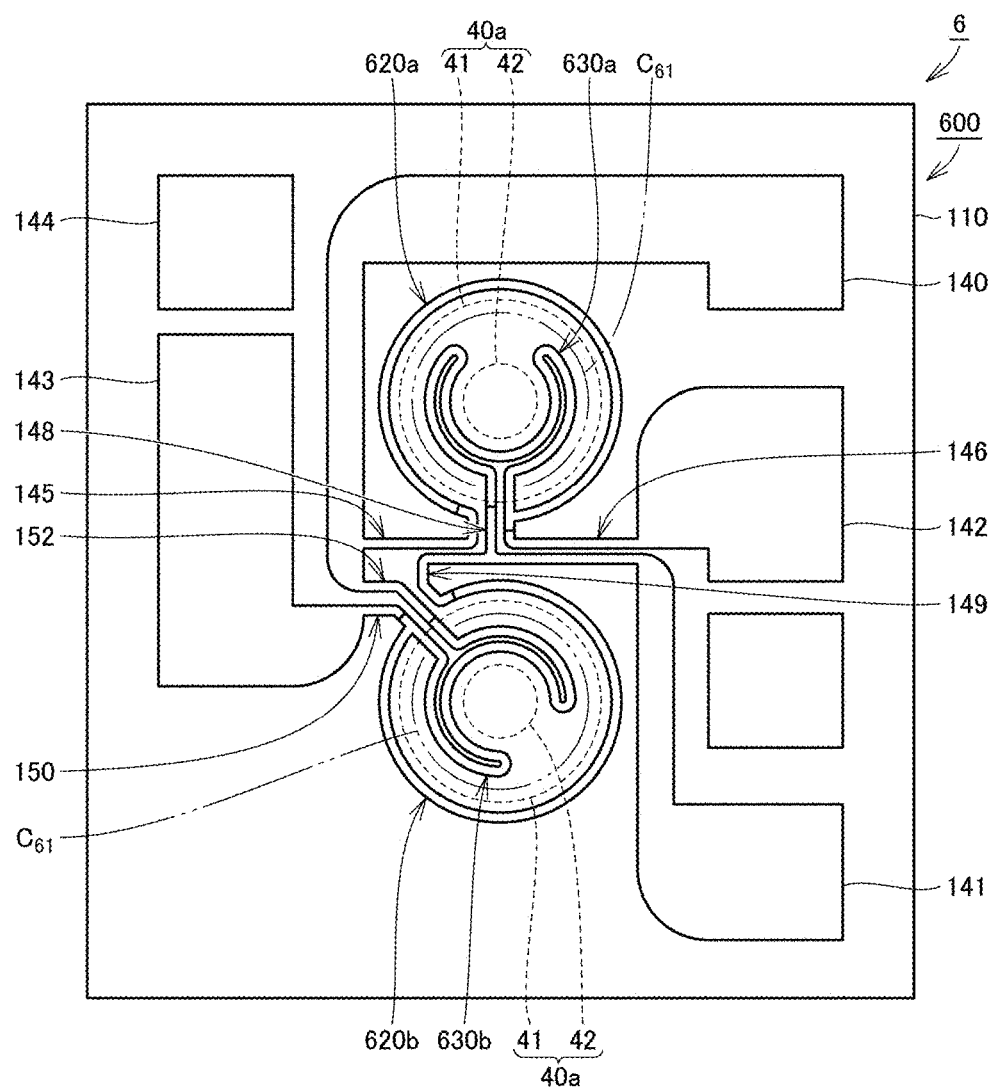
FIG. 31 is a plan view of a magnetic sensor according to a ninth preferred embodiment of the present invention.
Figure 32:
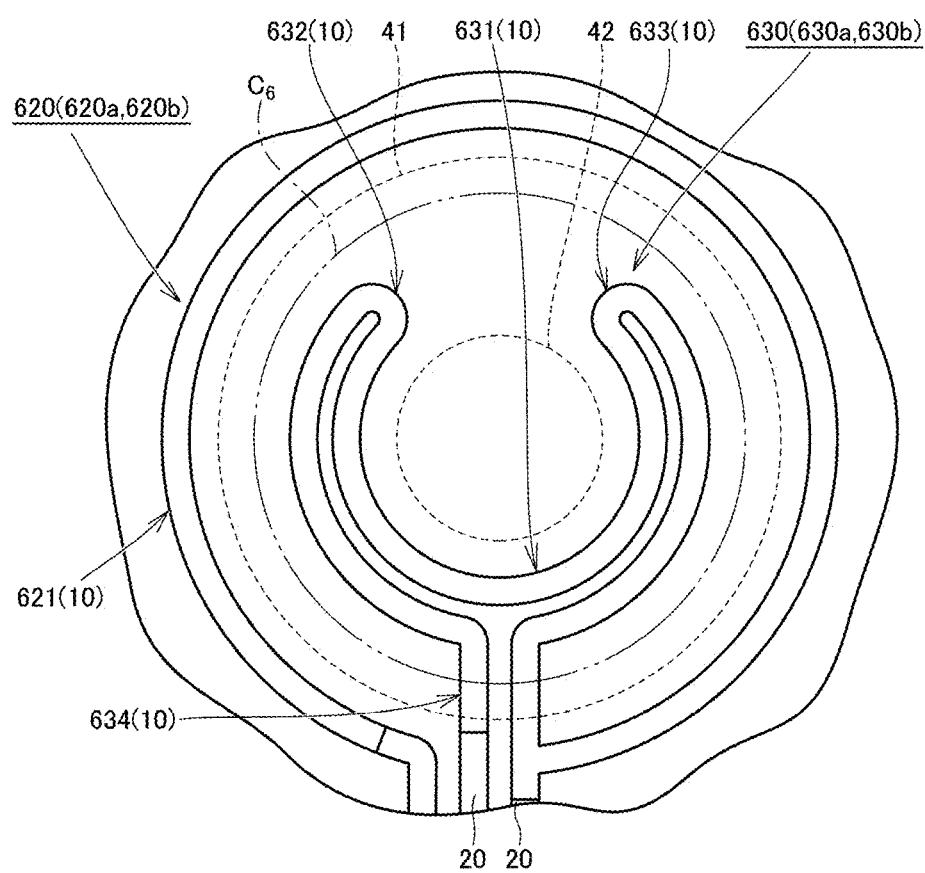
FIG. 32 is a plan view illustrating a pattern of a first magnetoresistance element and that of a second magnetoresistance element of the magnetic sensor according to the ninth preferred embodiment of the present invention.

FIG. 31 is a plan view of the magnetic sensor according to the ninth preferred embodiment of the present invention. FIG. 32 is a plan view illustrating a pattern of a first magnetoresistance element and that of a second magnetoresistance element of the magnetic sensor according to the ninth preferred embodiment of the present invention. In FIGS. 31 and 32, the inner peripheral edges and the outer peripheral edges of first magnetic members are indicated by the dotted lines.

As shown in FIG. 31, a magnetic sensor 6 according to the ninth preferred embodiment of the present invention preferably includes a circuit substrate 600 and two first magnetic members 40a above the circuit substrate 600. In the magnetic sensor 6 according to the ninth preferred embodiment of the present invention, a gap is provided between a first base section 41 of the first magnetic member 40a and the circuit substrate 600 all around the outer peripheral portion of the first magnetic member 40a.

As shown in FIGS. 31 and 32, a pattern 620 of each of first magnetoresistance elements 620a and 620b of the magnetic sensor 6 according to the ninth preferred embodiment of the present invention includes one first pattern. The first pattern is a C-shaped pattern 621 located along an imaginary C-shaped configuration $C_{61}$, which is opened at a portion where wiring 146, 148, 150, and 152 is positioned, on the circumference of an imaginary circle $C_6$, as viewed from the direction perpendicular or substantially perpendicular to the insulating layer 30. As the distance between the inner peripheral edge of each of the first magnetoresistance elements 620a and 620b and the outer peripheral edge of the first base section 41 of the first magnetic member 40a, a sufficiently large distance is provided so that the first magnetoresistance elements 620a and 620b do not overlap the first magnetic members 40a even if the positions of the first magnetic members 40a when being formed by plating are varied.

As shown in FIG. 31, the orientation of the circumferential direction of the first magnetoresistance element 620a and that of the first magnetoresistance element 620b are different from each other so that the orientations of the imaginary C-shaped configurations $C_{61}$ become different. That is, the orientation of the circumferential direction of the pattern 620 of the first magnetoresistance element 620a and that of the first magnetoresistance element 620b are different from each other so that the orientation of the C-shaped pattern 621 of the first magnetoresistance element 620a and that of the first magnetoresistance element 620b become different.

In the present preferred embodiment, the orientation of the circumferential direction of the pattern 620 of the first magnetoresistance element 620a and that of the first magnetoresistance element 620b preferably differ from each other by 135° or about 135°, for example, so that the orientation of the C-shaped pattern 621 of the first magnetoresistance element 620a and that of the first magnetoresistance element 620b become different from each other by 135° or about 135°.

As shown in FIG. 31, as viewed from the direction perpendicular or substantially perpendicular to the insulating layer 30, a second magnetoresistance element 630a is positioned at the central side of the imaginary circle $C_6$ and is surrounded by the first magnetoresistance element 620a, while a second magnetoresistance element 630b is positioned at the central side of the imaginary circle $C_6$ and is surrounded by the first magnetoresistance element 620b. That is, as viewed from the direction perpendicular or substantially perpendicular to the insulating layer 30, the second magnetoresistance element 630a is located farther inward than the inner peripheral edge of the first magnetoresistance element 620a, while the second magnetoresistance element 630b is located farther inward than the inner peripheral edge of the first magnetoresistance element 620b.

Each of the second magnetoresistance elements 630a and 630b preferably includes a pattern 630. The pattern 630 includes two arc patterns 631, which are second patterns, disposed along the circumference of the imaginary circle $C_6$ line-symmetrically to each other so as to be arranged side by side in the radial direction of the imaginary circle $C_6$. The two arc patterns 631 are connected with each other at one end by a semi-circular pattern 632 and at the other end by a semi-circular pattern 633. In the second magnetoresistance element 630a, the arc pattern 631 positioned on the outermost side from the center of the imaginary circle $C_6$ is connected to the wiring 146 and 148 by a linearly extending portion 634 preferably having a length shorter than about 10 µm, for example. In the second magnetoresistance element 630b, the arc pattern 631 positioned on the outermost side from the center of the imaginary circle $C_6$ is connected to the wiring 150 and 152 by a linearly extending portion 634 preferably having a length shorter than about 10 µm, for example.

In the second magnetoresistance element 630a and 630b, as the distance between the inner peripheral edge of the arc pattern 631 positioned closer to the center of the imaginary circle $C_6$ and the outer peripheral edge of the first narrow section 42 of the first magnetic member 40a, a sufficiently large distance is provided so that the second magnetoresistance elements 630a and 630b do not overlap the first narrow sections 42 of the first magnetic members 40a even if the positions of the first magnetic members 40a when being formed by plating are varied.

The patterns 630 of the second magnetoresistance elements 630a and 630b preferably have the same or substantially the same thickness as the patterns 620 of the first magnetoresistance elements 620a and 620b. However, the patterns 630 may be thinner than the patterns 620.

In the magnetic sensor 6 according to the present preferred embodiment, each of the second magnetoresistance elements 630a and 630b preferably includes the arc patterns 631. The arc patterns 631 are defined by arcs. The two adjacent arc patterns 631 are connected with each other by the semi-circular patterns 632 and 633. Each of the second magnetoresistance elements 630a and 630b preferably includes the linearly extending portion 634 merely having a length shorter than about 10 µm, for example. This configuration can reduce the anisotropic characteristics in detecting a magnetic field.

The orientation of the circumferential direction of the pattern 630 of the second magnetoresistance element 630a and that of the second magnetoresistance element 630b are different from each other. In the present preferred embodiment, the orientation of the circumferential direction of the pattern 630 of the second magnetoresistance element 630a and that of the second magnetoresistance element 630b are different from each other by about 135°, for example. Accordingly, the anisotropic characteristics of the magnetoresistance effect of the second magnetoresistance element 630a and that of the second magnetoresistance element 630b can be offset each other and be reduced to a smaller level.

In the magnetic sensor 6 according to the present preferred embodiment, the second magnetoresistance elements 630a and 630b are inward of the first magnetoresistance elements 620a and 620b, respectively, thereby making it possible to reduce the size of the magnetic sensor 6. Additionally, in the magnetic sensor 6, too, it is not necessary to three-dimensionally lay the wiring to connect the first magnetoresistance elements 620a and 620b and the second magnetoresistance elements 630a and 630b. Hence, the circuit substrate 600 can be manufactured with a simple manufacturing process.

As shown in FIG. 31, the first magnetic members 40a do not cover the first magnetoresistance elements 620a and 620b, but cover the second magnetoresistance elements 630a and 630b, as viewed from the direction perpendicular or substantially perpendicular to the insulating layer 30.

The magnetic sensor 6 according to the present preferred embodiment is also able to detect a vertical magnetic field and a horizontal magnetic field with high sensitivity. In the magnetic sensor 6 according to the ninth preferred embodiment of the present invention, each of the first magnetoresistance elements 620a and 620b includes the first pattern disposed along the circumference thereof, thus improving the isotropic characteristics in detecting a horizontal magnetic field.

In the present preferred embodiment, the second magnetoresistance elements 630a and 630b are magnetically shielded by the first magnetic members 40a and barely detect, or do not detect, vertical magnetic fields and horizontal magnetic fields. For this reason, the resistance change rate of the second magnetoresistance elements 630a and 630b may not necessarily be smaller than that of the first magnetoresistance elements 620a and 620b.

The magnetic sensor 6 according to the ninth preferred embodiment of the present invention also achieves high isotropic characteristics in detecting a horizontal magnetic field and is also able to detect a weak vertical magnetic field by using magnetoresistance elements. The magnetic sensor 6 can also regulate a decrease in the output accuracy, which would be caused by a stress applied to the magnetoresistance elements from a structure disposed above the magnetoresistance elements.

In the magnetic sensor 6 according to the present preferred embodiment, as the distance between the inner peripheral edge of each of the first magnetoresistance elements 620a and 620b and the outer peripheral edge of the first base section 41 of the first magnetic member 40a, a sufficiently large distance is provided so that the first magnetoresistance elements 620a and 620b do not overlap the first magnetic members 40a even if the positions of the first magnetic members 40a when being formed by plating are varied. Thus, a stress is less likely to be applied from the first magnetic members 40a to the first magnetoresistance elements 620a and 620b.

In the magnetic sensor 6 according to the present preferred embodiment, as the distance between the inner peripheral edge of the arc pattern 631 positioned closer to the center of the imaginary circle $C_6$ and the outer peripheral edge of the first narrow section 42 of the first magnetic member 40a, a sufficiently large distance is provided so that the second magnetoresistance elements 630a and 630b do not overlap the first narrow sections 42 of the first magnetic members 40a even if the positions of the first magnetic members 40a when being formed by plating are varied. Hence, a stress is less likely to be applied from the first narrow sections 42 of the first magnetic members 40a to the second magnetoresistance elements 630a and 630b.

Tenth Preferred Embodiment

A magnetic sensor according to a tenth preferred embodiment of the present invention will be described below with reference to the drawings. The magnetic sensor according to the tenth preferred embodiment of the present invention is different from the magnetic sensor 6 of the ninth preferred embodiment of the present invention mainly in the pattern of the first magnetoresistance elements and the configuration of the first magnetic members. An explanation of elements configured similarly to those of the magnetic sensor 6 of the ninth preferred embodiment of the present invention will not be repeated.

Figure 33:
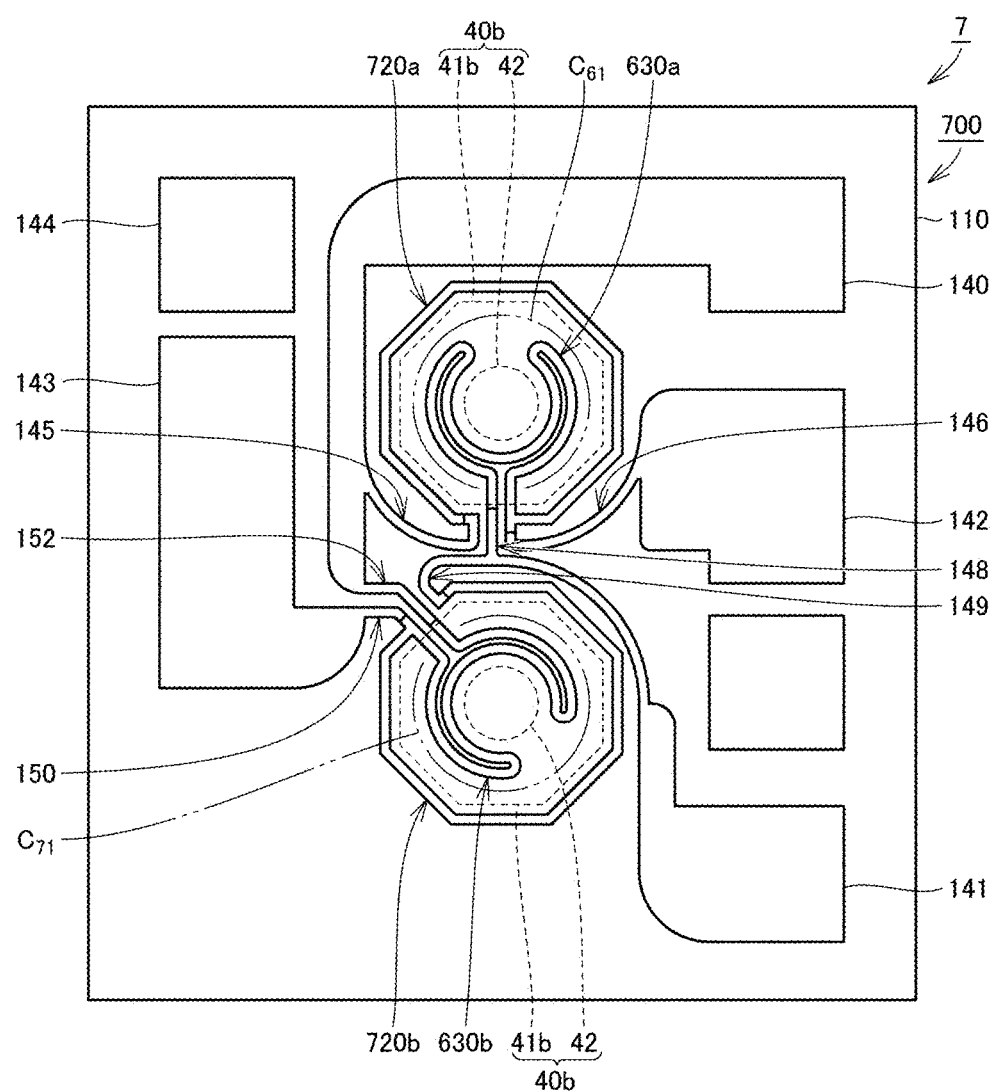
FIG. 33 is a plan view of a magnetic sensor according to a tenth preferred embodiment of the present invention.
Figure 34:
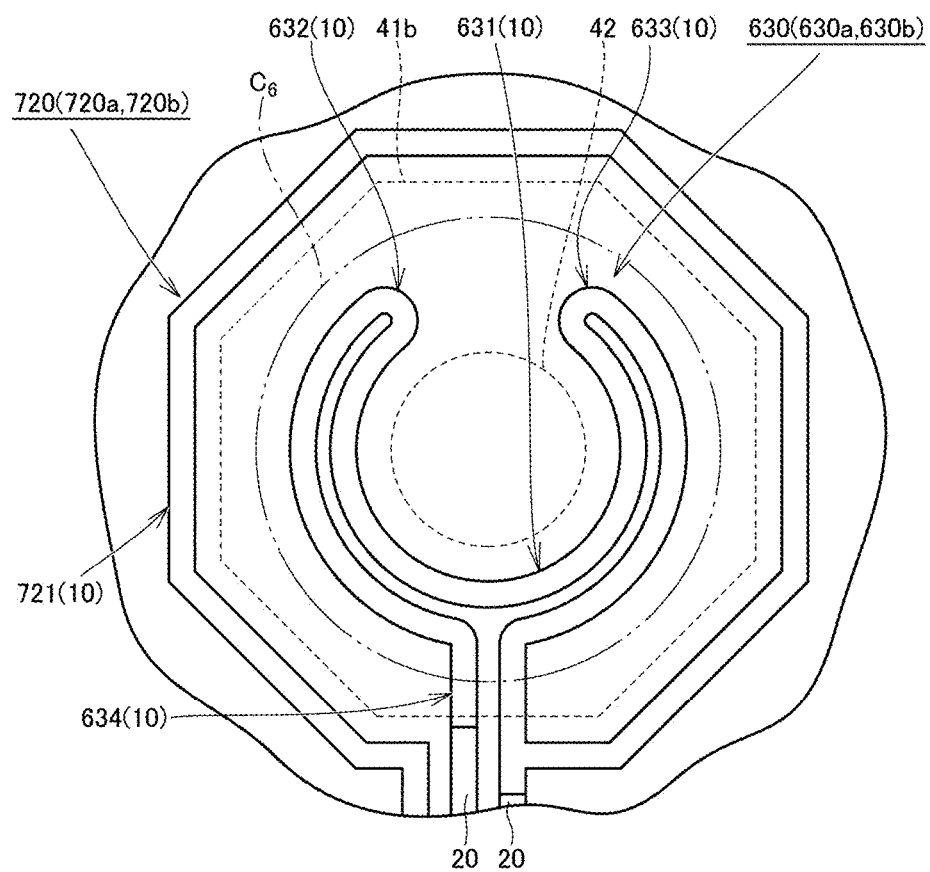
FIG. 34 is a plan view illustrating a pattern of a first magnetoresistance element and that of a second magnetoresistance element of the magnetic sensor according to the tenth preferred embodiment of the present invention.

FIG. 33 is a plan view of the magnetic sensor according to the tenth preferred embodiment of the present invention. FIG. 34 is a plan view illustrating a pattern of a first magnetoresistance element and that of a second magnetoresistance element of the magnetic sensor according to the tenth preferred embodiment of the present invention. In FIGS. 33 and 34, the inner peripheral edges and the outer peripheral edges of the first magnetic members are indicated by the dotted lines.

As shown in FIG. 33, a magnetic sensor 7 according to the tenth preferred embodiment of the present invention includes a circuit substrate 700 and two first magnetic members 40b above the circuit substrate 700. Each first magnetic member 40b includes a first base section 41b and a first narrow section 42. The area of the exterior surface of the first narrow section 42 as viewed from the direction perpendicular or substantially perpendicular to the insulating layer 30 is smaller than that of the first base section 41b. The first base section 41b as viewed from the direction perpendicular or substantially perpendicular to the insulating layer 30 preferably has an externally octagonal shape, for example. In the magnetic sensor 7 according to the tenth preferred embodiment of the present invention, a gap is defined between the first base section 41b of the first magnetic member 40b and the circuit substrate 700 all around the outer peripheral portion of the first magnetic member 40b.

As shown in FIGS. 33 and 34, a pattern 720 of each of first magnetoresistance elements 720a and 720b of the magnetic sensor 7 according to the tenth preferred embodiment of the present invention includes one first pattern. The first pattern is a C-shaped pattern 721 located along an imaginary C-shaped configuration $C_{61}$, which is opened at a portion where wiring 146, 148, 150, and 152 is positioned, on the circumference of an imaginary circle $C_6$, as viewed from the direction perpendicular or substantially perpendicular to the insulating layer 30. As the distance between the inner peripheral edge of each of the first magnetoresistance elements 720a and 720b and the outer peripheral edge of the first base section 41b of the first magnetic member 40b, a sufficiently large distance is provided so that the first magnetoresistance elements 720a and 720b do not overlap the first magnetic members 40b even if the positions of the first magnetic members 40b when being formed by plating are varied.

As shown in FIG. 33, the orientation of the circumferential direction of the first magnetoresistance element 720a and that of the first magnetoresistance element 720b are different from each other so that the orientations of the imaginary C-shaped configurations $C_{61}$ become different. That is, the orientation of the circumferential direction of the pattern 720 of the first magnetoresistance element 720a and that of the first magnetoresistance element 720b are different from each other so that the orientation of the C-shaped pattern 721 of the first magnetoresistance element 720a and that of the first magnetoresistance element 720b become different.

In the present preferred embodiment, the orientation of the circumferential direction of the pattern 720 of the first magnetoresistance element 720a and that of the first magnetoresistance element 720b preferably differ from each other by 135° to about 135°, for example, so that the orientation of the C-shaped pattern 721 of the first magnetoresistance element 720a and that of the first magnetoresistance element 720b become different from each other by 135° to about 135°.

The patterns 630 of the second magnetoresistance elements 630a and 630b preferably have the same or substantially the same thickness as the patterns 720 of the first magnetoresistance elements 720a and 720b. However, the patterns 630 may be thinner than the patterns 720.

In the magnetic sensor 7 according to the present preferred embodiment, the second magnetoresistance elements 630a and 630b are disposed inward of the first magnetoresistance elements 720a and 720b, respectively, thus making it possible to reduce the size of the magnetic sensor 7. Additionally, in the magnetic sensor 7, it is not necessary to three-dimensionally lay the wiring to connect the first magnetoresistance elements 720a and 720b and the second magnetoresistance elements 630a and 630b. Hence, the circuit substrate 700 can be manufactured with a simple manufacturing process.

As shown in FIG. 33, the first magnetic members 40b do not cover the first magnetoresistance elements 720a and 720b, but cover the second magnetoresistance elements 630a and 630b, as viewed from the direction perpendicular or substantially perpendicular to the insulating layer 30.

The magnetic sensor 7 according to the present preferred embodiment is also able to detect a vertical magnetic field and a horizontal magnetic field with high sensitivity. In the magnetic sensor 7 according to the tenth preferred embodiment of the present invention, each of the first magnetoresistance elements 720a and 720b includes the first pattern disposed along the circumference thereof, thus improving the isotropic characteristics in detecting a horizontal magnetic field.

In the present preferred embodiment, the second magnetoresistance elements 630a and 630b are magnetically shielded by the first magnetic members 40b and barely detect, or do not detect, vertical magnetic fields and horizontal magnetic fields. For this reason, the resistance change rate of the second magnetoresistance elements 630a and 630b may not necessarily be smaller than that of the first magnetoresistance elements 720a and 720b.

The magnetic sensor 7 according to the tenth preferred embodiment of the present invention also achieves high isotropic characteristics in detecting a horizontal magnetic field and is also able to detect a weak vertical magnetic field by using magnetoresistance elements. The magnetic sensor 7 can also regulate a decrease in the output accuracy, which would be caused by a stress applied to the magnetoresistance elements from a structure disposed above the magnetoresistance elements.

In the magnetic sensor 7 according to the present preferred embodiment, as the distance between the inner peripheral edge of each of the first magnetoresistance elements 720a and 720b and the outer peripheral edge of the first base section 41b of the first magnetic member 40b, a sufficiently large distance is provided so that the first magnetoresistance elements 720a and 720b do not overlap the first magnetic members 40b even if the positions of the first magnetic members 40b when being formed by plating are varied. Hence, a stress is less likely to be applied from the first magnetic members 40b to the first magnetoresistance elements 720a and 720b.

Eleventh Preferred Embodiment

A magnetic sensor according to an eleventh preferred embodiment of the present invention will be described below with reference to the drawings. The magnetic sensor according to the eleventh preferred embodiment of the present invention is different from the magnetic sensor 6 of the ninth preferred embodiment of the present invention mainly in the pattern of the second magnetoresistance elements and the configuration of the first magnetic members. An explanation of elements configured similarly to those of the magnetic sensor 6 of the ninth preferred embodiment of the present invention will not be repeated.

Figure 35:
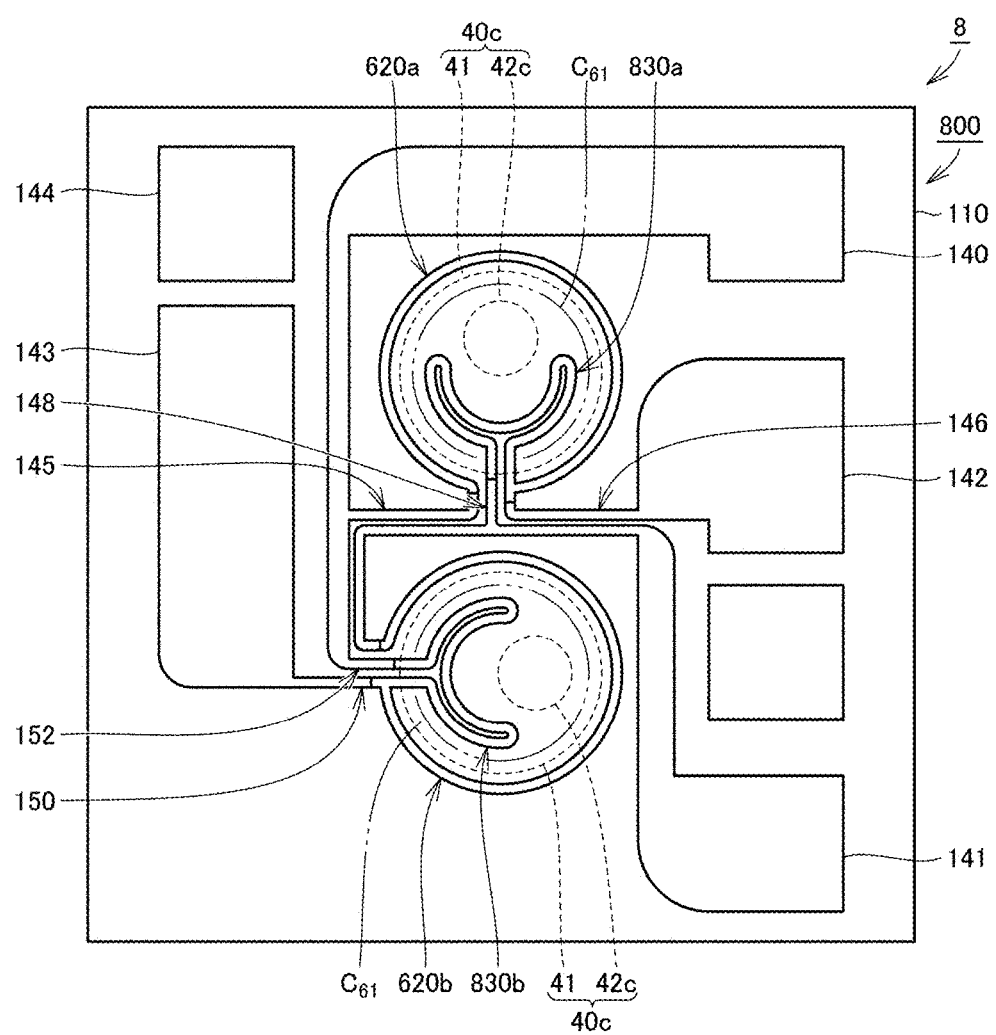
FIG. 35 is a plan view of a magnetic sensor according to an eleventh preferred embodiment of the present invention.
Figure 36:
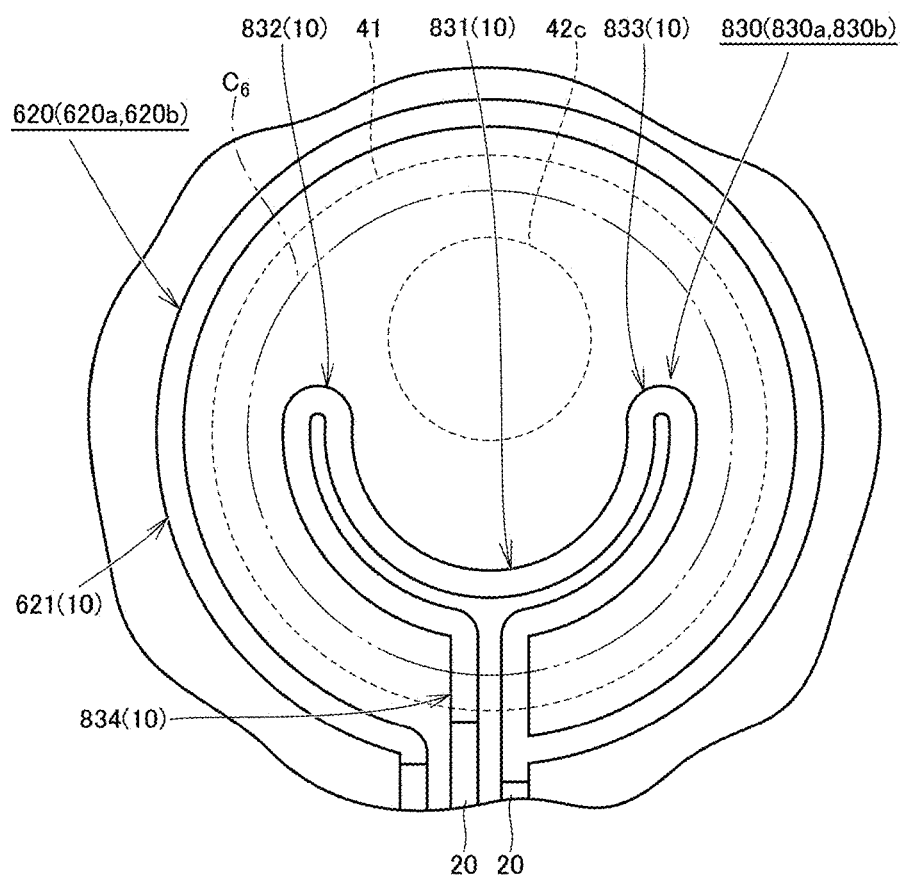
FIG. 36 is a plan view illustrating a pattern of a first magnetoresistance element and that of a second magnetoresistance element of the magnetic sensor according to the eleventh preferred embodiment of the present invention.

FIG. 35 is a plan view of the magnetic sensor according to the eleventh preferred embodiment of the present invention. FIG. 36 is a plan view illustrating a pattern of a first magnetoresistance element and that of a second magnetoresistance element of the magnetic sensor according to the eleventh preferred embodiment of the present invention. In FIGS. 35 and 36, the inner peripheral edges and the outer peripheral edges of the first magnetic members are indicated by the dotted lines.

As shown in FIG. 35, a magnetic sensor 8 according to the eleventh preferred embodiment of the present invention includes a circuit substrate 800 and two first magnetic members 40c above the circuit substrate 800. Each first magnetic member 40c includes a first base section 41 and a first narrow section 42c. The area of the exterior surface of the first narrow section 42c as viewed from the direction perpendicular or substantially perpendicular to the insulating layer 30 is smaller than that of the first base section 41. The first base section 41 and the first narrow section 42c as viewed from the direction perpendicular or substantially perpendicular to the insulating layer 30 each have an externally circular shape. The first narrow section 42c is eccentric from the first base section 41, as viewed from the direction perpendicular or substantially perpendicular to the insulating layer 30. In the magnetic sensor 8 according to the eleventh preferred embodiment of the present invention, a gap is defined between the first base section 41 of the first magnetic member 40c and the circuit substrate 800 all around the outer peripheral portion of the first magnetic member 40c.

As shown in FIG. 36, as viewed from the direction perpendicular or substantially perpendicular to the insulating layer 30, a second magnetoresistance element 830a is positioned at the central side of the imaginary circle $C_6$ and is surrounded by a first magnetoresistance element 620a, while a second magnetoresistance element 830b is positioned at the central side of the imaginary circle $C_6$ and is surrounded by a first magnetoresistance element 620b. That is, as viewed from the direction perpendicular or substantially perpendicular to the insulating layer 30, the second magnetoresistance element 830a is located farther inward than the inner peripheral edge of the first magnetoresistance element 620a, while the second magnetoresistance element 830b is located farther inward than the inner peripheral edge of the first magnetoresistance element 620b.

Each of the second magnetoresistance elements 830a and 830b includes a pattern 830. The pattern 830 includes two arc patterns 831, which are second patterns, disposed along the circumference of the imaginary circle $C_6$ line-symmetrically to each other so as to be arranged side by side in the radial direction of the imaginary circle $C_6$. The two arc patterns 831 are connected with each other at one end by a semi-circular pattern 832 and at the other end by a semi-circular pattern 833. In the second magnetoresistance element 830a, the arc pattern 831 positioned on the outermost side from the center of the imaginary circle $C_6$ is connected to the wiring 146 and 148 by a linearly extending portion 834 preferably having a length shorter than about 10 μm, for example. In the second magnetoresistance element 830b, the arc pattern 831 positioned on the outermost side from the center of the imaginary circle $C_6$ is connected to the wiring 150 and 152 by a linearly extending portion 834 preferably having a length shorter than about 10 μm, for example.

In the second magnetoresistance element 830a, as the distance between the inner peripheral edge of the arc pattern 831 positioned adjacent to the center of the imaginary circle $C_6$ and the outer peripheral edge of the first narrow section 42c of the first magnetic member 40c, a sufficiently large distance is provided so that the second magnetoresistance elements 830a and 830b do not overlap the first narrow sections 42c of the first magnetic members 40c even if the positions of the first magnetic members 40c when being formed by plating are varied.

The patterns 830 of the second magnetoresistance elements 830a and 830b preferably have the same or substantially the same thickness as the patterns 620 of the first magnetoresistance elements 620a and 620b. However, the patterns 830 may be thinner than the patterns 620.

In the magnetic sensor 8 according to the present preferred embodiment, each of the second magnetoresistance elements 830a and 830b includes the arc patterns 831. The arc patterns 831 are formed of arcs. The two adjacent arc patterns 831 are connected with each other by the semi-circular patterns 832 and 833. Each of the second magnetoresistance elements 830a and 830b includes the linearly extending portion 834 merely having a length shorter than 10 μm. This configuration can reduce the anisotropic characteristics in detecting a magnetic field.

The orientation of the circumferential direction of the pattern 830 of the second magnetoresistance element 830a and that of the second magnetoresistance element 830b are preferably different from each other. In the present preferred embodiment, the orientation of the circumferential direction of the pattern 830 of the second magnetoresistance element 830a and that of the second magnetoresistance element 830b are preferably different from each other by 135° or about 135°, for example. Accordingly, the anisotropic characteristics of the magnetoresistance effect of the second magnetoresistance element 830a and that of the second magnetoresistance element 830b can be offset each other and be reduced to a smaller level.

In the magnetic sensor 8 according to the present preferred embodiment, too, the second magnetoresistance elements 830a and 830b are disposed inward of the first magnetoresistance elements 620a and 620b, respectively, thereby making it possible to reduce the size of the magnetic sensor 8. Additionally, in the magnetic sensor 8, too, it is not necessary to three-dimensionally lay the wiring to connect the first magnetoresistance elements 620a and 620b and the second magnetoresistance elements 830a and 830b. Hence, the circuit substrate 800 can be manufactured with a simple manufacturing process.

As shown in FIG. 35, the first magnetic members 40c do not cover the first magnetoresistance elements 620a and 620b, but cover the second magnetoresistance elements 830a and 830b, as viewed from the direction perpendicular or substantially perpendicular to the insulating layer 30.

In the present preferred embodiment, the second magnetoresistance elements 830a and 830b are magnetically shielded by the first magnetic members 40c and barely detect, or do not detect, vertical magnetic fields and horizontal magnetic fields. For this reason, the resistance change rate of the second magnetoresistance elements 830a and 830b may not necessarily be smaller than that of the first magnetoresistance elements 620a and 620b.

The magnetic sensor 8 according to the eleventh preferred embodiment of the present invention also achieves high isotropic characteristics in detecting a horizontal magnetic field and is also able to detect a weak vertical magnetic field by using magnetoresistance elements. The magnetic sensor 8 can also regulate a decrease in the output accuracy, which would be caused by a stress applied to the magnetoresistance elements from a structure disposed above the magnetoresistance elements.

In the magnetic sensor 8 according to the present preferred embodiment, as the distance between the inner peripheral edge of the arc pattern 831 positioned closer to the center of the imaginary circle $C_6$ and the outer peripheral edge of the first narrow section 42c of the first magnetic member 40c, a sufficiently large distance is provided so that the second magnetoresistance elements 830a and 830b do not overlap the first narrow sections 42c of the first magnetic members 40c even if the positions of the first magnetic members 40c when being formed by plating are varied. Thus, a stress is less likely to be applied from the first narrow sections 42c of the first magnetic members 40c to the second magnetoresistance elements 830a and 830b.

In the magnetic sensor 8 according to the present preferred embodiment, the first narrow section 42c is eccentric from the first base section 41, as viewed from the direction perpendicular or substantially perpendicular to the insulating layer 30. Accordingly, as viewed from the direction perpendicular or substantially perpendicular to the insulating layer 30, the shortest distance between the center of the first narrow section 42c and the second magnetoresistance elements 830a and 830b is longer than that between the center of the first base section 41 and the second magnetoresistance elements 830a and 830b. With this configuration, the second magnetoresistance elements 830a and 830b can be disposed immediately under the vicinity of the center of the first base section 41 of the first magnetic member 40c which exhibits a high shielding effect, while a stress is even less likely to be applied from the first narrow section 42c of the first magnetic member 40c to the second magnetoresistance elements 830a and 830b.

In the above-described preferred embodiments, some of the configurations may be combined with each other within a technically possible range.

The preferred embodiments described above are provided only for the purposes of illustration, and are not intended to be exhaustive or to limit the invention to the precise forms disclosed. It is intended that the scope of the invention be defined, not by the foregoing preferred embodiments, but by the following claims. The scope of the present invention is to be accorded the broadest interpretation so as to encompass all such modifications and equivalent structures and functions.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
   a first magnetoresistance element;
   a second magnetoresistance element that is electrically connected to the first magnetoresistance element to define a bridge circuit;
   an insulating layer that covers the first magnetoresistance element and the second magnetoresistance element;
   at least a first conductor from between the first conductor and a second conductor, the first and second conductors being provided on the insulating layer, the second conductor being different from the first conductor; and
   at least a first magnetic member from between the first magnetic member and a second magnetic member, the first magnetic member being provided on the first conductor to cover the first conductor, as viewed from a direction perpendicular or substantially perpendicular to the insulating layer, the second magnetic member being provided on the second conductor to cover the second conductor, as viewed from the direction perpendicular or substantially perpendicular to the insulating layer, the second magnetic member being different from the first magnetic member; wherein
   from between an outer peripheral edge and an inner peripheral edge, the first magnetoresistance element at least includes the outer peripheral edge;
   as viewed from the direction perpendicular or substantially perpendicular to the insulating layer, the first magnetic member is provided in a region farther inward than the outer peripheral edge of the first magnetoresistance element;
   as viewed from the direction perpendicular or substantially perpendicular to the insulating layer:
     the second magnetoresistance element is provided in a region farther inward than the inner peripheral edge of the first magnetoresistance element and is covered by the first magnetic member; or
     the second magnetoresistance element is provided in a region farther outward than the outer peripheral edge of the first magnetoresistance element and is covered by the second magnetic member;
   the first conductor includes a first base section and a first narrow section, an area of an exterior surface of the first narrow section as viewed from the direction perpendicular or substantially perpendicular to the insulating layer is smaller than an area of an exterior surface of the first base section as viewed from the direction perpendicular or substantially perpendicular to the insulating layer; and
   in the first conductor, the first base section and the first narrow section are arranged side by side in the direction perpendicular or substantially perpendicular to the insulating layer.

2. The magnetic sensor according to claim 1, wherein, in the direction perpendicular or substantially perpendicular to the insulating layer, the first narrow section of the first conductor is provided at an end portion of the first conductor closer to the insulating layer.

3. The magnetic sensor according to claim 1, wherein, in the direction perpendicular or substantially perpendicular to the insulating layer, the first narrow section of the first conductor is provided at an end portion of the first conductor closer to the first magnetic member.

4. The magnetic sensor according to claim 1, wherein
   in the direction perpendicular or substantially perpendicular to the insulating layer, the first base section of the first conductor is provided at an end portion of the first conductor closer to the insulating layer and is also at an end portion of the first conductor closer to the first magnetic member; and
   in the direction perpendicular or substantially perpendicular to the insulating layer, the first narrow section of the first conductor is sandwiched between the first base sections of the first conductor.

5. The magnetic sensor according to claim 1, wherein
   the second conductor includes a second base section and a second narrow section, an area of an exterior surface of the second narrow section as viewed from the direction perpendicular or substantially perpendicular to the insulating layer being smaller than an area of an exterior surface of the second base section; and
   in the second conductor, the second base section and the second narrow section are arranged side by side in the direction perpendicular or substantially perpendicular to the insulating layer.

6. The magnetic sensor according to claim 5, wherein, in the direction perpendicular or substantially perpendicular to the insulating layer, the second narrow section of the second conductor is provided at an end portion of the second conductor closer to the insulating layer.

7. The magnetic sensor according to claim 5, wherein, in the direction perpendicular or substantially perpendicular to the insulating layer, the second narrow section of the second conductor is provided at an end portion of the second conductor closer to the second magnetic member.

8. The magnetic sensor according to claim 5, wherein
   in the direction perpendicular or substantially perpendicular to the insulating layer, the second base section of the second conductor is provided at an end portion of the second conductor closer to the insulating layer and is also provided at an end portion of the second conductor closer to the second magnetic member; and
   in the direction perpendicular or substantially perpendicular to the insulating layer, the second narrow section of the second conductor is sandwiched between the second base sections of the second conductor.

9. A magnetic sensor comprising:
   a first magnetoresistance element;
   a second magnetoresistance element that is electrically connected to the first magnetoresistance element to define a bridge circuit;
   an insulating layer that covers the first magnetoresistance element and the second magnetoresistance element; and
   at least a first magnetic member from between the first magnetic member and a second magnetic member, the first and second magnetic members being on the insulating layer, the second magnetic member being different from the first magnetic member; wherein from between an outer peripheral edge and an inner peripheral edge, the first magnetoresistance element at least includes the outer peripheral edge;

as viewed from a direction perpendicular or substantially perpendicular to the insulating layer, the first magnetic member is provided in a region farther inward than the outer peripheral edge of the first magnetoresistance element;

as viewed from the direction perpendicular or substantially perpendicular to the insulating layer:

the second magnetoresistance element is provided in a region farther inward than the inner peripheral edge of the first magnetoresistance element and is covered by the first magnetic member; or the second magnetoresistance element is provided in a region farther outward than the outer peripheral edge of the first magnetoresistance element and is covered by the second magnetic member;

the first magnetic member includes a first base section and a first narrow section, an area of an exterior surface of the first narrow section as viewed from the direction perpendicular or substantially perpendicular to the insulating layer is smaller than an area of an exterior surface of the first base section as viewed from the direction perpendicular or substantially perpendicular to the insulating layer;

in the first magnetic member, the first base section and the first narrow section are arranged side by side in the direction perpendicular or substantially perpendicular to the insulating layer; and in the direction perpendicular or substantially perpendicular to the insulating layer, the first narrow section of the first magnetic member is provided at an end portion of the first magnetic member closer to the insulating layer.

10. The magnetic sensor according to claim 9, wherein the second magnetic member includes a second base section and a second narrow section, an area of an exterior surface of the second narrow section as viewed from the direction perpendicular or substantially perpendicular to the insulating layer is smaller than an area of an exterior surface of the second base section;

in the second magnetic member, the second base section and the second narrow section are arranged side by side in the direction perpendicular or substantially perpendicular to the insulating layer; and in the direction perpendicular or substantially perpendicular to the insulating layer, the second narrow section of the second magnetic member is provided at an end portion of the second magnetic member closer to the insulating layer.

11. The magnetic sensor according to claim 1, wherein, as viewed from the direction perpendicular or substantially perpendicular to the insulating layer, at least a portion of the first magnetoresistance element is located in at least a portion of an area from a position separated inward from the outer peripheral edge of the first magnetic member by about 2 μm to a position separated outward from the outer peripheral edge of the first magnetic member by y μm indicated in an expression (I) below:

$$y=-0.0008x^2+0.2495x+6.6506 \quad (I)$$

where the thickness of the first magnetoresistance element is x μm.

12. The magnetic sensor according to claim 1, wherein, as viewed from the direction perpendicular or substantially perpendicular to the insulating layer, the first magnetic member is provided concentrically with the outer peripheral edge of the first magnetoresistance element.

13. The magnetic sensor according to claim 1, wherein
as viewed from the direction perpendicular or substantially perpendicular to the insulating layer, the second magnetoresistance element is provided in a region farther inward than the inner peripheral edge of the first magnetoresistance element and is covered by the first magnetic member; and as viewed from the direction perpendicular or substantially perpendicular to the insulating layer, the first magnetic member is provided in a region including the inner peripheral edge of the first magnetoresistance element and an area inward of the inner peripheral edge.

14. The magnetic sensor according to claim 1, wherein
as viewed from the direction perpendicular or substantially perpendicular to the insulating layer, the second magnetoresistance element is provided in a region farther inward than the inner peripheral edge of the first magnetoresistance element and is covered by the first magnetic member; and as viewed from the direction perpendicular or substantially perpendicular to the insulating layer, the first magnetic member does not cover the first magnetoresistance element, but covers the second magnetoresistance element.

15. The magnetic sensor according to claim 14, wherein, as viewed from the direction perpendicular or substantially perpendicular to the insulating layer, the second magnetoresistance element is located in an area from a center of the first magnetic member to a position separated inward from the outer peripheral edge of the first magnetic member by about 7 μm.

16. The magnetic sensor according to claim 1, wherein
as viewed from the direction perpendicular or substantially perpendicular to the insulating layer, the second magnetoresistance element is provided in a region farther outward than the outer peripheral edge of the first magnetoresistance element and is covered by the second magnetic member; and as viewed from the direction perpendicular or substantially perpendicular to the insulating layer, the first magnetic member covers only a portion of the first magnetoresistance element among the first and the second magnetoresistance elements.

17. The magnetic sensor according to claim 16, wherein, as viewed from the direction perpendicular or substantially perpendicular to the insulating layer, the second magnetic member does not cover the first magnetoresistance element, but covers the second magnetoresistance element.

18. The magnetic sensor according to claim 17, wherein, as viewed from the direction perpendicular or substantially perpendicular to the insulating layer, the second magnetoresistance element is located in an area from a center of the second magnetic member to a position separated inward from the outer peripheral edge of the second magnetic member by about 7 μm.

19. The magnetic sensor according to claim 1, wherein the first magnetoresistance element includes a plurality of first patterns that are concentrically arranged and are connected with each other, as viewed from the direction perpendicular or substantially perpendicular to the insulating layer.

20. A magnetic sensor comprising:
a magneto-sensitive element;
an insulating layer that covers the magneto-sensitive element;
a first conductor that is on the insulating layer; and
a first magnetic member that is on the first conductor and covers the first conductor, as viewed from a direction perpendicular or substantially perpendicular to the insulating layer; wherein
the first conductor includes a first base section and a first narrow section, an area of an exterior surface of the first narrow section as viewed from the direction perpendicular or substantially perpendicular to the insulating layer is smaller than an area of an exterior surface of the first base section as viewed from the direction perpendicular or substantially perpendicular to the insulating layer; and
the first base section and the first narrow section are arranged side by side in the direction perpendicular or substantially perpendicular to the insulating layer.

21. The magnetic sensor according to claim 20, wherein, in the direction perpendicular or substantially perpendicular to the insulating layer, the first narrow section of the first conductor is provided at an end portion of the first conductor closer to the insulating layer.

22. The magnetic sensor according to claim 20, wherein, in the direction perpendicular or substantially perpendicular to the insulating layer, the first narrow section of the first conductor is provided at an end portion of the first conductor closer to the first magnetic member.

23. The magnetic sensor according to claim 20, wherein:
in the direction perpendicular or substantially perpendicular to the insulating layer, the first base section of the first conductor is provided at an end portion of the first conductor closer to the insulating layer and is also provided at an end portion of the first conductor closer to the first magnetic member; and
in the direction perpendicular or substantially perpendicular to the insulating layer, the first narrow section of the first conductor is sandwiched between the first base sections of the first conductor.

24. The magnetic sensor according to claim 20, wherein the magneto-sensitive element includes an outer peripheral edge; and
as viewed from the direction perpendicular or substantially perpendicular to the insulating layer, the first magnetic member is provided in a region farther inward than the outer peripheral edge of the magneto-sensitive element.

* * * * *